US012757358B1

(12) United States Patent
Shahi et al.

(10) Patent No.: US 12,757,358 B1
(45) Date of Patent: Oct. 6, 2026

(54) DATA CENTER COOLING SYSTEM USING ONE OR MORE COOLING LOOPS

(71) Applicant: NVIDIA Corporation, Santa Clara, CA (US)

(72) Inventors: Pardeep Shahi, Arlington, TX (US); Ali Heydari, Napa, CA (US); Bahareh Eslami, Santa Clara, CA (US); Vahideh Radmard, Johnson City, NY (US)

(73) Assignee: NVIDIA Corporation, Santa Clara, CA (US)

( * ) Notice: Subject to any disclaimer, the term of this patent is extended or adjusted under 35 U.S.C. 154(b) by 447 days.

(21) Appl. No.: 18/085,918

(22) Filed: Dec. 21, 2022

(51) Int. Cl.
*H05K 7/20* (2006.01)

(52) U.S. Cl.
CPC ..... *H05K 7/20772* (2013.01); *H05K 7/20236* (2013.01); *H05K 7/20254* (2013.01); *H05K 7/20263* (2013.01); *H05K 7/20272* (2013.01)

(58) Field of Classification Search
CPC ........... H05K 7/20772; H05K 7/20236; H05K 7/20254; H05K 7/20781; H05K 7/20272; H05K 7/20263
See application file for complete search history.

(56) References Cited

U.S. PATENT DOCUMENTS

| | | | | |
|---|---|---|---|---|
| 9,717,166 | B2 * | 7/2017 | Eriksen | H05K 7/20272 |
| 2013/0128460 | A1 * | 5/2013 | Rossi | H05K 7/20772 361/699 |
| 2019/0364699 | A1 * | 11/2019 | Gao | H05K 7/20254 |
| 2020/0113083 | A1 | 4/2020 | Schon et al. | |
| 2021/0195804 | A1 * | 6/2021 | Gao | H05K 7/20272 |
| 2022/0338384 | A1 * | 10/2022 | Hogan | H05K 7/20781 |
| 2023/0156959 | A1 * | 5/2023 | Malouin | H05K 7/20781 361/699 |
| 2023/0217625 | A1 * | 7/2023 | Gao | H05K 7/20236 |
| 2024/0196563 | A1 * | 6/2024 | Jia | H05K 7/20263 |
| 2024/0260228 | A1 * | 8/2024 | Chuang | H05K 7/20818 |

* cited by examiner

*Primary Examiner* — Jayprakash N Gandhi
*Assistant Examiner* — Matthew Sinclair Muir
(74) *Attorney, Agent, or Firm* — Lowenstein Sandler LLP

(57) ABSTRACT

A system includes a first cooling loop to cool one or more first components of a server and exchange first heat with an ambient environment via a first heat exchanger. The first cooling loop can exchange heat directly with the ambient environment without a cooling distribution unit.

20 Claims, 30 Drawing Sheets

DATA CENTER COOLING SYSTEM USING ONE OR MORE COOLING LOOPS

FIELD

At least one embodiment pertains to cooling systems for a datacenter. In at least one embodiment, a single loop cooling system cools servers of a datacenter and exchanges heat with an ambient environment via a heat exchanger.

BACKGROUND

Datacenter cooling systems may use two cooling loops in series to cool datacenter servers. A first cooling loop may flow coolant to cool the server components. Heat may be exchanged between a first cooling loop and a second cooling loop in a heat exchanger of a cooling distribution unit (CDU). A second cooling loop flows liquid coolant such as water to a chiller, a dry cooler, a cooling tower, or a similar structure, to cool liquid coolant.

DETAILED DESCRIPTION

Figure 1:
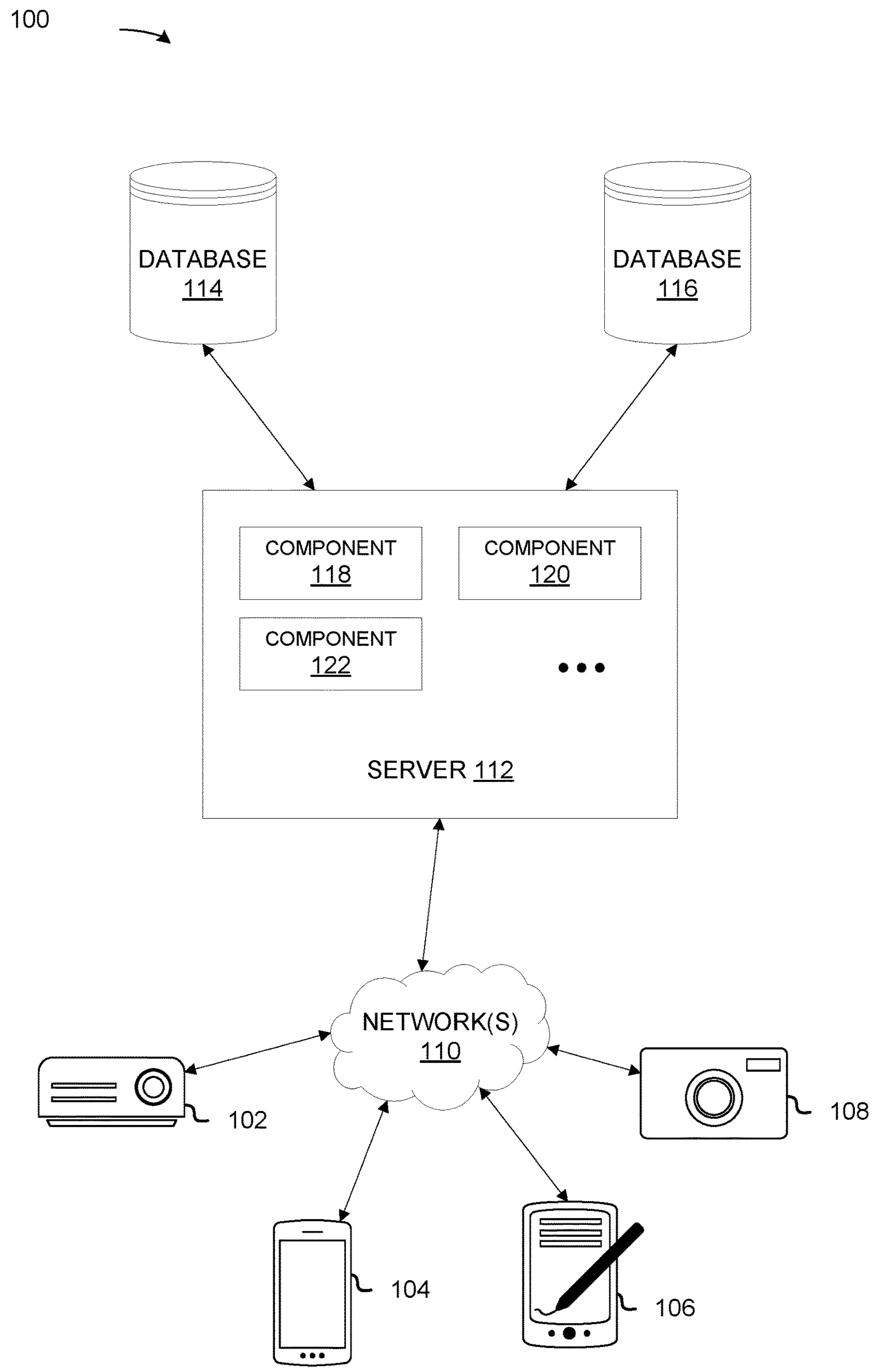
FIG. 1 illustrates an example datacenter having a single loop cooling system, according to at least one embodiment.

In the following description, numerous specific details are set forth to provide a more thorough understanding of at least one embodiment. However, it will be apparent to one skilled in the art that the inventive concepts may be practiced without one or more of these specific details.

Datacenters using liquid cooling to cool servers may use two cooling loops in series. In some datacenters, a first cooling loop flows first coolant to cool server components. In some datacenters, a second cooling loop flows a second liquid coolant such as water to cool first coolant of a first cooling loop. In some datacenters, a second cooling loop flows second liquid coolant to a cooling tower, a chiller, a cooler (e.g., a free cooler or a dry cooler), or a similar structure, to exchange heat with an ambient environment. In some datacenters, cooled second liquid coolant is flowed to a cooling distribution unit (CDU) where heat is exchanged between first and second cooling loops. In some datacenters, cooled first coolant is flowed along one or more first cooling loop flow paths to cool server components. Some datacenter cooling systems having two cooling loops in series, which takes up a large amount of space and imposes a significant expense. Specifically, a CDU included in some datacenter cooling systems takes up space in a datacenter that could be used for more servers or other datacenter components. Additionally, exchanging heat twice (once from first coolant to second coolant, and again from second coolant to an ambient environment) introduces inefficiencies in heat transfer. Energy is also expended to circulate coolant of each cooling loop.

In at least one embodiment, a cooling system for a datacenter includes a single cooling loop to cool servers and exchange heat with an ambient environment. In at least one embodiment, a datacenter cooling system includes a first cooling loop to cool one or more first components of a server. In at least one embodiment, a first cooling loop may additionally exchange first heat with an ambient environment via a first heat exchanger. In at least one embodiment, one or more first server components may include processing units such as a central processing unit (CPU) or a graphics processing unit (GPU) or a similar component having greater than a threshold power density. In at least one embodiment, one or more first server components may be cooled by cold plates coupled to each component. In at least one embodiment, an ambient environment includes an air environment such as outside air or a liquid environment such as a water reservoir or flowing water. In at least one embodiment, a first heat exchanger includes a cooler such as a free cooler or a dry cooler to exchange first heat from a first cooling loop to an ambient environment. In at least one embodiment, first coolant is pumped along one or more first cooling loop flow paths by a pump. In at least one embodiment, a pump may create a pressure differential in a first cooling loop to flow first coolant from one or more servers to a first heat exchanger along one or more first flow paths.

In at least one embodiment, one or more servers cooled by a datacenter cooling system described herein are supported by one or more datacenter racks. In at least one embodiment, racks are disposed in rows. In at least one embodiment, first coolant is distributed to one or more servers by one or more manifolds. In at least one embodiment, one or more first manifolds may be associated with a first row of datacenter racks and one or more second manifolds may be associated with each datacenter rack. In at least one embodiment, one or more servers in a rack receive first coolant from a rack manifold and a rack manifold receives first coolant from a row manifold.

In at least one embodiment, a datacenter cooling system includes a second cooling loop in parallel with a first cooling loop to cool one or more second components of a server and exchange second heat with an ambient environment via a second heat exchanger. In at least one embodiment, each of a first cooling loop and a second cooling loop are cooling loops of a single state cooling system in which a coolant that cools one or more server components exchanges heat directly with an ambient environment via a heat exchanger rather than exchanging heat with one or more other coolants via a CDU. In at least one embodiment, one or more second server components are cooled by liquid cooling. In at least one embodiment, one or more second server components may include components having less than a threshold power density. In at least one embodiment, one or more second server components may include processing units other than one or more first server components described above. In at least one embodiment, one or more second server components may be cooled by immersion cooling. In at least one embodiment, a first cooling loop and a second cooling loop are arranged in parallel to cool server components. In at least one embodiment, a datacenter cooling system described herein lacks a CDU. In at least one embodiment, a coolant that cools one or more server components is routed directly to a heat exchanger to exchange heat with an ambient environment. In at least one embodiment, heat is not exchanged between a first cooling loop and a second cooling loop.

In at least one embodiment, by flowing coolant along a flow path of a single cooling loop to cool server components and exchange heat with an ambient environment, a datacenter cooling system as described herein may have a reduced size when compared to some datacenter cooling systems that exchange heat between cooling loops arranged in series to cool servers. In at least one embodiment, by eliminating a CDU, a cooling system may occupy less space. In at least one embodiment, space normally used for a CDU can instead by used for other datacenter components such as additional servers, or otherwise a size of a datacenter can be reduced. In at least one embodiment, heat transfer efficiency can be increased by including a single cooling loop to cool servers and exchange server heat with an ambient environment. In at least one embodiment, because heat is exchanged directly with an ambient environment from a single cooling loop instead of exchanging heat from a first cooling loop to a second cooling loop then to an ambient environment (e.g., in a multi-stage cooling system), efficiency of heat transfer can be improved when compared to datacenter cooling systems that employ multi-stage cooling. In at least one embodiment, infrastructure needs are also reduced. In at least one embodiment, energy consumption can be reduced when only a single cooling loop stage is used to cool servers, rather than two cooling loops arranged in series. In at least one embodiment, a datacenter cooling system eliminates water usage by only including a single cooling loop stage to both cool server components and exchange heat with an ambient environment, unlike some cooling systems that often include a water cooling loop to exchange heat with an environment. In at least one embodiment, a datacenter only flows coolant other than water.

Servers and Data Centers

The following figures set forth, without limitation, exemplary network server and data center based systems that can be used to implement at least one embodiment.

FIG. 1 illustrates a distributed system 100, in accordance with at least one embodiment. In at least one embodiment, distributed system 100 includes one or more client computing devices 102, 104, 106, and 108, which are configured to execute and operate a client application such as a web browser, proprietary client, and/or variations thereof over one or more network(s) 110. In at least one embodiment, server 112 may be communicatively coupled with remote client computing devices 102, 104, 106, and 108 via network 110.

In at least one embodiment, server 112 may be adapted to run one or more services or software applications such as services and applications that may manage session activity of single sign-on (SSO) access across multiple data centers. In at least one embodiment, server 112 may also provide other services or software applications can include non-virtual and virtual environments. In at least one embodiment, these services may be offered as web-based or cloud services or under a Software as a Service (SaaS) model to users of client computing devices 102, 104, 106, and/or 108. In at least one embodiment, users operating client computing devices 102, 104, 106, and/or 108 may in turn utilize one or more client applications to interact with server 112 to utilize services provided by these components.

In at least one embodiment, software components 118, 120 and 122 of system 100 are implemented on server 112. In at least one embodiment, one or more components of system 100 and/or services provided by these components may also be implemented by one or more of client computing devices 102, 104, 106, and/or 108. In at least one embodiment, users operating client computing devices may then utilize one or more client applications to use services provided by these components. In at least one embodiment, these components may be implemented in hardware, firmware, software, or combinations thereof. It should be appreciated that various different system configurations are possible, which may be different from distributed system 100. The embodiment shown in FIG. 1 is thus one example of a distributed system for implementing an embodiment system and is not intended to be limiting.

In at least one embodiment, client computing devices 102, 104, 106, and/or 108 may include various types of computing systems. In at least one embodiment, a client computing device may include portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and/or variations thereof. In at least one embodiment, devices may support various applications such as various Internet-related apps, e-mail, short message service (SMS) applications, and may use various other communication protocols. In at least one embodiment, client computing devices may also include general purpose personal computers including, by way of example, personal computers and/or laptop computers running various versions of Microsoft Windows®, Apple Macintosh®, and/or Linux operating systems. In at least one embodiment, client computing devices can be workstation computers running any of a variety of commercially-available UNIX® or UNIX-like operating systems, including without limitation a variety of GNU/Linux operating systems, such as Google Chrome OS. In at least one embodiment, client computing devices may also include electronic devices such as a thin-client computer, an Internet-enabled gaming system (e.g., a Microsoft Xbox gaming console with or without a Kinect® gesture input device), and/or a personal messaging device, capable of communicating over network(s) 110. Although distributed system 100 in FIG. 1 is shown with four client computing devices, any number of client computing devices may be supported. Other devices, such as devices with sensors, etc., may interact with server 112.

In at least one embodiment, network(s) 110 in distributed system 100 may be any type of network that can support data communications using any of a variety of available protocols, including without limitation TCP/IP (transmission control protocol/Internet protocol), SNA (systems network architecture), IPX (Internet packet exchange), AppleTalk, and/or variations thereof. In at least one embodiment, network(s) 110 can be a local area network (LAN), networks based on Ethernet, Token-Ring, a wide-area network, Internet, a virtual network, a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol), and/or any combination of these and/or other networks.

In at least one embodiment, server 112 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. In at least one embodiment, server 112 can include one or more virtual machines running virtual operating systems, or other computing architectures involving virtualization. In at least one embodiment, one or more flexible pools of logical storage devices can be virtualized to maintain virtual storage devices for a server. In at least one embodiment, virtual networks can be controlled by server 112 using software defined networking. In at least one embodiment, server 112 may be adapted to run one or more services or software applications.

In at least one embodiment, server 112 may run any operating system, as well as any commercially available server operating system. In at least one embodiment, server 112 may also run any of a variety of additional server applications and/or mid-tier applications, including HTTP (hypertext transport protocol) servers, FTP (file transfer protocol) servers, CGI (common gateway interface) servers, JAVA® servers, database servers, and/or variations thereof. In at least one embodiment, exemplary database servers include without limitation those commercially available from Oracle, Microsoft, Sybase, IBM (International Business Machines), and/or variations thereof.

In at least one embodiment, server 112 may include one or more applications to analyze and consolidate data feeds and/or event updates received from users of client computing devices 102, 104, 106, and 108. In at least one embodiment, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and/or variations thereof. In at least one embodiment, server 112 may also include one or more applications to display data feeds and/or real-time events via one or more display devices of client computing devices 102, 104, 106, and 108.

In at least one embodiment, distributed system 100 may also include one or more databases 114 and 116. In at least one embodiment, databases may provide a mechanism for storing information such as user interactions information, usage patterns information, adaptation rules information, and other information. In at least one embodiment, databases 114 and 116 may reside in a variety of locations. In at least one embodiment, one or more of databases 114 and 116 may reside on a non-transitory storage medium local to (and/or resident in) server 112. In at least one embodiment, databases 114 and 116 may be remote from server 112 and in communication with server 112 via a network-based or dedicated connection. In at least one embodiment, databases 114 and 116 may reside in a storage-area network (SAN). In at least one embodiment, any necessary files for performing functions attributed to server 112 may be stored locally on server 112 and/or remotely, as appropriate. In at least one embodiment, databases 114 and 116 may include relational databases, such as databases that are adapted to store, update, and retrieve data in response to SQL-formatted commands.

Figure 2:
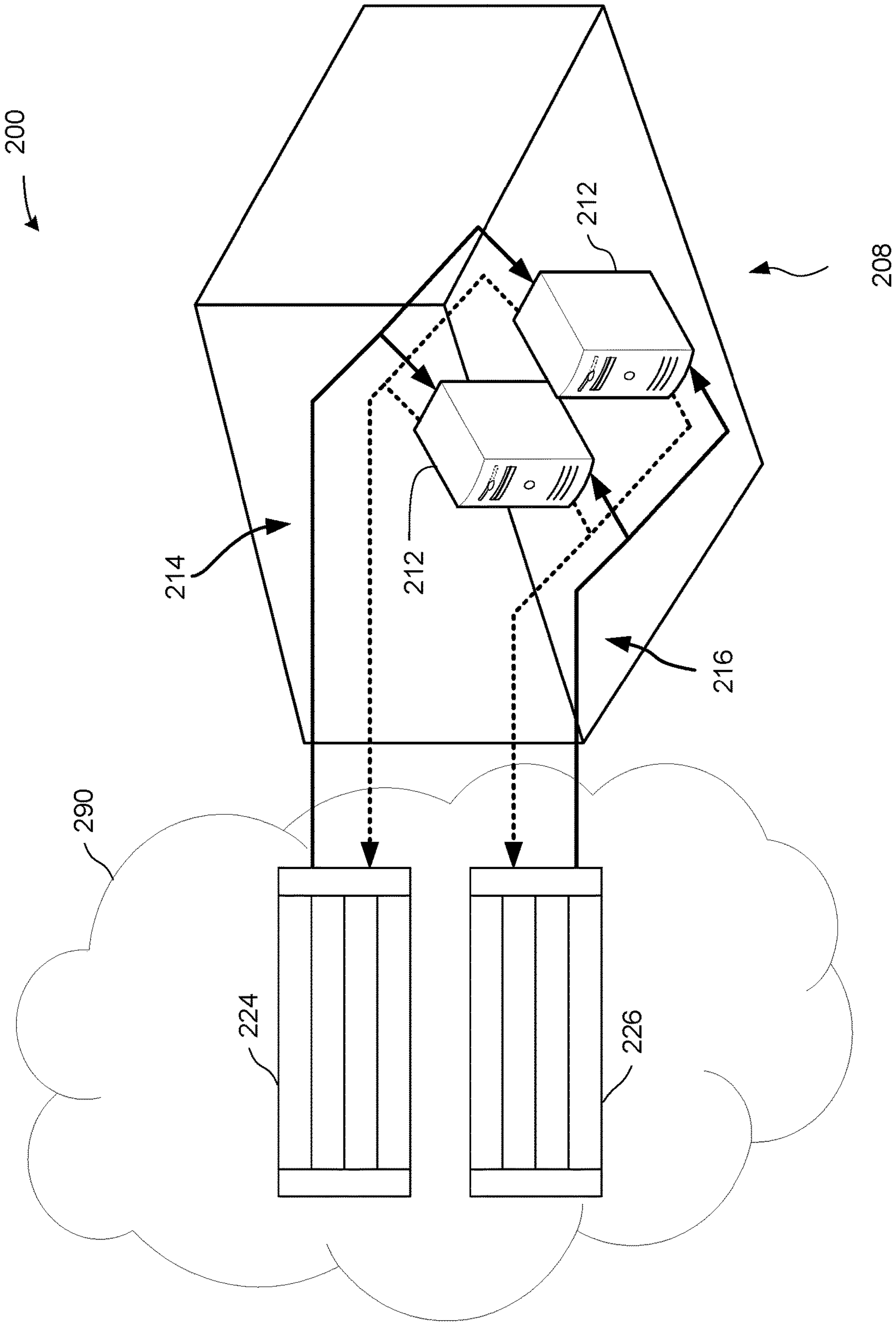
FIG. 2 illustrates an example single loop datacenter cooling system, according to at least one embodiment.

FIG. 2 illustrates an example single loop datacenter cooling system 200, according to at least one embodiment. In at least one embodiment, system 200 includes a datacenter 208 having one or more servers 212. In at least one embodiment, servers 212 are rack-based servers. In at least one embodiment, servers 212 are disposed in one or more racks of datacenter 208. In at least one embodiment, as discussed above with reference to FIG. 1, each server 212 includes multiple components such as component 118, component 120, component 122, and so on. In at least one embodiment, a server 212 includes one or more components having greater than a threshold power density. Power density may be used to describe component power relative to component size. Components having greater than a threshold power density may be referred to as high-power components. In at least one embodiment, a high-power component may be a processing unit such as a central processing unit (CPU) or a graphical processing unit (GPU). In at least one embodiment, a high-power component may include a specialized or general processing device, such as aforementioned GPU and CPU, a field programmable gate array (FPGA), a data processing unit (DPU), and so on. In at least one embodiment, a high-power component of a server 212 may output more than a threshold amount of heat. In at least one embodiment, a server 212 includes one or more components having less than a threshold power density. Components having less than a threshold power density may be referred to as low-power components. In at least one embodiment, a low-power component of a server 212 may output less than a threshold amount of heat. In at least one embodiment, low-power components of a server may include a power supply, a motherboard, memory, a network interface card (NIC), a solid state drive or hard drive, an audio card, and so on.

In at least one embodiment, components of servers 212 are cooled by a first cooling loop 214 and/or a second cooling loop 216. Each of cooling loops 214 and 216 may referred to as a "single cooling loop" or a "single cooling loop stage". In at least one embodiment, first cooling loop 214 and/or second cooling loop 216 carry secondary coolant. In at least one embodiment, cooling loops 214 and 216 are arranged in parallel and lack a CDU to exchange heat. In at least one embodiment, each of cooling loops 214 and 216 flow coolant to cool server components. In at least one embodiment, each of cooling loops 214 and 216 include conduits such as piping and/or tubing to flow coolant between a first heat exchanger 224 and servers 212 or between a second heat exchanger 226 and servers 212. In at least one embodiment, first cooling loop 214 may flow coolant along pipes, tubing, and/or one or more manifolds (described below with reference to FIG. 4) from first heat exchanger 224 to servers 212 and back to first heat exchanger 224. In at least one embodiment, second cooling loop 216 may flow coolant from second heat exchanger 226 to servers 212 and back to second heat exchanger 226. In at least one embodiment, coolant may carry heat from servers 212 to heat exchangers 224 and 226. In at least one embodiment, although both first cooling loop 214 and second cooling loop 216 are shown in FIG. 2, system 200 includes a single one of first cooling loop 214 or second cooling loop 216. In at least one embodiment, first heat exchanger 224 and second heat exchanger 226 are outside of a datacenter (e.g., exposed to air or water outside of the datacenter). In at least one embodiment, no CDU or heat exchanger is disposed inside of the datacenter room, reducing an amount of space in the datacenter that is occupied by the cooling system.

In at least one embodiment, first cooling loop 214 flows a first coolant to cool high-power components of servers 212. In at least one embodiment, cold plates associated with first cooling loop 214 for receiving first coolant are attached to high-power server components. In at least one embodiment, a cold plate is a metal plate that can be attached to an electronic device such as a CPU or a GPU. In at least one embodiment, a cold plate is attached to an electronic device by an adhesive such as a thermal epoxy. In at least one embodiment, a cold plate is attached to an electronic device by one or more mechanical fasteners. In at least one embodiment, a cold plate can implement localized cooling of powered electronics by transferring heat from an electronic device to a liquid coolant that flows to a remote heat exchanger. In at least one embodiment, a cold plate includes a thick metal plate having one or more internal passages through which liquid coolant can flow. In at least one embodiment, a cold plate can be made of a material such as aluminum, steel, stainless steel, or copper. In at least one embodiment, an electronic device in contact with a cold plate is cooled by conduction. Heat from an electronic device may conduct from a device to an attached cold plate. Heat may be carried away by liquid coolant flowing through a cold plate.

In at least one embodiment, first coolant is flowed along a flow path of first cooling loop 214 through one or more cold plates to remove heat from high-power components of servers 212. In at least one embodiment, first coolant is an electrically conductive coolant. In at least one embodiment, first coolant can include water, deionized water, or a refrigerant such as R-134a. In at least one embodiment, first coolant includes a mixture of water and additives such as a water and ethylene glycol mixture or a water and propylene glycol mixture. In at least one embodiment, first coolant includes a 25% concentration of propylene glycol in deionized water. Heat from high-power server components is carried by first coolant to first heat exchanger 224. In at least one embodiment, first cooling loop 214 includes one or more supply conduits (represented by solid lines) and one or more return conduits (represented by dashed lines). In at least one embodiment, first cooling loop 214 includes a pump to create a pressure differential that causes first coolant to flow. In at least one embodiment, first coolant is a single-phase coolant. In at least one embodiment, first coolant is a dual-phase coolant. In at least one embodiment, first coolant may not vaporize when heated by first server components.

In at least one embodiment, second cooling loop 216 flows a second coolant to cool low-power components of servers 212. In at least one embodiment, second coolant is different from first coolant and is kept separate from first coolant so that first coolant and second coolant do not mix. In at least one embodiment, second coolant is a dielectric coolant. Accordingly, second coolant may contact electrical contacts without causing shorts between electrical contacts. In at least one embodiment, second coolant can include fluorochemicals, fluorocarbons, and/or hydrocarbons. In at least one embodiment, second coolant includes oil such a mineral oil, synthetic oil, and/or natural oil. In at least one embodiment, second coolant includes an engineered fluid such as BitCool® BC-888 dielectric coolant or ElectroCool® EC-100 dielectric coolant marketed by Engineered Fluids, Inc. of Saint Petersburg, Florida. In at least one embodiment, second coolant is flowed into a server chassis to cool one or more low-power server components by immersion cooling. In at least one embodiment, second coolant may additionally absorb and carry some heat from first coolant. In at least one embodiment, server chassis are hermetically sealed to contain second coolant within server chassis and/or to limit contamination of second coolant by outside particles. In at least one embodiment, because second coolant is to flow over and come in contact with server components, second coolant is a dielectric coolant. In at least one embodiment, second coolant is electrically non-conductive. In at least one embodiment, as second coolant is flowed through server chassis, second coolant carries heat from at least low-power components away from servers 212. In at least one embodiment, heat from low-power server components is carried by second coolant to second heat exchanger 226. In at least one embodiment, second cooling loop 216 includes one or more supply conduits (represented by solid lines) and one or more return conduits (represented by dashed lines). In at least one embodiment, second cooling loop 216 includes a pump to create a pressure differential that causes second coolant to flow. In at least one embodiment, second coolant is a single-phase coolant. Second coolant may not vaporize when heated by second server components. In at least one embodiment, second coolant is a dual-phase coolant.

In at least one embodiment, first heat exchanger 224 exchanges heat between first cooling loop 214 and an ambient environment 290. In at least one embodiment, ambient environment 290 is an air environment such as ambient air outside a datacenter facility. In at least one embodiment, first heat exchanger 224 is to exchange heat between first liquid coolant of first cooling loop 214 and a gas medium of ambient environment 290. In at least one embodiment, first heat exchanger 224 may be a tube and plate heat exchanger. In at least one embodiment, first heat exchanger 224 is a cooler such as a dry cooler or an evaporative cooler. In at least one embodiment, a dry cooler may be a heat exchanger that uses air to cool a fluid. In at least one embodiment, first heat exchanger 224 includes a chiller unit. In at least one embodiment, first heat exchanger 224 includes one or more fans to move air through multiple plates or fins of first heat exchanger 224 to cool first coolant. In at least one embodiment, air of ambient environment 290 may cool first coolant of first cooling loop 214 in heat exchanger 224. In at least one embodiment, ambient environment 290 is a liquid environment such as a water reservoir. In at least one embodiment, first heat exchanger 224 is to exchange heat between liquid coolant of first cooling loop 214 and a liquid medium of ambient environment 290.

In at least one embodiment, second heat exchanger 226 exchanges heat between second cooling loop 216 and ambient environment 290. In at least one embodiment, second heat exchanger 226 is to exchange heat between second liquid coolant of second cooling loop 216 and a gas medium or a liquid medium of ambient environment 290. In at least one embodiment, second heat exchanger 224 may be a tube and plate heat exchanger. In at least one embodiment, second heat exchanger 226 is a cooler such as a dry cooler or an evaporative cooler. In at least one embodiment, second heat exchanger 226 includes a chiller unit. In at least one embodiment, second heat exchanger 226 includes one or more fans to move air through multiple plates or fins of second heat exchanger 226 to cool second coolant.

Figure 3:
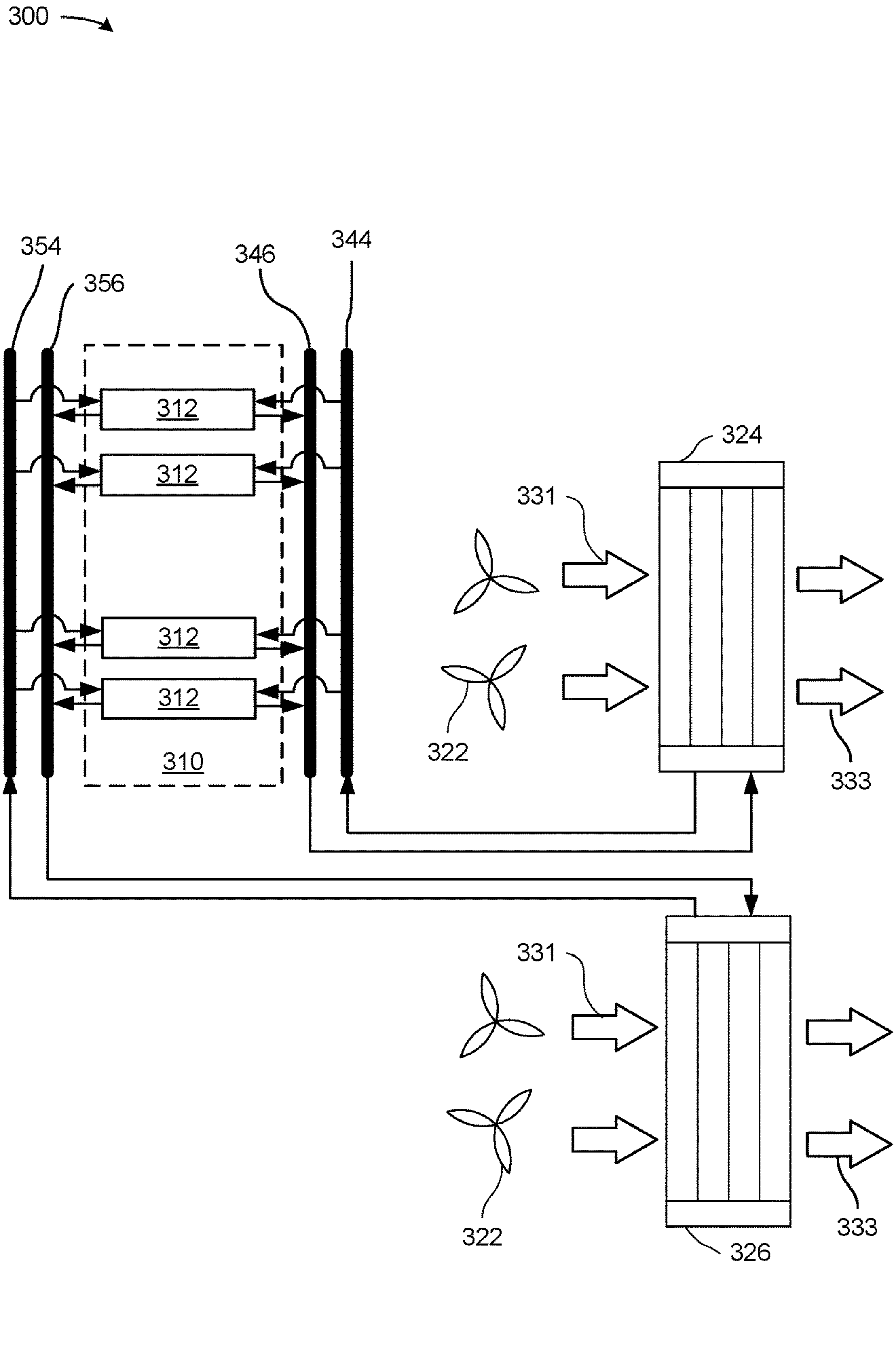
FIG. 3 illustrates a schematic diagram of a single loop datacenter cooling system, according to at least one embodiment.

FIG. 3 illustrates a schematic diagram of a single loop datacenter cooling system 300, according to at least one embodiment. Features illustrated in FIG. 3 having similar numbering to features shown in other figures may have similar functions. In at least one embodiment, system 300 includes multiple servers 312 disposed in a datacenter rack 310. In at least one embodiment, servers 312 are a part of a datacenter having multiple racks 310, each rack supporting one or more servers 312. In at least one embodiment, although only one rack 310 is shown in FIG. 3, system 300 can provide cooling for servers 312 in multiple racks 310.

In at least one embodiment, first coolant is flowed along one or more flow paths of one or more first cooling loops from first heat exchanger 324 to servers 312. In at least one embodiment, first coolant is flowed through one or more manifolds. In at least one embodiment, a first supply manifold 344 is supplied with first coolant from first heat exchanger 324. In at least one embodiment, first supply manifold 344 may distribute first coolant to multiple servers 312 supported in rack 310. In at least one embodiment, first coolant may flow from first supply manifold 344 into servers 312 and cool high-power component(s) of servers 312. In at least one embodiment, high-power server components within servers 312 may each be coupled to one or more cold plates to receive first coolant. In at least one embodiment, one or more cold plates may transfer heat from a high-power server component to first coolant. In at least one embodiment, first coolant carries heat away from high-power components of servers 312. In at least one embodiment, a first return manifold 346 collects heated first coolant output from each of servers 312. In at least one embodiment, first coolant flows from first return manifold 346 to first heat exchanger 324 where first coolant is cooled by cool air 331 flowing through first heat exchanger 324. In at least one embodiment, warm air 333 carrying exchanged heat from first coolant is output from first heat exchanger 324 to an ambient environment. In at least one embodiment, one or more fans 322 blow air through first heat exchanger 324. In at least one embodiment, cooled first coolant is again flowed from first heat exchanger 324 to servers 312 via first supply manifold 344. In at least one embodiment, system 300 lacks a CDU to distribute first coolant and/or to control flow of first coolant between first heat exchanger 324 and servers 312.

In at least one embodiment, second coolant is flowed along one or more flow paths of one or more second cooling loops from second heat exchangers 326 to servers 312. In at least one embodiment, second coolant is flowed through one or more manifolds. In at least one embodiment, a second supply manifold 354 is supplied with second coolant from second heat exchanger 326. In at least one embodiment, second supply manifold 354 may distribute second coolant to multiple servers 312. In at least one embodiment, second coolant may flow from second supply manifold 354 into one or more server chassis to immerse low-power components of servers 312. In at least one embodiment, server chassis are hermetically sealed so that second coolant does not leak out of server chassis. In at least one embodiment, system 300 lacks a CDU to distribute second coolant and/or to control flow of second coolant between second heat exchanger 326 and servers 312.

In at least one embodiment, while flowing through server chassis, second coolant may remove heat from low-power server components. In at least one embodiment, as described above, second coolant is a dielectric coolant. In at least one embodiment, second coolant is not electrically conductive. In at least one embodiment, a second return manifold 356 collects heated second coolant output from each server chassis. In at least one embodiment, second coolant flows from second return manifold 356 to second heat exchanger 326 where second coolant is cooled by cool air 331 flowing through second heat exchanger 326. In at least one embodiment, warm air 333 carrying exchanged heat from second coolant is output from a second heat exchanger 326 to an ambient environment. In at least one embodiment, one or more fans 322 blow air through second heat exchanger 326. In at least one embodiment, cooled second coolant is again flowed from second heat exchanger 326 to servers 312 via second supply manifold 354. In at least one embodiment, although FIG. 3 illustrates both first heat exchanger 324 and second heat exchanger 326, system 300 includes a single one of first heat exchanger 324 or second heat exchanger 326.

Figure 4:
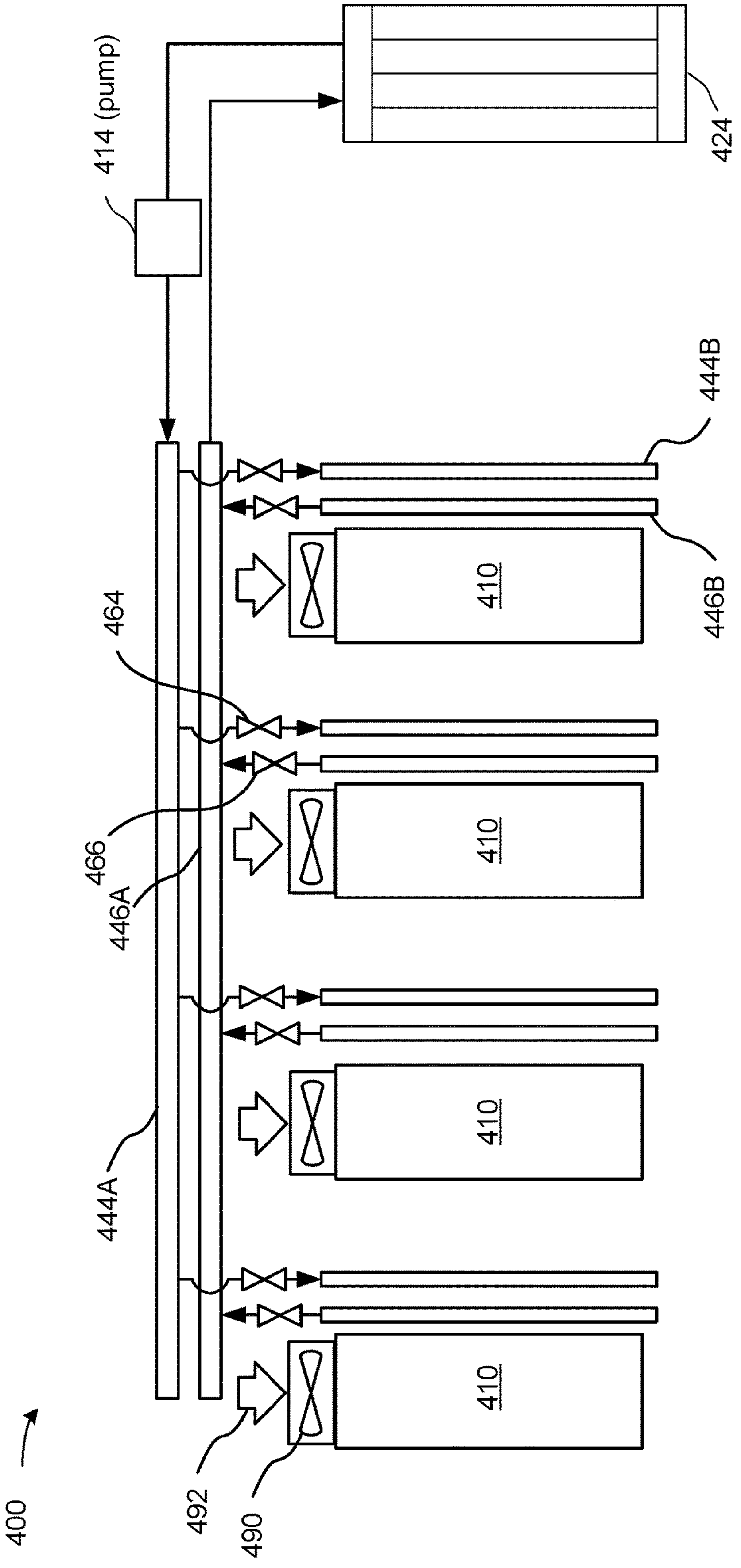
FIG. 4 illustrates a schematic diagram of a single loop datacenter cooling system, according to at least one embodiment.

FIG. 4 illustrates a schematic diagram of a single loop datacenter cooling system 400, according to at least one embodiment. Features illustrated in FIG. 4 having similar numbering to features shown in other figures may have similar functions. In at least one embodiment, first coolant is flowed from a heat exchanger 424 to one or more servers disposed in racks 410. In at least one embodiment, racks 410 are disposed in a row, forming a row of racks 410. In at least one embodiment, a row supply manifold 444A receives coolant from heat exchanger 424 and distributes coolant to rack supply manifolds 444B. In at least one embodiment, first coolant may flow from first row supply manifold 444A to first rack supply manifolds 444B through a first supply valve 464. In at least one embodiment, first supply valve 464 can be closed to stop flow of first coolant. In at least one embodiment, first supply valve 464 can be at least partially closed and/or opened to regulate flow of first coolant. In at least one embodiment, first rack supply manifolds 444B may be fluidly coupled to first row supply manifold 444A via a quick-disconnecting coupler (e.g., a quick-disconnect, etc.). In at least one embodiment, first supply valve 464 may be fluidly coupled to first row supply manifold 444A and/or first rack supply manifolds 444B via one or more quick-disconnecting couplers. In at least one embodiment, first supply valve 464 is coupled to (e.g., mounted on) first row supply manifold 444A. In at least one embodiment, coolant flows from rack supply manifold 444B to one or more servers in a rack 410. In at least one embodiment, coolant may flow via one or more conduits, such as pipes or tubes, from rack supply manifold 444B to servers in a rack 410.

In at least one embodiment, coolant is flowed into one or more cold plates within servers disposed in racks 410 to cool one or more high-power server components such as a CPU or GPU. In at least one embodiment, coolant removes heat from high-power server components and flows to rack return manifold 446B. In at least one embodiment, coolant flows through one or more conduits from cold plates within servers to rack return manifold 446B. In at least one embodiment, rack return manifold 446B collects heated coolant from one or more servers in a corresponding rack 410. In at least one embodiment, coolant flows from rack return manifold 446B to row return manifold 446A. In at least one embodiment, row return manifold 446A collects coolant from multiple rack return manifolds 446B. In at least one embodiment, first coolant may flow from first rack return manifold 446B to first row return manifold 446A through a first return valve 466. In at least one embodiment, first return valve 466 can be closed to stop flow of first coolant. In at least one embodiment, first return valve 466 can be at least partially closed and/or opened to regulate flow of first coolant. In at least one embodiment, first rack return manifolds 446B may be fluidly coupled to a first row return manifold 446A via a quick-disconnecting coupler. In at least one embodiment, first return valve 466 may be fluidly coupled to first row return manifolds 446A and/or first rack return manifolds 446B via one or more quick-disconnecting couplers. In at least one embodiment, first return valve 466 is coupled to first row return manifold 446A. In at least one embodiment, coolant flows from row return manifold 446A to heat exchanger 424 where coolant is cooled and returned to row supply manifold 444A. In at least one embodiment, a pump 460 causes coolant to flow through conduits from heat exchanger 424 to servers disposed in racks 410. In at least one embodiment, system 400 includes multiple pumps to flow coolant.

In at least one embodiment, low-power server components of servers disposed in racks 410 are cooled by air cooling. In at least one embodiment, one or more fans 490 associated with a rack 410 blow cool air 492 through a rack 410 to cool low-power server components. In at least one embodiment, a server disposed in a rack 410 includes one or more fans to blow cool air to cool one or more low-power server components. In at least one embodiment, cool air 492 carries heat away from servers in racks 410. In at least one embodiment, air is cooled in a chiller, a cooler, or an air-handling unit to form cool air 492. In at least one embodiment, cool air 492 carrying heat away from one or more servers is again cooled in a chiller, a cooler, or an air-handling unit before being recirculated to cool one or more low-power server components.

In at least one embodiment, where system 400 includes multiple rows of racks 410, system 400 includes a corresponding row supply manifold 444A and row return manifold 446A for each row of racks 410. In at least one embodiment, system 400 includes a corresponding rack supply manifold 444B and rack return manifold 446B for each rack 410.

In at least one embodiment, although only one heat exchanger 424 is shown in FIG. 4 with corresponding manifolds to flow coolant to servers disposed in racks 410, system 400 includes another heat exchanger and/or another set of manifolds to flow another coolant to servers in racks 410. In at least one embodiment, heat exchanger 424 cools coolant used to cool high-power server components via cold plates, and another heat exchanger cools another coolant used to cool low-power server components via immersion cooling. In at least one embodiment, another heat exchanger and/or another set of manifolds are arranged in parallel to heat exchanger 424 and manifolds illustrated in FIG. 4. In at least one embodiment, system 400 lacks a CDU to distribute coolant and/or to control flow of coolant from heat exchanger 424 to one or more manifolds and/or to servers disposed in rack 410.

Figure 5A:
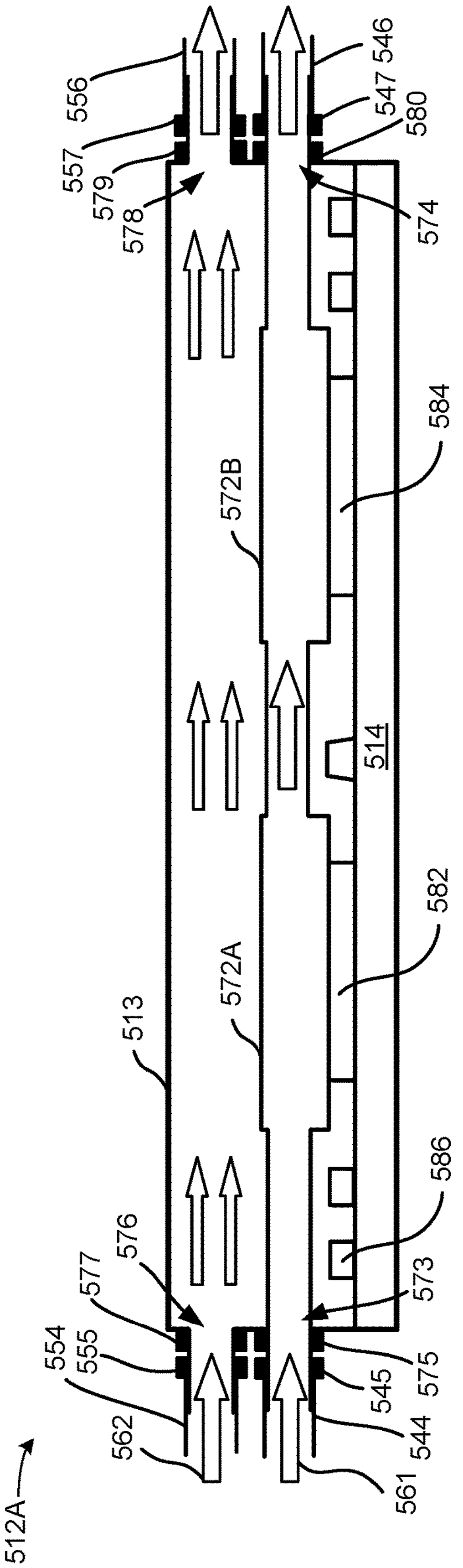
FIG. 5A illustrates an example server cooled by parallel single cooling loops, according to at least one embodiment.

FIG. 5A illustrates an example server 512A cooled by parallel single cooling loops, according to at least one embodiment. In at least one embodiment, server 512A includes a server chassis 513 that encloses server components. In at least one embodiment, one or more server components may be coupled to a printed circuit board (PCB) 514. In at least one embodiment, PCB 514 may include connections to interconnect one or more server components. In at least one embodiment, server chassis 513 is constructed to be supported by a rack such as a datacenter rack. In at least one embodiment, server chassis 513 includes mounting brackets, mounting holes, and/or mounting slots so that server chassis 513 can be accepted and supported by a datacenter rack.

In at least one embodiment, server chassis 513 includes multiple openings to receive and expel coolant. In at least one embodiment, server chassis 513 includes an opening 573 to receive first coolant 561. In at least one embodiment, opening 573 is on a first sidewall of server chassis 513. In at least one embodiment, opening 573 includes a quick-disconnect feature 575 that allows connection to a coolant supply manifold. In at least one embodiment, quick-disconnect feature 575 is a male quick-disconnect feature or a female quick-disconnect feature. In at least one embodiment, a conduit 544 having a quick-disconnect feature 545 is coupled to chassis 513 at opening 573 via quick-disconnect feature 575 (e.g., a female quick-disconnect feature if quick-disconnect feature 575 is a male quick-disconnect feature or a male quick-disconnect feature if quick disconnect feature 575 is a female quick-disconnect feature). In at least one embodiment, quick-disconnect feature 545 of conduit 544 and quick-disconnect feature 575 of opening 573 make up a quick-disconnecting coupler. In at least one embodiment, first coolant flows along a flow path of a first cooling loop, such as first cooling loop 214 of FIG. 2. In at least one embodiment, first coolant 561 flows through one or more conduits inside server chassis 513 to cold plates 572A and 572B. In at least one embodiment, cold plates 572A and 572B are associated with a first datacenter cooling loop. In at least one embodiment, each of cold plates 572A and 572B are coupled to high-power server components, such as server processing units. In at least one embodiment, cold plates 572A and 572B are coupled to CPU 582 and/or GPU 584 respectively.

In at least one embodiment, cold plates 572A and 572B are arranged in series with conduits connecting cold plates 572A and 572B. In at least one embodiment, cold plates 572 are arranged in parallel. In at least one embodiment, where cold plates 572 are arranged in series, first coolant may first flow to a first cold plate 572A and then to a second cold plate 572B via a conduit connecting first cold plate 572A to second cold plate 572B, as illustrated in FIG. 5. In at least one embodiment, where cold plates 572 are arranged in parallel, a first portion of first coolant may flow to a first cold plate and a second portion of first coolant may flow to a second cold plate. In at least one embodiment, a first portion and a second portion of first coolant may rejoin after flowing through respective cold plates. In at least one embodiment, while flowing through cold plates 572A and 572B, first coolant 561 receives heat from high-power server components such as heat from CPU 582 and/or heat from GPU 583. In at least one embodiment, first coolant 561 is expelled from server chassis 513 through opening 574. In at least one embodiment, opening 574 is on a sidewall opposite to opening 573. In at least one embodiment, opening 574 includes a quick-disconnect feature 580 that allows connection to a coolant return manifold. In at least one embodiment, quick-disconnect feature 580 is a male quick-disconnect feature or a female quick-disconnect feature. In at least one embodiment, a conduit 546 having a quick-disconnect feature 547 is coupled to chassis 513 at opening 574 via quick-disconnect feature 580 (e.g., a female quick-disconnect feature if quick-disconnect feature 580 is a male quick-disconnect feature or a male quick-disconnect feature if quick disconnect feature 580 is a female quick-disconnect feature). In at least one embodiment, quick-disconnect feature 547 of conduit 546 and quick-disconnect feature 580 of opening 574 make up a quick-disconnecting coupler. In at least one embodiment, first coolant 561 is received by server chassis 513 at a first temperature and leaves server chassis 513 at a higher second temperature. In at least one embodiment, first coolant 561 carries heat away from server 512A and exchanges first heat with an ambient environment via a first heat exchanger (such as first heat exchanger 224 of FIG. 2) without exchanging heat in a CDU.

In at least one embodiment, server chassis 513 receives second coolant 562 through opening 576. In at least one embodiment, opening 576 is on a first sidewall of server chassis 513. In at least one embodiment, opening 576 includes a quick-disconnect feature 577 that allows connection to a coolant supply manifold. In at least one embodiment, quick-disconnect feature 577 is a male quick-disconnect feature or a female quick-disconnect feature. In at least one embodiment, a conduit 554 having a quick-disconnect feature 555 is coupled to chassis 513 at opening 576 via quick-disconnect feature 577 (e.g., a female quick-disconnect feature if quick-disconnect feature 577 is a male quick-disconnect feature or a male quick-disconnect feature if quick disconnect feature 577 is a female quick-disconnect feature). In at least one embodiment, quick-disconnect feature 555 of conduit 554 and quick-disconnect feature 577 of opening 576 make up a quick-disconnecting coupler. In at least one embodiment, second coolant 562 is to cool one or more low-power server components 586. In at least one embodiment, low-power server components 586 can include components such as motherboards, power supplies, memory, solid state drives, disc drives, and so on. In at least one embodiment, because second coolant 562 directly contacts many server components, second coolant 562 is a dielectric coolant so as not to create electrical shorts between electrodes or conducting pins on server components. In at least one embodiment, because second coolant 562 is a dielectric coolant, second coolant 562 may have a lower heat capacity compared to first coolant 561. In at least one embodiment, second coolant 562 may be inefficient for cooling high-power server components via cold plate cooling. In at least one embodiment, second coolant 562 may have a higher heat capacity than air, making second coolant 562 used for immersion cooling a better cooling medium than air cooling. In at least one embodiment, second coolant 562 is expelled from server chassis 513 through opening 578. In at least one embodiment, opening 578 is on a second sidewall of server chassis 513 that is opposite a first sidewall that includes opening 576. In at least one embodiment, opening 578 includes a quick-disconnect feature 579 that allows connection to a coolant return manifold. In at least one embodiment, quick-disconnect feature 579 is a male quick-disconnect feature or a female quick-disconnect feature. In at least one embodiment, a conduit 556 having a quick-disconnect feature 557 is coupled to chassis 513 at opening 578 via quick-disconnect feature 579 (e.g., a female quick-disconnect feature if quick-disconnect feature 579 is a male quick-disconnect feature or a male quick-disconnect feature if quick disconnect feature 579 is a female quick-disconnect feature). In at least one embodiment, quick-disconnect feature 557 of conduit 556 and quick-disconnect feature 579 of opening 578 make up a quick-disconnecting coupler. In at least one embodiment, second coolant 562 is received by server chassis 513 at a third temperature and leaves server chassis 513 at a higher fourth temperature. In at least one embodiment, second coolant 562 carries heat away from server 512A and exchanges second heat with an ambient environment via a second heat exchanger (such as second heat exchanger 226 of FIG. 2) without exchanging heat in a CDU.

In at least one embodiment, each of quick-disconnect features 575, 577, 579, 580 may be disconnected from corresponding quick-disconnect features 545, 555, 547, 557. In at least one embodiment, chassis 513 may then be removed from a rack and/or may be opened for maintenance.

Figure 5B:
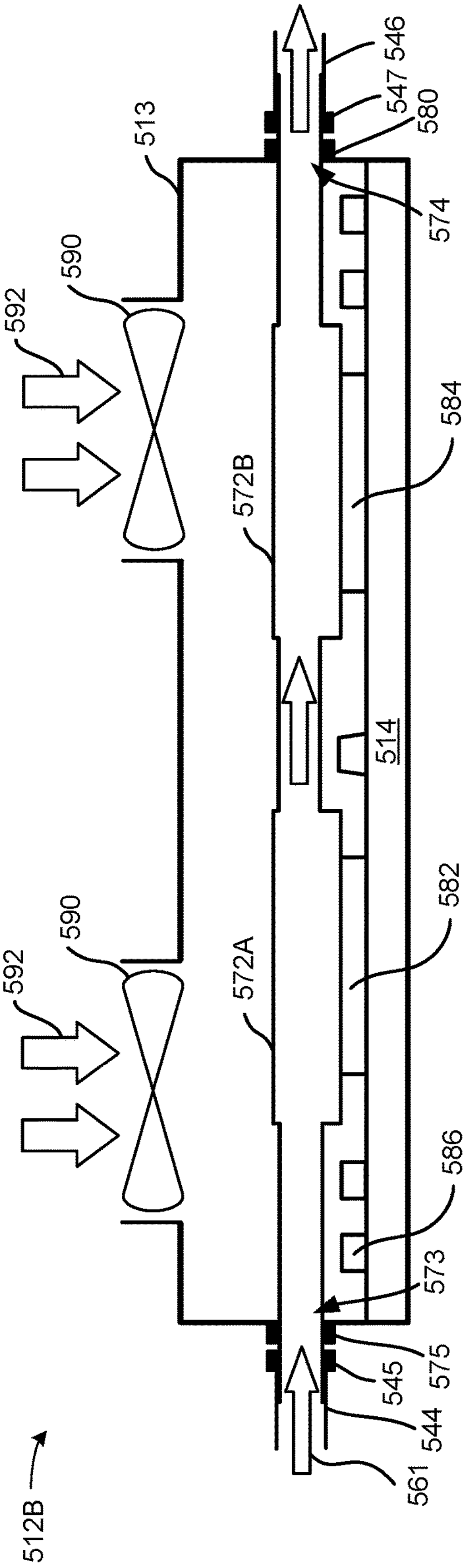
FIG. 5B illustrates an example server cooled by a single cooling loop and air cooling, according to at least one embodiment.

FIG. 5B illustrates an example server 512B that is cooled by a single cooling loop that provides cold plate cooling to cool first components combined with air cooling to cool second components, according to at least one embodiment. In at least one embodiment, server 512B includes one or more fans 590 to blow cool air 592 into server chassis 513 to cool one or more low-power components 586. In at least one embodiment, cool air 592 is moved within server chassis 513 to remove heat from low-power components 586. In at least one embodiment, cool air 592 may enter server chassis 513 via one or more openings in a top, a bottom, or a side of server chassis 513. In at least one embodiment, air carrying heat from one or more low-power components 586 may leave server chassis 513 via one or more other openings in a top, a bottom, or a side of server chassis 513. In at least one embodiment, air moves horizontally in the server chassis 513. In at least one embodiment, air moves vertically in the server chassis 513.

Figure 6:
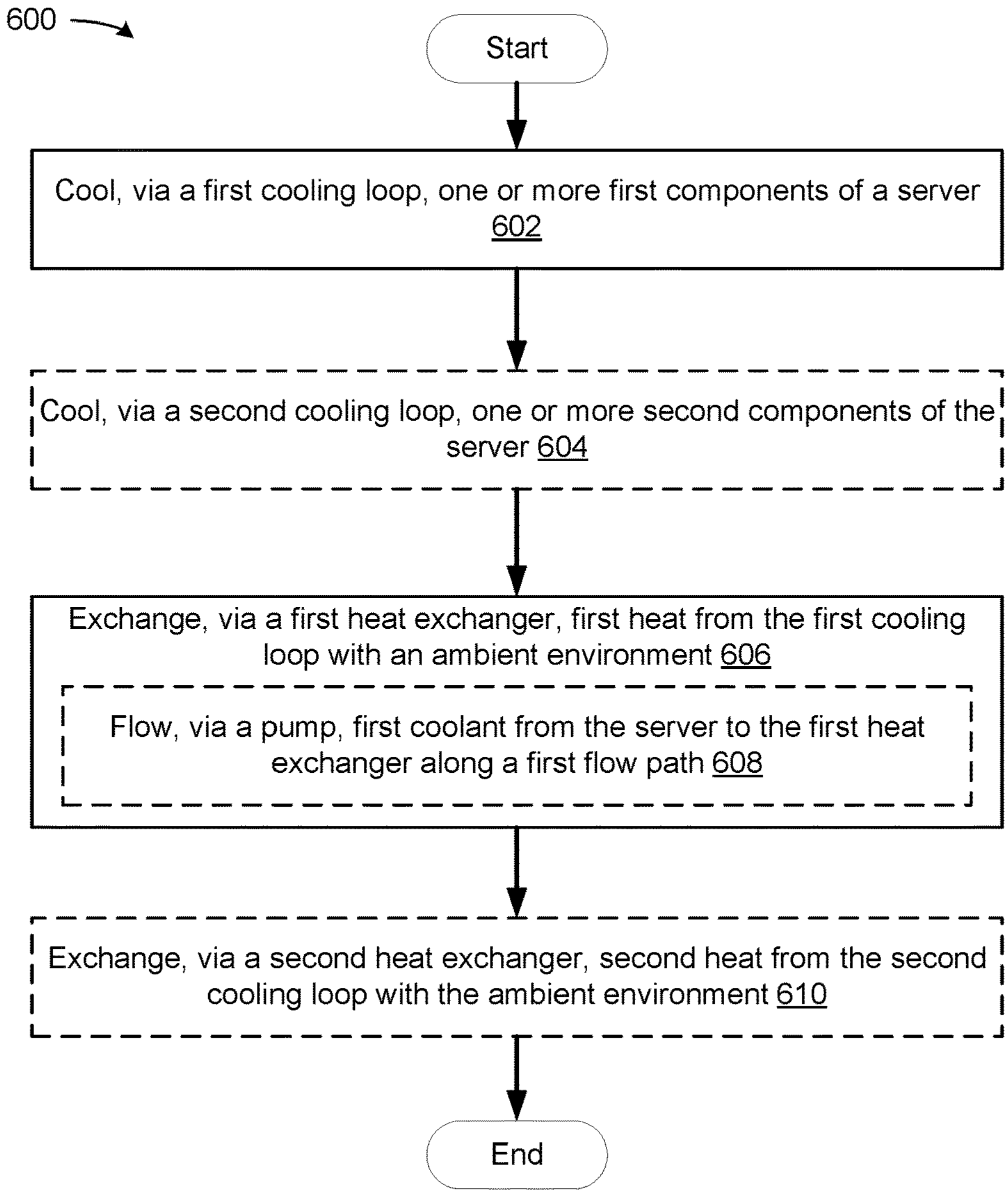
FIG. 6 illustrates a flow diagram of an example method for cooling a datacenter, according to at least one embodiment.

FIG. 6 illustrates a flow diagram of an example method 600 for cooling a datacenter, according to at least one embodiment. In at least one embodiment, method 600 can be performed by a single loop data center cooling system. In at least one embodiment, method 600 can be performed by one of systems 200, 300, or 400.

For simplicity of explanation, method 600 is depicted and described as a series of operations. However, operations in accordance with this disclosure can occur in various orders and/or concurrently and with other operations not presented and described herein. Furthermore, not all illustrated operations may be performed to implement method 600 in accordance with disclosed subject matter.

In at least one embodiment, at block 602, a system cools, via a first cooling loop, one or more first components of a server. One or more first components may include server components having a first power density. In at least one embodiment, first coolant is distributed to one or more servers via one or more first manifolds of one or more first cooling loops. In at least one embodiment, a server is disposed in a datacenter rack. In at least one embodiment, first coolant is flowed along one or more first cooling loops to one or more cold plates that are coupled to one or more first components within servers. In at least one embodiment, first server components have a first power density that is above a threshold power density. In at least one embodiment, first server components output heat that is greater than a threshold amount of heat. In at least one embodiment, one or more first manifolds distribute first coolant to one or more datacenter racks and/or rows of datacenter racks. In at least one embodiment, each datacenter rack supports at least one server.

In at least one embodiment, at block 604, a system cools, via a second cooling loop, one or more second components of a server. In at least one embodiment, a second cooling loop is arranged in parallel with a first cooling loop to cool server components. In at least one embodiment, one or more second components may include server components having a second power density. In at least one embodiment, second coolant is distributed to one or more servers via one or more second manifolds of one or more second coolant loops. In at least one embodiment, second coolant is flowed along one or more second cooling loops to one or more servers. In at least one embodiment, second coolant is flowed into one or more server chassis to cool one or more second components within one or more servers. In at least one embodiment, second coolant cools second server components by immersion cooling. In at least one embodiment, second coolant is a dielectric liquid coolant. In at least one embodiment, server chassis are hermetically sealed so second coolant does not leak out of a server chassis or become contaminated. In at least one embodiment, second server components have a second power density that is below a threshold power density. In at least one embodiment, second components output heat that is less than a threshold amount of heat. In at least one embodiment, one or more second manifolds distribute second coolant to one or more datacenter racks and/or rows of datacenter racks.

In at least one embodiment, at block 606, a system exchanges, via a first heat exchanger, first heat from a first cooling loop with an ambient environment without exchanging heat in a CDU. In at least one embodiment, one or more first cooling loops carry first heat away from one or more servers. In at least one embodiment, at block 608, a system flows first coolant, via a pump, from a server to a first heat exchanger along a first flow path. In at least one embodiment, in a first heat exchanger, heat is exchanged between first coolant and an ambient environment. In at least one embodiment, air cools first coolant flowing through a first heat exchanger. In at least one embodiment, cooled first coolant is returned to one or more servers to cool first server components.

In at least one embodiment, at block 610, a system exchanges, via a second heat exchanger, second heat from a second cooling loop with an ambient environment without exchanging heat in a CDU. In at least one embodiment, one or more second cooling loops carry second heat away from one or more servers. In at least one embodiment, second coolant is flowed by a pump from a server to a second heat exchanger along a second flow path. In at least one embodiment, in a second heat exchanger, heat is exchanged between second coolant and an ambient environment. In at least one embodiment, air cools second coolant flows through a second heat exchanger. In at least one embodiment, cooled second coolant is returned to one or more servers to cool second server components.

Figure 7:
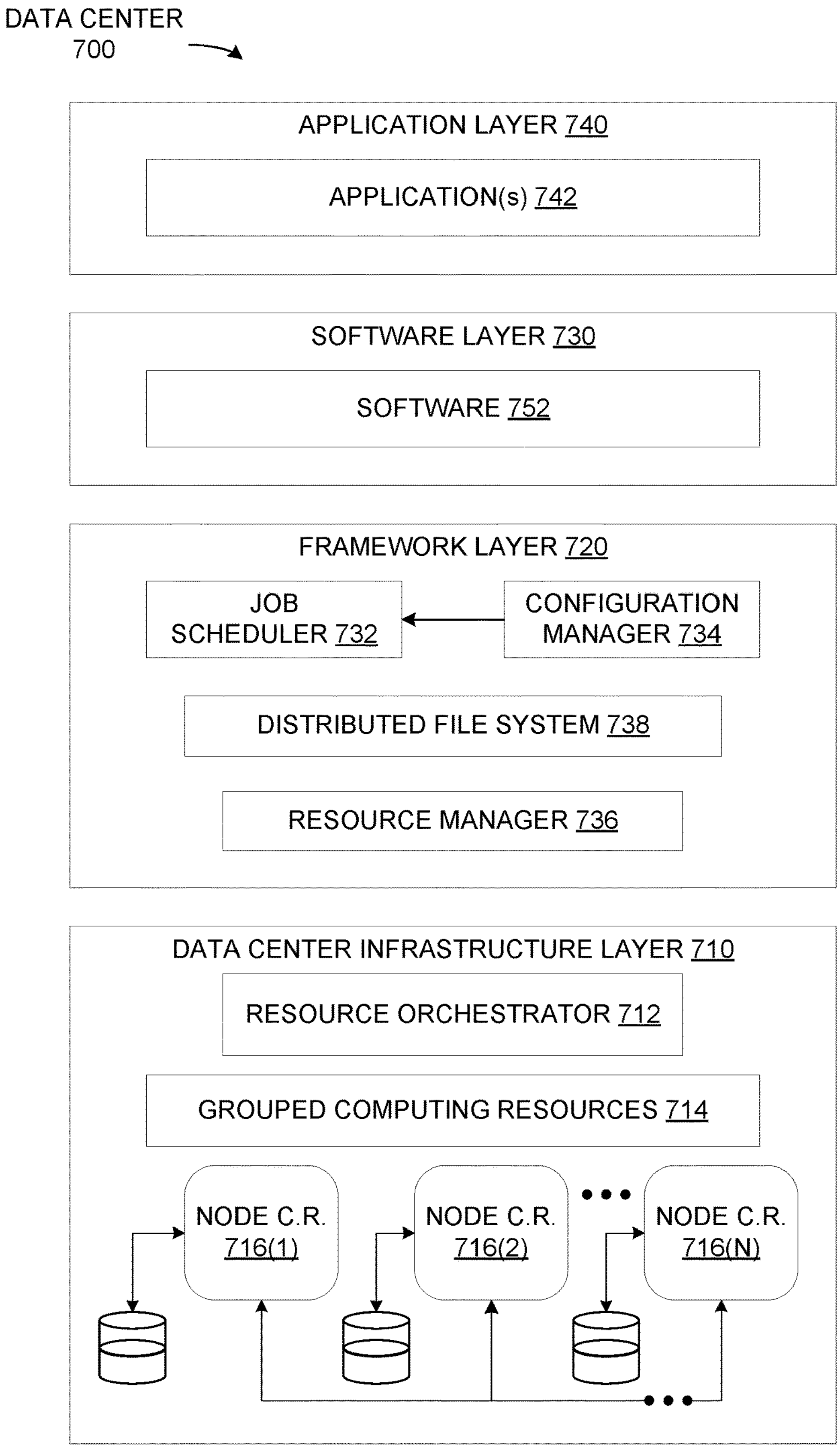
FIG. 7 illustrates an exemplary data center, in accordance with at least one embodiment.

FIG. 7 illustrates an exemplary data center 700, in accordance with at least one embodiment. In at least one embodiment, data center 700 includes, without limitation, a data center infrastructure layer 710, a framework layer 720, a software layer 730 and an application layer 740.

In at least one embodiment, as shown in FIG. 7, data center infrastructure layer 710 may include a resource orchestrator 712, grouped computing resources 714, and node computing resources ("node C.R.s") 716(1)-716(N), where "N" represents any whole, positive integer. In at least one embodiment, node C.R.s 716(1)-716(N) may include, but are not limited to, any number of central processing units ("CPUs") or other processors (including accelerators, field programmable gate arrays ("FPGAs"), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 716(1)-716(N) may be a server having one or more of above-mentioned computing resources.

In at least one embodiment, grouped computing resources 714 may include separate groupings of node C.R.s housed within one or more racks (not shown), or many racks housed in data centers at various geographical locations (also not shown). Separate groupings of node C.R.s within grouped computing resources 714 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 712 may configure or otherwise control one or more node C.R.s 716(1)-716(N) and/or grouped computing resources 714. In at least one embodiment, resource orchestrator 712 may include a software design infrastructure ("SDI") management entity for data center 700. In at least one embodiment, resource orchestrator 712 may include hardware, software or some combination thereof.

In at least one embodiment, as shown in FIG. 7, framework layer 720 includes, without limitation, a job scheduler 732, a configuration manager 734, a resource manager 736 and a distributed file system 738. In at least one embodiment, framework layer 720 may include a framework to support software 752 of software layer 730 and/or one or more application(s) 742 of application layer 740. In at least one embodiment, software 752 or application(s) 742 may respectively include web-based service software or applications, such as those provided by Amazon Web Services, Google Cloud and Microsoft Azure. In at least one embodiment, framework layer 720 may be, but is not limited to, a type of free and open-source software web application framework such as Apache Spark™ (hereinafter "Spark") that may utilize distributed file system 738 for large-scale data processing (e.g., "big data"). In at least one embodiment, job scheduler 732 may include a Spark driver to facilitate scheduling of workloads supported by various layers of data center 700. In at least one embodiment, configuration manager 734 may be capable of configuring different layers such as software layer 730 and framework layer 720, including Spark and distributed file system 738 for supporting large-scale data processing. In at least one embodiment, resource manager 736 may be capable of managing clustered or grouped computing resources mapped to or allocated for support of distributed file system 738 and job scheduler 732. In at least one embodiment, clustered or grouped computing resources may include grouped computing resource 714 at data center infrastructure layer 710. In at least one embodiment, resource manager 736 may coordinate with resource orchestrator 712 to manage these mapped or allocated computing resources.

In at least one embodiment, software 752 included in software layer 730 may include software used by at least portions of node C.R.s 716(1)-716(N), grouped computing resources 714, and/or distributed file system 738 of framework layer 720. One or more types of software may include, but are not limited to, Internet web page search software, e-mail virus scan software, database software, and streaming video content software.

In at least one embodiment, application(s) 742 included in application layer 740 may include one or more types of applications used by at least portions of node C.R.s 716(1)-716(N), grouped computing resources 714, and/or distributed file system 738 of framework layer 720. In at least one or more types of applications may include, without limitation, CUDA applications, 5G network applications, artificial intelligence application, data center applications, and/or variations thereof.

In at least one embodiment, any of configuration manager 734, resource manager 736, and resource orchestrator 712 may implement any number and type of self-modifying actions based on any amount and type of data acquired in any technically feasible fashion. In at least one embodiment, self-modifying actions may relieve a data center operator of data center 700 from making possibly bad configuration decisions and possibly avoiding underutilized and/or poor performing portions of a data center.

Figure 8:
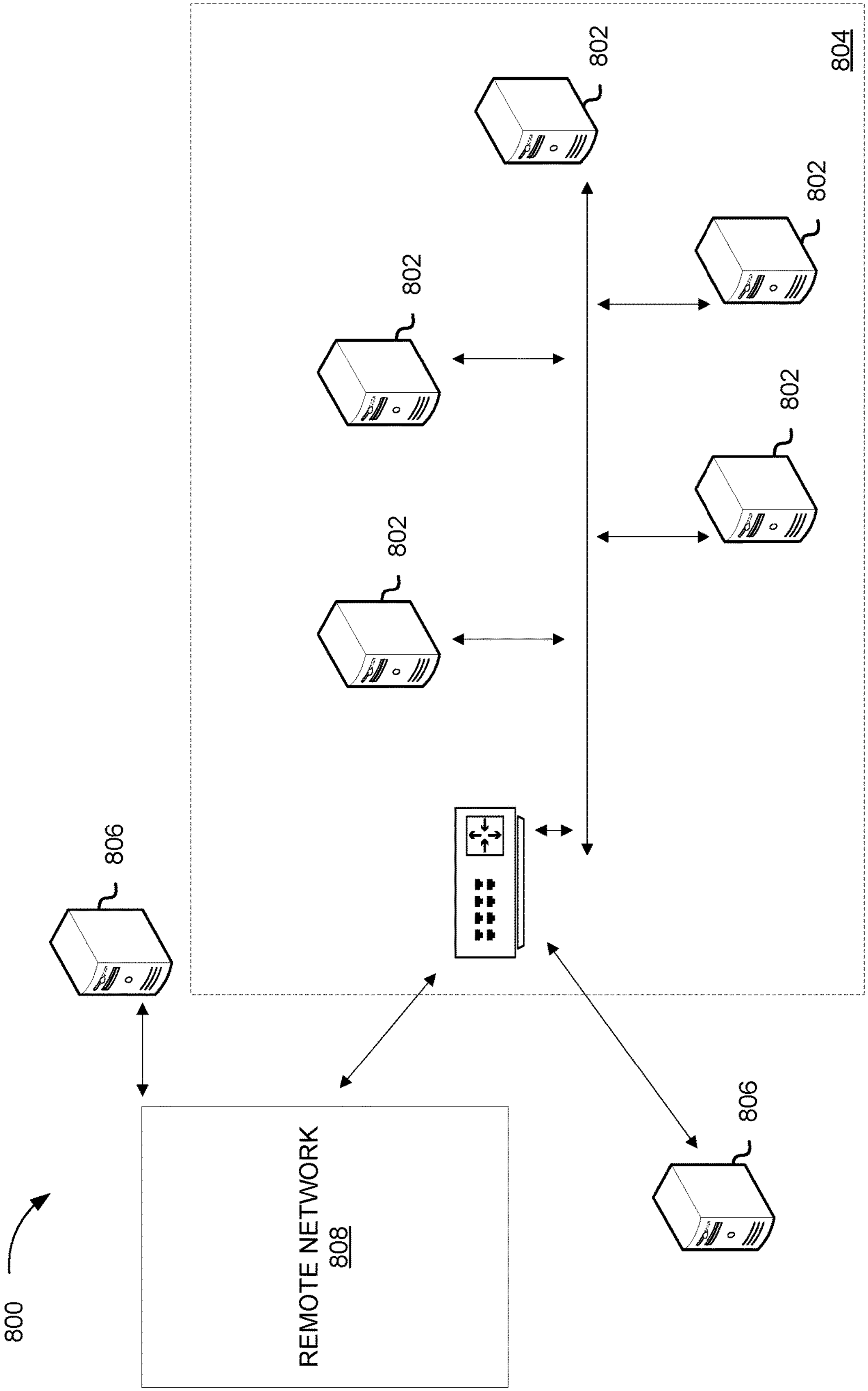
FIG. 8 illustrates a client-server network, in accordance with at least one embodiment.

FIG. 8 illustrates a client-server network 804 formed by a plurality of network server computers 802 which are interlinked, in accordance with at least one embodiment. In at least one embodiment, each network server computer 802 stores data accessible to other network server computers 802 and to client computers 806 and networks 808 which link into a wide area network 804. In at least one embodiment, configuration of a client-server network 804 may change over time as client computers 806 and one or more networks 808 connect and disconnect from a network 804, and as one or more trunk line server computers 802 are added or removed from a network 804. In at least one embodiment, when a client computer 806 and a network 808 are connected with network server computers 802, client-server network includes such client computer 806 and network 808. In at least one embodiment, the term computer includes any device or machine capable of accepting data, applying prescribed processes to data, and supplying results of processes.

In at least one embodiment, client-server network 804 stores information which is accessible to network server computers 802, remote networks 808 and client computers 806. In at least one embodiment, network server computers 802 are formed by main frame computers minicomputers, and/or microcomputers having one or more processors each. In at least one embodiment, server computers 802 are linked together by wired and/or wireless transfer media, such as conductive wire, fiber optic cable, and/or microwave transmission media, satellite transmission media or other conductive, optic or electromagnetic wave transmission media. In at least one embodiment, client computers 806 access a network server computer 802 by a similar wired or a wireless transfer medium. In at least one embodiment, a client computer 806 may link into a client-server network 804 using a modem and a standard telephone communication network. In at least one embodiment, alternative carrier systems such as cable and satellite communication systems also may be used to link into client-server network 804. In at least one embodiment, other private or time-shared carrier systems may be used. In at least one embodiment, network 804 is a global information network, such as the Internet. In at least one embodiment, network is a private intranet using similar protocols as the Internet, but with added security measures and restricted access controls. In at least one embodiment, network 804 is a private, or semi-private network using proprietary communication protocols.

In at least one embodiment, client computer 806 is any end user computer, and may also be a mainframe computer, mini-computer or microcomputer having one or more microprocessors. In at least one embodiment, server computer 802 may at times function as a client computer accessing another server computer 802. In at least one embodiment, remote network 808 may be a local area network, a network added into a wide area network through an independent service provider (ISP) for the Internet, or another group of computers interconnected by wired or wireless transfer media having a configuration which is either fixed or changing over time. In at least one embodiment, client computers 806 may link into and access a network 804 independently or through a remote network 808.

Figure 9:
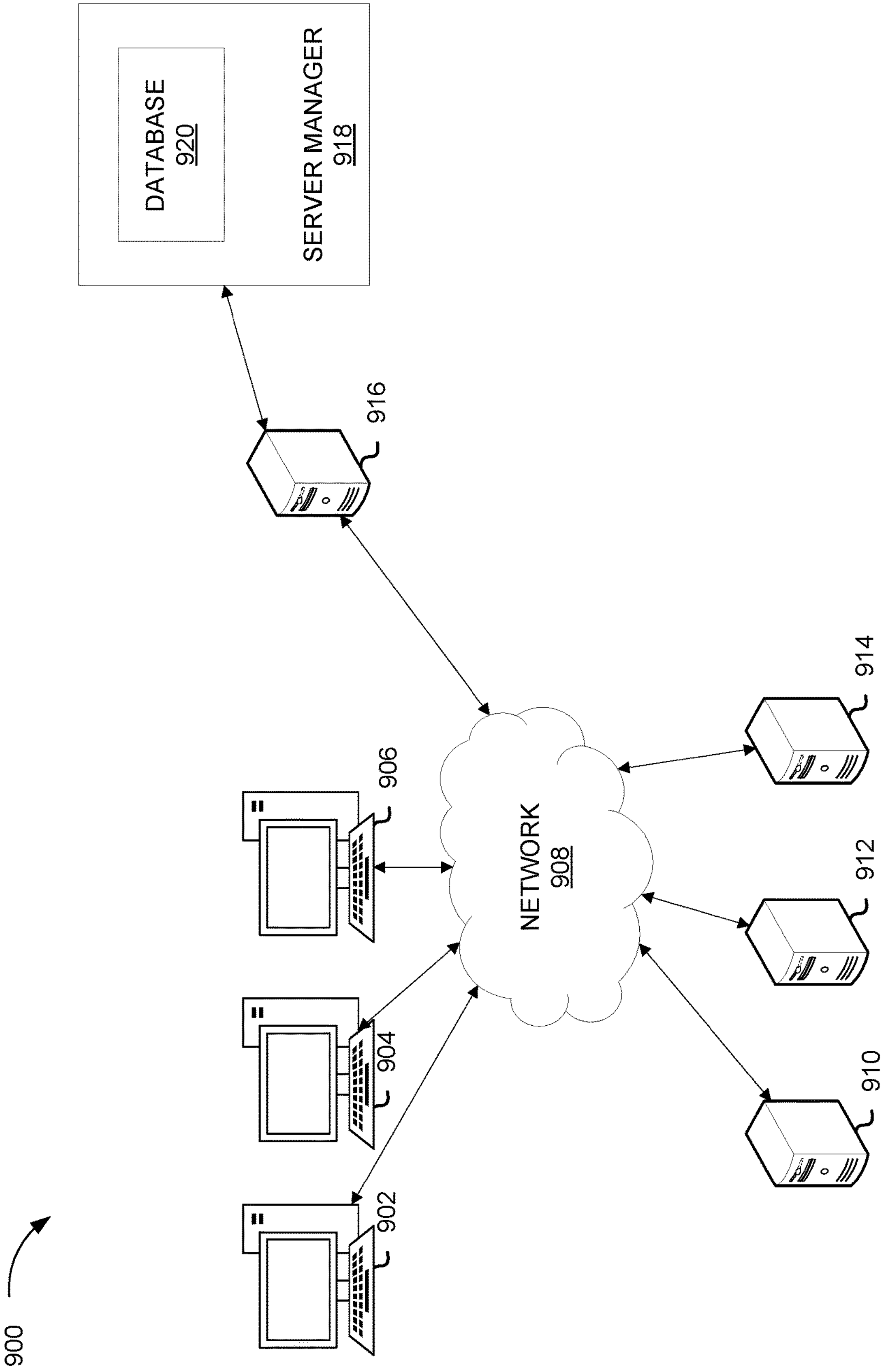
FIG. 9 illustrates a computer network, in accordance with at least one embodiment.

FIG. 9 illustrates a computer network 908 connecting one or more computing machines, in accordance with at least one embodiment. In at least one embodiment, network 908 may be any type of electronically connected group of computers including, for instance, the following networks: Internet, Intranet, Local Area Networks (LAN), Wide Area Networks (WAN) or an interconnected combination of these network types. In at least one embodiment, connectivity within a network 908 may be a remote modem, Ethernet (IEEE 802.3), Token Ring (IEEE 802.5), Fiber Distributed Datalink Interface (FDDI), Asynchronous Transfer Mode (ATM), or any other communication protocol. In at least one embodiment, computing devices linked to a network may be desktop, server, portable, handheld, set-top box, personal digital assistant (PDA), a terminal, or any other desired type or configuration. In at least one embodiment, depending on their functionality, network connected devices may vary widely in processing power, internal memory, and other performance aspects. In at least one embodiment, communications within a network and to or from computing devices connected to a network may be either wired or wireless. In at least one embodiment, network 908 may include, at least in part, the world-wide public Internet which generally connects a plurality of users in accordance with a client-server model in accordance with a transmission control protocol/internet protocol (TCP/IP) specification. In at least one embodiment, client-server network is a dominant model for communicating between two computers. In at least one embodiment, a client computer ("client") issues one or more commands to a server computer ("server"). In at least one embodiment, server fulfills client commands by accessing available network resources and returning information to a client pursuant to client commands. In at least one embodiment, client computer systems and network resources resident on network servers are assigned a network address for identification during communications between elements of a network. In at least one embodiment, communications from other network connected systems to servers will include a network address of a relevant server/network resource as part of communication so that an appropriate destination of a data/request is identified as a recipient. In at least one embodiment, when a network 908 comprises the global Internet, a network address is an IP address in a TCP/IP format which may, at least in part, route data to an e-mail account, a website, or other Internet tool resident on a server. In at least one embodiment, information and services which are resident on network servers may be available to a web browser of a client computer through a domain name (e.g., www.site.com) which maps to an IP address of a network server.

In at least one embodiment, a plurality of clients 902, 904, and 906 are connected to a network 908 via respective communication links. In at least one embodiment, each of these clients may access a network 908 via any desired form of communication, such as via a dial-up modem connection, cable link, a digital subscriber line (DSL), wireless or satellite link, or any other form of communication. In at least one embodiment, each client may communicate using any machine that is compatible with a network 908, such as a personal computer (PC), work station, dedicated terminal, personal data assistant (PDA), or other similar equipment. In at least one embodiment, clients 902, 904, and 906 may or may not be located in a same geographical area.

In at least one embodiment, a plurality of servers 910, 912, and 914 are connected to a network 908 to serve clients that are in communication with a network 908. In at least one embodiment, each server is typically a powerful computer or device that manages network resources and responds to client commands. In at least one embodiment, servers include computer readable data storage media such as hard disk drives and RAM memory that store program instructions and data. In at least one embodiment, servers 910, 912, 914 run application programs that respond to client commands. In at least one embodiment, server 910 may run a web server application for responding to client requests for HTML pages and may also run a mail server application for receiving and routing electronic mail. In at least one embodiment, other application programs, such as an FTP server or a media server for streaming audio/video data to clients may also be running on a server 910. In at least one embodiment, different servers may be dedicated to performing different tasks. In at least one embodiment, server 910 may be a dedicated web server that manages resources relating to web sites for various users, whereas a server 912 may be dedicated to provide electronic mail (email) management. In at least one embodiment, other servers may be dedicated for media (audio, video, etc.), file transfer protocol (FTP), or a combination of any two or more services that are typically available or provided over a network. In at least one embodiment, each server may be in a location that is the same as or different from that of other servers. In at least one embodiment, there may be multiple servers that perform mirrored tasks for users, thereby relieving congestion or minimizing traffic directed to and from a single server. In at least one embodiment, servers 910, 912, 914 are under control of a web hosting provider in a business of maintaining and delivering third party content over a network 908.

In at least one embodiment, web hosting providers deliver services to two different types of clients. In at least one embodiment, one type, which may be referred to as a browser, requests content from servers 910, 912, 914 such as web pages, email messages, video clips, etc. In at least one embodiment, a second type, which may be referred to as a user, hires a web hosting provider to maintain a network resource such as a web site, and to make it available to browsers. In at least one embodiment, users contract with a web hosting provider to make memory space, processor capacity, and communication bandwidth available for their desired network resource in accordance with an amount of server resources a user desires to utilize.

In at least one embodiment, in order for a web hosting provider to provide services for both of these clients, application programs which manage a network resources hosted by servers must be properly configured. In at least one embodiment, program configuration process involves defining a set of parameters which control, at least in part, an application program's response to browser requests and which also define, at least in part, a server resources available to a particular user.

In one embodiment, an intranet server 916 is in communication with a network 908 via a communication link. In at least one embodiment, intranet server 916 is in communication with a server manager 918. In at least one embodiment, server manager 918 comprises a database of an application program configuration parameters which are being utilized in servers 910, 912, 914. In at least one embodiment, users modify a database 920 via an intranet 916, and a server manager 918 interacts with servers 910, 912, 914 to modify application program parameters so that they match a content of a database. In at least one embodiment, a user logs onto an intranet server 916 by connecting to an intranet 916 via computer 902 and entering authentication information, such as a username and password.

In at least one embodiment, when a user wishes to sign up for new service or modify an existing service, an intranet server 916 authenticates a user and provides a user with an interactive screen display/control panel that allows a user to access configuration parameters for a particular application program. In at least one embodiment, a user is presented with a number of modifiable text boxes that describe aspects of a configuration of a user's web site or other network resource. In at least one embodiment, if a user desires to increase memory space reserved on a server for its web site, a user is provided with a field in which a user specifies a desired memory space. In at least one embodiment, in response to receiving this information, an intranet server 916 updates a database 920. In at least one embodiment, server manager 918 forwards this information to an appropriate server, and a new parameter is used during application program operation. In at least one embodiment, an intranet server 916 is configured to provide users with access to configuration parameters of hosted network resources (e.g., web pages, email, FTP sites, media sites, etc.), for which a user has contracted with a web hosting service provider.

Figure 10A:
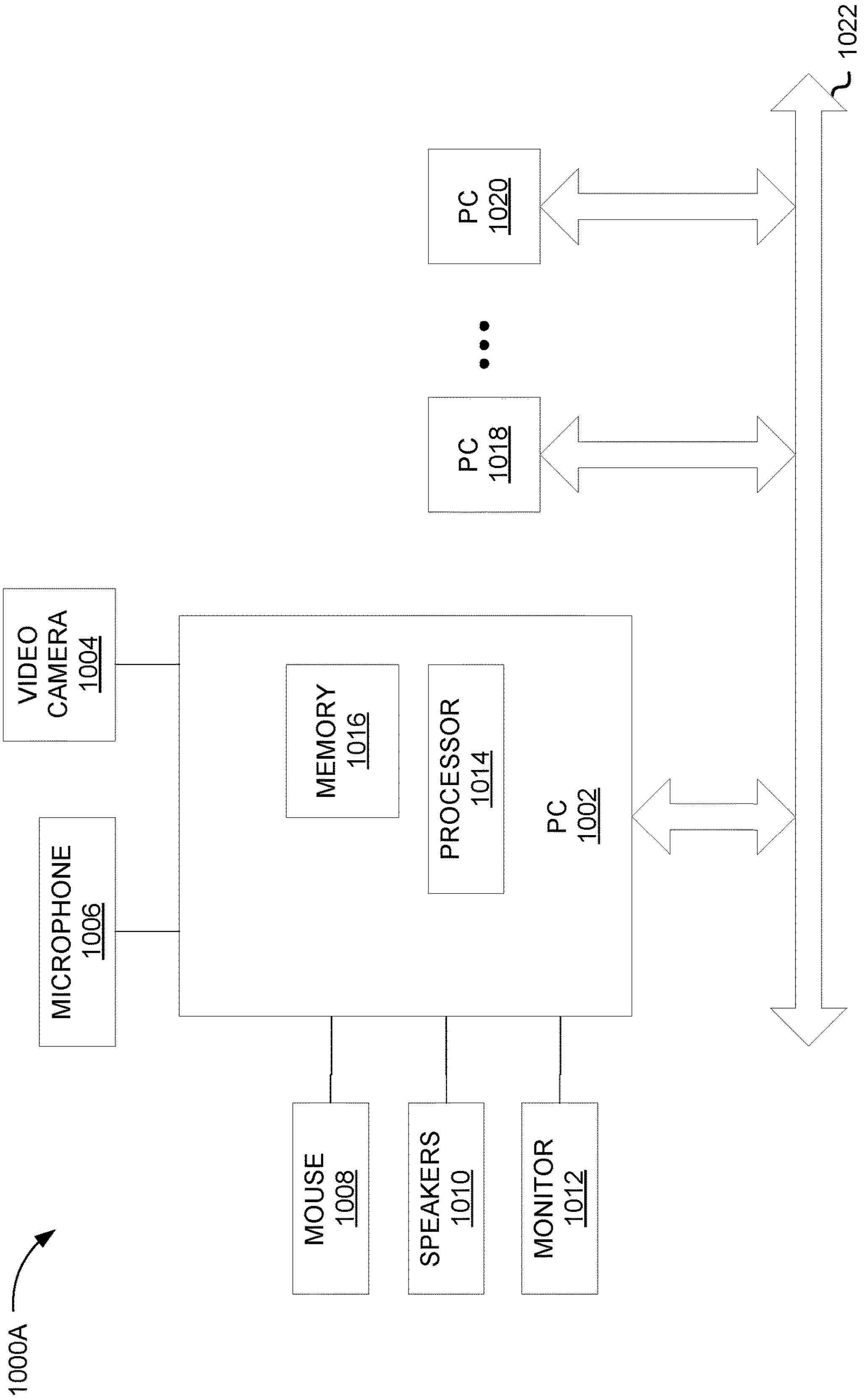
FIG. 10A illustrates a networked computer system, in accordance with at least one embodiment.

FIG. 10A illustrates a networked computer system 1000A, in accordance with at least one embodiment. In at least one embodiment, networked computer system 1000A comprises a plurality of nodes or personal computers ("PCs") 1002, 1018, 1020. In at least one embodiment, personal computer or node 1002 comprises a processor 1014, memory 1016, video camera 1004, microphone 1006, mouse 1008, speakers 1010, and monitor 1012. In at least one embodiment, PCs 1002, 1018, 1020 may each run one or more desktop servers of an internal network within a given company, for instance, or may be servers of a general network not limited to a specific environment. In at least one embodiment, there is one server per PC node of a network, so that each PC node of a network represents a particular network server, having a particular network URL address. In at least one embodiment, each server defaults to a default web page for that server's user, which may itself contain embedded URLs pointing to further subpages of that user on that server, or to other servers or pages on other servers on a network.

In at least one embodiment, nodes 1002, 1018, 1020 and other nodes of a network are interconnected via medium 1022. In at least one embodiment, medium 1022 may be, a communication channel such as an Integrated Services Digital Network ("ISDN"). In at least one embodiment, various nodes of a networked computer system may be connected through a variety of communication media, including local area networks ("LANs"), plain-old telephone lines ("POTS"), sometimes referred to as public switched telephone networks ("PSTN"), and/or variations thereof. In at least one embodiment, various nodes of a network may also constitute computer system users inter-connected via a network such as the Internet. In at least one embodiment, each server on a network (running from a particular node of a network at a given instance) has a unique address or identification within a network, which may be specifiable in terms of an URL.

In at least one embodiment, a plurality of multi-point conferencing units ("MCUs") may thus be utilized to transmit data to and from various nodes or "endpoints" of a conferencing system. In at least one embodiment, nodes and/or MCUs may be interconnected via an ISDN link or through a local area network ("LAN"), in addition to various other communications media such as nodes connected through the Internet. In at least one embodiment, nodes of a conferencing system may, in general, be connected directly to a communications medium such as a LAN or through an MCU, and that a conferencing system may comprise other nodes or elements such as routers, servers, and/or variations thereof.

In at least one embodiment, processor 1014 is a general-purpose programmable processor. In at least one embodiment, processors of nodes of networked computer system 1000A may also be special-purpose video processors. In at least one embodiment, various peripherals and components of a node such as those of node 1002 may vary from those of other nodes. In at least one embodiment, node 1018 and node 1020 may be configured identically to or differently than node 1002. In at least one embodiment, a node may be implemented on any suitable computer system in addition to PC systems.

Figure 10B:
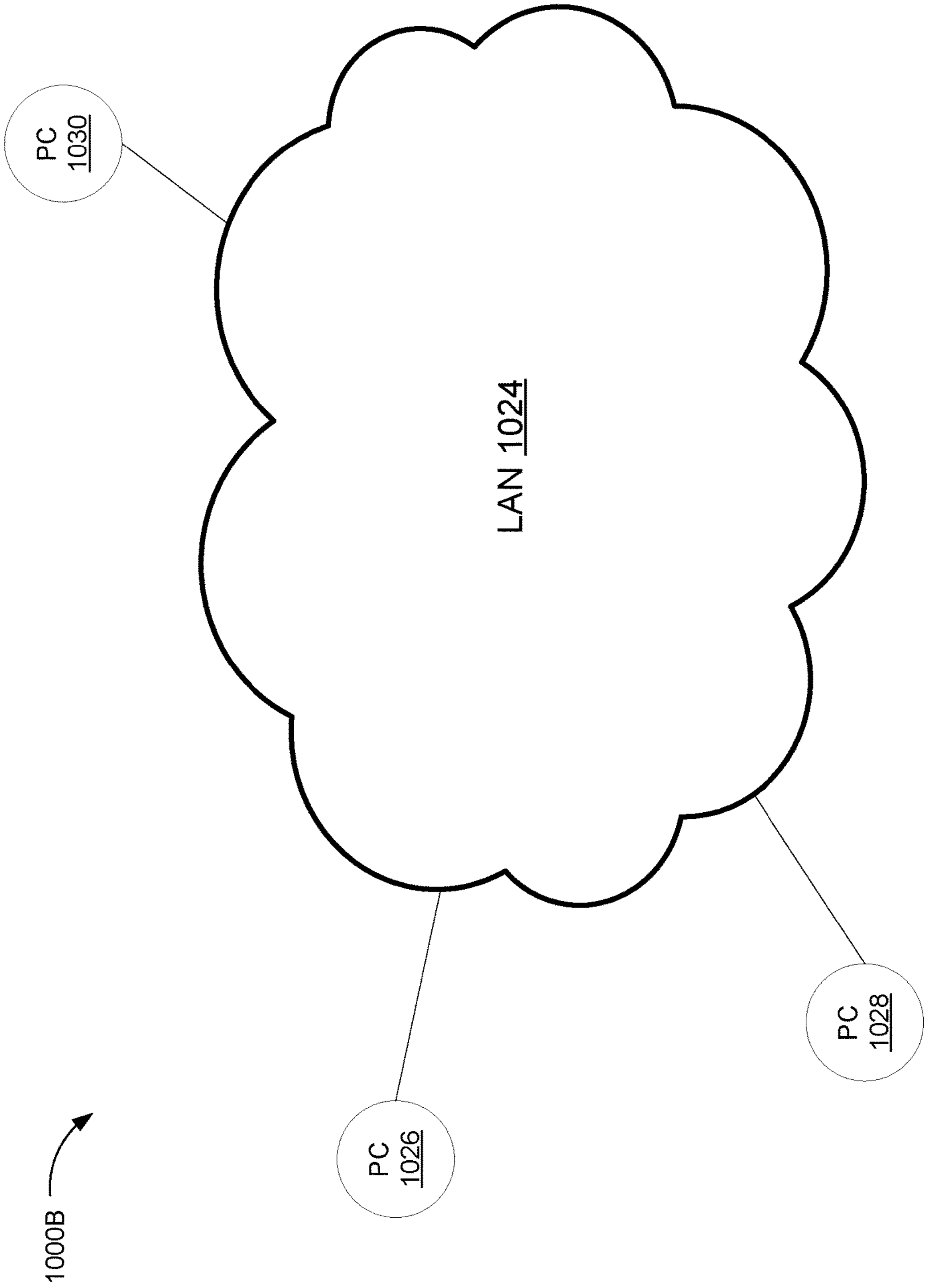
FIG. 10B illustrates a networked computer system, in accordance with at least one embodiment.

FIG. 10B illustrates a networked computer system 1000B, in accordance with at least one embodiment. In at least one embodiment, system 1000B illustrates a network such as LAN 1024, which may be used to interconnect a variety of nodes that may communicate with each other. In at least one embodiment, attached to LAN 1024 are a plurality of nodes such as PC nodes 1026, 1028, 1030. In at least one embodiment, a node may also be connected to the LAN via a network server or other means. In at least one embodiment, system 1000B comprises other types of nodes or elements, for example including routers, servers, and nodes.

Figure 10C:
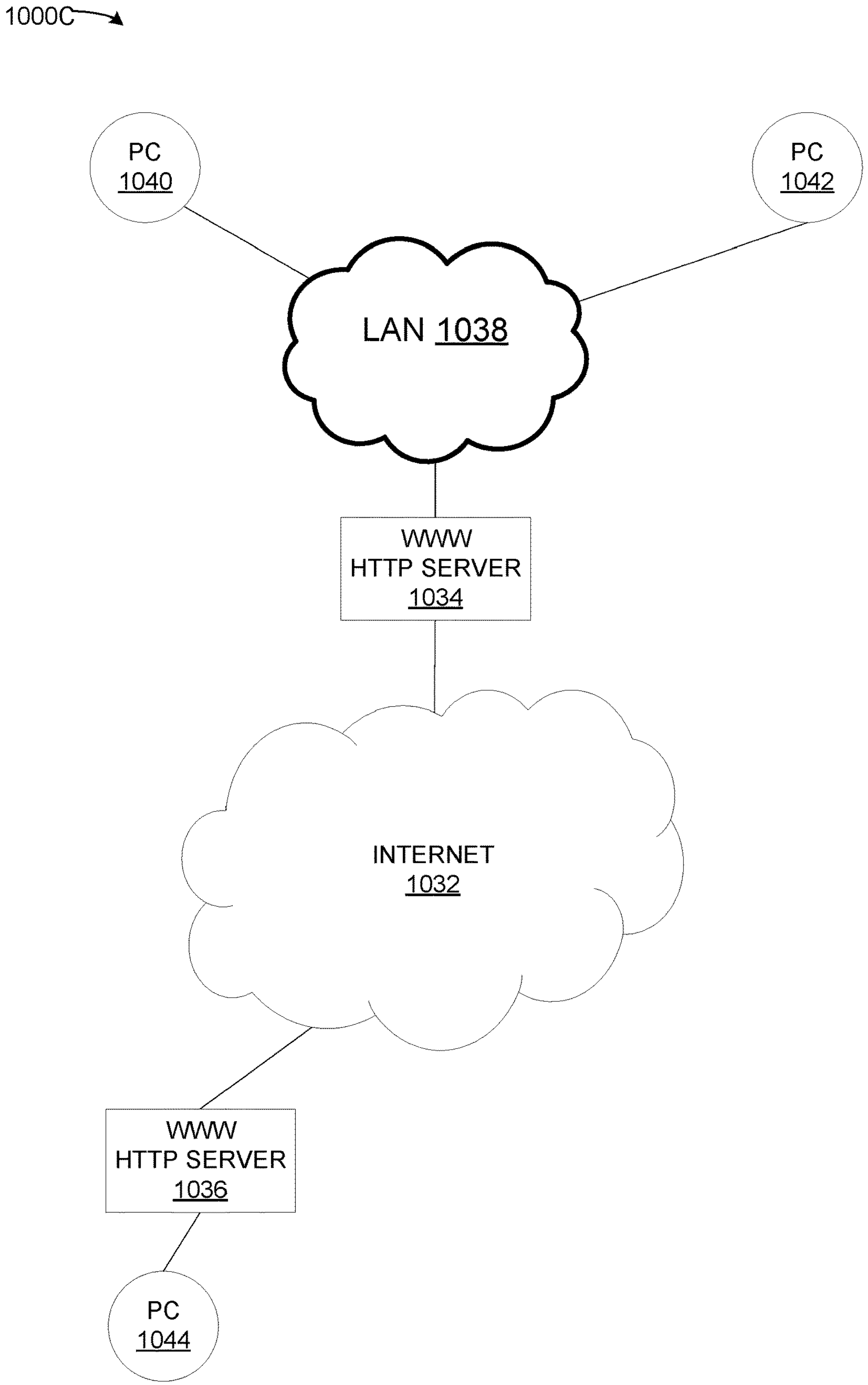
FIG. 10C illustrates a networked computer system, in accordance with at least one embodiment.

FIG. 10C illustrates a networked computer system 1000C, in accordance with at least one embodiment. In at least one embodiment, system 1000C illustrates a WWW system having communications across a backbone communications network such as Internet 1032, which may be used to interconnect a variety of nodes of a network. In at least one embodiment, WWW is a set of protocols operating on top of the Internet, and allows a graphical interface system to operate thereon for accessing information through the Internet. In at least one embodiment, attached to Internet 1032 in WWW are a plurality of nodes such as PCs 1040, 1042, 1044. In at least one embodiment, a node is interfaced to other nodes of WWW through a WWW HTTP server such as servers 1034, 1036. In at least one embodiment, PC 1044 may be a PC forming a node of network 1032 and itself running its server 1036, although PC 1044 and server 1036 are illustrated separately in FIG. 10C for illustrative purposes.

In at least one embodiment, WWW is a distributed type of application, characterized by WWW HTTP, WWW's protocol, which runs on top of the Internet's transmission control protocol/Internet protocol ("TCP/IP"). In at least one embodiment, WWW may thus be characterized by a set of protocols (i.e., HTTP) running on the Internet as its "backbone."

In at least one embodiment, a web browser is an application running on a node of a network that, in WWW-compatible type network systems, allows users of a particular server or node to view such information and thus allows a user to search graphical and text-based files that are linked together using hypertext links that are embedded in documents or files available from servers on a network that understand HTTP. In at least one embodiment, when a given web page of a first server associated with a first node is retrieved by a user using another server on a network such as the Internet, a document retrieved may have various hypertext links embedded therein and a local copy of a page is created local to a retrieving user. In at least one embodiment, when a user clicks on a hypertext link, locally-stored information related to a selected hypertext link is typically sufficient to allow a user's machine to open a connection across the Internet to a server indicated by a hypertext link.

In at least one embodiment, more than one user may be coupled to each HTTP server, for example through a LAN such as LAN 1038 as illustrated with respect to WWW HTTP server 1034. In at least one embodiment, system 1000C may also comprise other types of nodes or elements. In at least one embodiment, a WWW HTTP server is an application running on a machine, such as a PC. In at least one embodiment, each user may be considered to have a unique "server," as illustrated with respect to PC 1044. In at least one embodiment, a server may be considered to be a server such as WWW HTTP server 1034, which provides access to a network for a LAN or plurality of nodes or plurality of LANs. In at least one embodiment, there are a plurality of users, each having a desktop PC or node of a network, each desktop PC potentially establishing a server for a user thereof. In at least one embodiment, each server is associated with a particular network address or URL, which, when accessed, provides a default web page for that user. In at least one embodiment, a web page may contain further links (embedded URLs) pointing to further subpages of that user on that server, or to other servers on a network or to pages on other servers on a network.

Cloud Computing and Services

The following figures set forth, without limitation, exemplary cloud-based systems that can be used to implement at least one embodiment.

In at least one embodiment, cloud computing is a style of computing in which dynamically scalable and often virtualized resources are provided as a service over the Internet. In at least one embodiment, users need not have knowledge of, expertise in, or control over technology infrastructure, which can be referred to as "in the cloud," that supports them. In at least one embodiment, cloud computing incorporates infrastructure as a service, platform as a service, software as a service, and other variations that have a common theme of reliance on the Internet for satisfying computing needs of users. In at least one embodiment, a typical cloud deployment, such as in a private cloud (e.g., enterprise network), or a data center (DC) in a public cloud (e.g., Internet) can consist of thousands of servers (or alternatively, VMs), hundreds of Ethernet, Fiber Channel or Fiber Channel over Ethernet (FCoE) ports, switching and storage infrastructure, etc. In at least one embodiment, cloud can also consist of network services infrastructure like IPsec VPN hubs, firewalls, load balancers, wide area network (WAN) optimizers etc. In at least one embodiment, remote subscribers can access cloud applications and services securely by connecting via a VPN tunnel, such as an IPsec VPN tunnel.

In at least one embodiment, cloud computing is a model for enabling convenient, on-demand network access to a shared pool of configurable computing resources (e.g., networks, servers, storage, applications, and services) that can be rapidly provisioned and released with minimal management effort or service provider interaction.

In at least one embodiment, cloud computing is characterized by on-demand self-service, in which a consumer can unilaterally provision computing capabilities, such as server time and network storage, as needed automatically without requiring human inter-action with each service's provider. In at least one embodiment, cloud computing is characterized by broad network access, in which capabilities are available over a network and accessed through standard mechanisms that promote use by heterogeneous thin or thick client platforms (e.g., mobile phones, laptops, and PDAs). In at least one embodiment, cloud computing is characterized by resource pooling, in which a provider's computing resources are pooled to serve multiple consumers using a multi-tenant model, with different physical and virtual resources dynamically as-signed and reassigned according to consumer demand. In at least one embodiment, there is a sense of location independence in that a customer generally has no control or knowledge over an exact location of provided resources, but may be able to specify location at a higher level of abstraction (e.g., country, state, or datacenter). In at least one embodiment, examples of resources include storage, processing, memory, network bandwidth, and virtual machines. In at least one embodiment, cloud computing is characterized by rapid elasticity, in which capabilities can be rapidly and elastically provisioned, in some cases automatically, to quickly scale out and rapidly released to quickly scale in. In at least one embodiment, to a consumer, capabilities available for provisioning often appear to be unlimited and can be purchased in any quantity at any time. In at least one embodiment, cloud computing is characterized by measured service, in which cloud systems automatically control and optimize resource use by leveraging a metering capability at some level of abstraction appropriate to a type of service (e.g., storage, processing, bandwidth, and active user accounts). In at least one embodiment, resource usage can be monitored, controlled, and reported providing transparency for both a provider and consumer of a utilized service.

In at least one embodiment, cloud computing may be associated with various services. In at least one embodiment, cloud Software as a Service (SaaS) may refer to as service in which a capability provided to a consumer is to use a provider's applications running on a cloud infrastructure. In at least one embodiment, applications are accessible from various client devices through a thin client interface such as a web browser (e.g., web-based email). In at least one embodiment, consumer does not manage or control underlying cloud infrastructure including network, servers, operating systems, storage, or even individual application capabilities, with a possible exception of limited user-specific application configuration settings.

In at least one embodiment, cloud Platform as a Service (PaaS) may refer to a service in which a capability provided to a consumer is to deploy onto cloud infrastructure consumer-created or acquired applications created using programming languages and tools supported by a provider. In at least one embodiment, consumer does not manage or control underlying cloud infrastructure including networks, servers, operating systems, or storage, but has control over deployed applications and possibly application hosting environment configurations.

In at least one embodiment, cloud Infrastructure as a Service (IaaS) may refer to a service in which a capability provided to a consumer is to provision processing, storage, networks, and other fundamental computing resources where a consumer is able to deploy and run arbitrary software, which can include operating systems and applications. In at least one embodiment, consumer does not manage or control underlying cloud infrastructure, but has control over operating systems, storage, deployed applications, and possibly limited control of select networking components (e.g., host firewalls).

In at least one embodiment, cloud computing may be deployed in various ways. In at least one embodiment, a private cloud may refer to a cloud infrastructure that is operated solely for an organization. In at least one embodiment, a private cloud may be managed by an organization or a third party and may exist on-premises or off-premises. In at least one embodiment, a community cloud may refer to a cloud infrastructure that is shared by several organizations and supports a specific community that has shared concerns (e.g., mission, security requirements, policy, and compliance considerations). In at least one embodiment, a community cloud may be managed by organizations or a third party and may exist on-premises or off-premises. In at least one embodiment, a public cloud may refer to a cloud infrastructure that is made available to a general public or a large industry group and is owned by an organization providing cloud services. In at least one embodiment, a hybrid cloud may refer to a cloud infrastructure is a composition of two or more clouds (private, community, or public) that remain unique entities, but are bound together by standardized or proprietary technology that enables data and application portability (e.g., cloud bursting for load-balancing between clouds). In at least one embodiment, a cloud computing environment is service oriented with a focus on statelessness, low coupling, modularity, and semantic interoperability.

Figure 11:
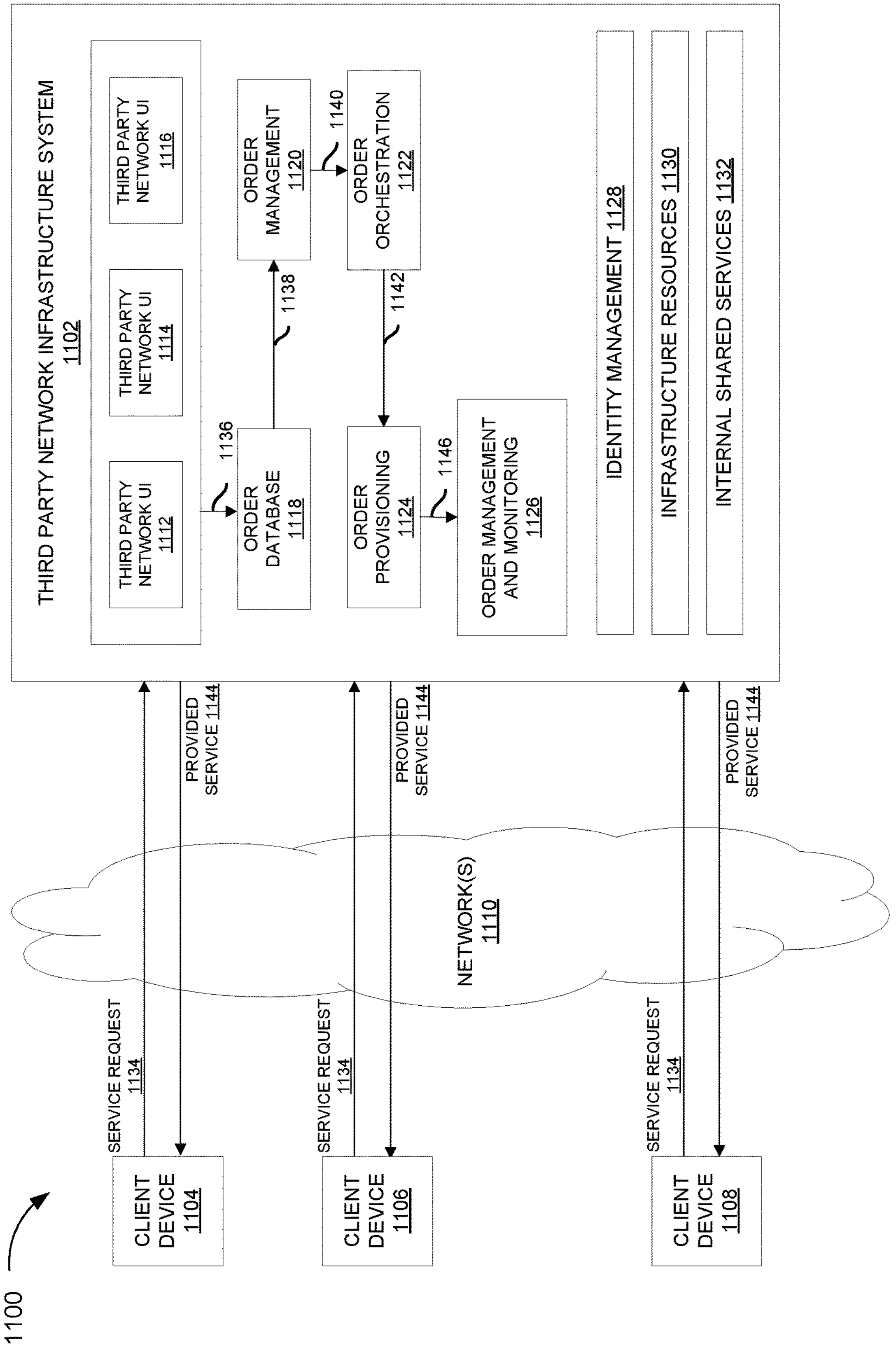
FIG. 11 illustrates one or more components of a system environment in which services may be offered as third party network services, in accordance with at least one embodiment.

FIG. 11 illustrates one or more components of a system environment 1100 in which services may be offered as third party network services, in accordance with at least one embodiment. In at least one embodiment, a third party network may be referred to as a cloud, cloud network, cloud computing network, and/or variations thereof. In at least one embodiment, system environment 1100 includes one or more client computing devices 1104, 1106, and 1108 that may be used by users to interact with a third party network infrastructure system 1102 that provides third party network services, which may be referred to as cloud computing services. In at least one embodiment, third party network infrastructure system 1102 may comprise one or more computers and/or servers.

It should be appreciated that third party network infrastructure system 1102 depicted in FIG. 11 may have other components than those depicted. Further, FIG. 11 depicts an embodiment of a third party network infrastructure system. In at least one embodiment, third party network infrastructure system 1102 may have more or fewer components than depicted in FIG. 11, may combine two or more components, or may have a different configuration or arrangement of components.

In at least one embodiment, client computing devices 1104, 1106, and 1108 may be configured to operate a client application such as a web browser, a proprietary client application, or some other application, which may be used by a user of a client computing device to interact with third party network infrastructure system 1102 to use services provided by third party network infrastructure system 1102. Although exemplary system environment 1100 is shown with three client computing devices, any number of client computing devices may be supported. In at least one embodiment, other devices such as devices with sensors, etc. may interact with third party network infrastructure system 1102. In at least one embodiment, network(s) 1110 may facilitate communications and exchange of data between client computing devices 1104, 1106, and 1108 and third party network infrastructure system 1102.

In at least one embodiment, services provided by third party network infrastructure system 1102 may include a host of services that are made available to users of a third party network infrastructure system on demand. In at least one embodiment, various services may also be offered including without limitation online data storage and backup solutions, Web-based e-mail services, hosted office suites and document collaboration services, database management and processing, managed technical support services, and/or variations thereof. In at least one embodiment, services provided by a third party network infrastructure system can dynamically scale to meet needs of its users.

In at least one embodiment, a specific instantiation of a service provided by third party network infrastructure system 1102 may be referred to as a "service instance." In at least one embodiment, in general, any service made available to a user via a communication network, such as the Internet, from a third party network service provider's system is referred to as a "third party network service." In at least one embodiment, in a public third party network environment, servers and systems that make up a third party network service provider's system are different from a customer's own on-premises servers and systems. In at least one embodiment, a third party network service provider's system may host an application, and a user may, via a communication network such as the Internet, on demand, order and use an application.

In at least one embodiment, a service in a computer network third party network infrastructure may include protected computer network access to storage, a hosted database, a hosted web server, a software application, or other service provided by a third party network vendor to a user. In at least one embodiment, a service can include password-protected access to remote storage on a third party network through the Internet. In at least one embodiment, a service can include a web service-based hosted relational database and a script-language middleware engine for private use by a networked developer. In at least one embodiment, a service can include access to an email software application hosted on a third party network vendor's web site.

In at least one embodiment, third party network infrastructure system 1102 may include a suite of applications, middleware, and database service offerings that are delivered to a customer in a self-service, subscription-based, elastically scalable, reliable, highly available, and secure manner. In at least one embodiment, third party network infrastructure system 1102 may also provide "big data" related computation and analysis services. In at least one embodiment, term "big data" is generally used to refer to extremely large data sets that can be stored and manipulated by analysts and researchers to visualize large amounts of data, detect trends, and/or otherwise interact with data. In at least one embodiment, big data and related applications can be hosted and/or manipulated by an infrastructure system on many levels and at different scales. In at least one embodiment, tens, hundreds, or thousands of processors linked in parallel can act upon such data in order to present it or simulate external forces on data or what it represents. In at least one embodiment, these data sets can involve structured data, such as that organized in a database or otherwise according to a structured model, and/or unstructured data (e.g., emails, images, data blobs (binary large objects), web pages, complex event processing). In at least one embodiment, by leveraging an ability of an embodiment to relatively quickly focus more (or fewer) computing resources upon an objective, a third party network infrastructure system may be better available to carry out tasks on large data sets based on demand from a business, government agency, research organization, private individual, group of like-minded individuals or organizations, or other entity.

In at least one embodiment, third party network infrastructure system 1102 may be adapted to automatically provision, manage and track a customer's subscription to services offered by third party network infrastructure system 1102. In at least one embodiment, third party network infrastructure system 1102 may provide third party network services via different deployment models. In at least one embodiment, services may be provided under a public third party network model in which third party network infrastructure system 1102 is owned by an organization selling third party network services and services are made available to a general public or different industry enterprises. In at least one embodiment, services may be provided under a private third party network model in which third party network infrastructure system 1102 is operated solely for a single organization and may provide services for one or more entities within an organization. In at least one embodiment, third party network services may also be provided under a community third party network model in which third party network infrastructure system 1102 and services provided by third party network infrastructure system 1102 are shared by several organizations in a related community. In at least one embodiment, third party network services may also be provided under a hybrid third party network model, which is a combination of two or more different models.

In at least one embodiment, services provided by third party network infrastructure system 1102 may include one or more services provided under Software as a Service (SaaS) category, Platform as a Service (PaaS) category, Infrastructure as a Service (IaaS) category, or other categories of services including hybrid services. In at least one embodiment, a customer, via a subscription order, may order one or more services provided by third party network infrastructure system 1102. In at least one embodiment, third party network infrastructure system 1102 then performs processing to provide services in a customer's subscription order.

In at least one embodiment, services provided by third party network infrastructure system 1102 may include, without limitation, application services, platform services and infrastructure services. In at least one embodiment, application services may be provided by a third party network infrastructure system via a SaaS platform. In at least one embodiment, SaaS platform may be configured to provide third party network services that fall under a SaaS category. In at least one embodiment, SaaS platform may provide capabilities to build and deliver a suite of on-demand applications on an integrated development and deployment platform. In at least one embodiment, SaaS platform may manage and control underlying software and infrastructure for providing SaaS services. In at least one embodiment, by utilizing services provided by a SaaS platform, customers can utilize applications executing on a third party network infrastructure system. In at least one embodiment, customers can acquire an application services without a need for customers to purchase separate licenses and support. In at least one embodiment, various different SaaS services may be provided. In at least one embodiment, examples include, without limitation, services that provide solutions for sales performance management, enterprise integration, and business flexibility for large organizations.

In at least one embodiment, platform services may be provided by third party network infrastructure system 1102 via a PaaS platform. In at least one embodiment, PaaS platform may be configured to provide third party network services that fall under a PaaS category. In at least one embodiment, examples of platform services may include without limitation services that enable organizations to consolidate existing applications on a shared, common architecture, as well as an ability to build new applications that leverage shared services provided by a platform. In at least one embodiment, PaaS platform may manage and control underlying software and infrastructure for providing PaaS services. In at least one embodiment, customers can acquire PaaS services provided by third party network infrastructure system 1102 without a need for customers to purchase separate licenses and support.

In at least one embodiment, by utilizing services provided by a PaaS platform, customers can employ programming languages and tools supported by a third party network infrastructure system and also control deployed services. In at least one embodiment, platform services provided by a third party network infrastructure system may include database third party network services, middleware third party network services and third party network services. In at least one embodiment, database third party network services may support shared service deployment models that enable organizations to pool database resources and offer customers a Database as a Service in a form of a database third party network. In at least one embodiment, middleware third party network services may provide a platform for customers to develop and deploy various business applications, and third party network services may provide a platform for customers to deploy applications, in a third party network infrastructure system.

In at least one embodiment, various different infrastructure services may be provided by an IaaS platform in a third party network infrastructure system. In at least one embodiment, infrastructure services facilitate management and control of underlying computing resources, such as storage, networks, and other fundamental computing resources for customers utilizing services provided by a SaaS platform and a PaaS platform.

In at least one embodiment, third party network infrastructure system 1102 may also include infrastructure resources 1130 for providing resources used to provide various services to customers of a third party network infrastructure system. In at least one embodiment, infrastructure resources 1130 may include pre-integrated and optimized combinations of hardware, such as servers, storage, and networking resources to execute services provided by a Paas platform and a Saas platform, and other resources.

In at least one embodiment, resources in third party network infrastructure system 1102 may be shared by multiple users and dynamically re-allocated per demand. In at least one embodiment, resources may be allocated to users in different time zones. In at least one embodiment, third party network infrastructure system 1102 may enable a first set of users in a first time zone to utilize resources of a third party network infrastructure system for a specified number of hours and then enable a re-allocation of same resources to another set of users located in a different time zone, thereby maximizing utilization of resources.

In at least one embodiment, a number of internal shared services 1132 may be provided that are shared by different components or modules of third party network infrastructure system 1102 to enable provision of services by third party network infrastructure system 1102. In at least one embodiment, these internal shared services may include, without limitation, a security and identity service, an integration service, an enterprise repository service, an enterprise manager service, a virus scanning and white list service, a high availability, backup and recovery service, service for enabling third party network support, an email service, a notification service, a file transfer service, and/or variations thereof.

In at least one embodiment, third party network infrastructure system 1102 may provide comprehensive management of third party network services (e.g., SaaS, PaaS, and IaaS services) in a third party network infrastructure system. In at least one embodiment, third party network management functionality may include capabilities for provisioning, managing and tracking a customer's subscription received by third party network infrastructure system 1102, and/or variations thereof.

In at least one embodiment, as depicted in FIG. 11, third party network management functionality may be provided by one or more modules, such as an order management module 1120, an order orchestration module 1122, an order provisioning module 1124, an order management and monitoring module 1126, and an identity management module 1128. In at least one embodiment, these modules may include or be provided using one or more computers and/or servers, which may be general purpose computers, specialized server computers, server farms, server clusters, or any other appropriate arrangement and/or combination.

In at least one embodiment, at step 1134, a customer using a client device, such as client computing devices 1104, 1106 or 1108, may interact with third party network infrastructure system 1102 by requesting one or more services provided by third party network infrastructure system 1102 and placing an order for a subscription for one or more services offered by third party network infrastructure system 1102. In at least one embodiment, a customer may access a third party network User Interface (UI) such as third party network UI 1112, third party network UI 1114 and/or third party network UI 1116 and place a subscription order via these UIs. In at least one embodiment, order information received by third party network infrastructure system 1102 in response to a customer placing an order may include information identifying a customer and one or more services offered by a third party network infrastructure system 1102 that a customer intends to subscribe to.

In at least one embodiment, at step 1136, an order information received from a customer may be stored in an order database 1118. In at least one embodiment, if this is a new order, a new record may be created for an order. In at least one embodiment, order database 1118 can be one of several databases operated by third party network infrastructure system 1118 and operated in conjunction with other system elements.

In at least one embodiment, at step 1138, an order information may be forwarded to an order management module 1120 that may be configured to perform billing and accounting functions related to an order, such as verifying an order, and upon verification, booking an order.

In at least one embodiment, at step 1140, information regarding an order may be communicated to an order orchestration module 1122 that is configured to orchestrate provisioning of services and resources for an order placed by a customer. In at least one embodiment, order orchestration module 1122 may use services of order provisioning module 1124 for provisioning. In at least one embodiment, order orchestration module 1122 enables management of business processes associated with each order and applies business logic to determine whether an order should proceed to provisioning.

In at least one embodiment, at step 1142, upon receiving an order for a new subscription, order orchestration module 1122 sends a request to order provisioning module 1124 to allocate resources and configure resources needed to fulfill a subscription order. In at least one embodiment, order provisioning module 1124 enables an allocation of resources for services ordered by a customer. In at least one embodiment, order provisioning module 1124 provides a level of abstraction between third party network services provided by third party network infrastructure system 1100 and a physical implementation layer that is used to provision resources for providing requested services. In at least one embodiment, this enables order orchestration module 1122 to be isolated from implementation details, such as whether or not services and resources are actually provisioned in real-time or pre-provisioned and only allocated/assigned upon request.

In at least one embodiment, at step 1144, once services and resources are provisioned, a notification may be sent to subscribing customers indicating that a requested service is now ready for use. In at least one embodiment, information (e.g., a link) may be sent to a customer that enables a customer to start using requested services.

In at least one embodiment, at step 1146, a customer's subscription order may be managed and tracked by an order management and monitoring module 1126. In at least one embodiment, order management and monitoring module 1126 may be configured to collect usage statistics regarding a customer use of subscribed services. In at least one embodiment, statistics may be collected for an amount of storage used, an amount data transferred, a number of users, and an amount of system up time and system down time, and/or variations thereof.

In at least one embodiment, third party network infrastructure system 1100 may include an identity management module 1128 that is configured to provide identity services, such as access management and authorization services in third party network infrastructure system 1100. In at least one embodiment, identity management module 1128 may control information about customers who wish to utilize services provided by third party network infrastructure system 1102. In at least one embodiment, such information can include information that authenticates identities of such customers and information that describes which actions those customers are authorized to perform relative to various system resources (e.g., files, directories, applications, communication ports, memory segments, etc.). In at least one embodiment, identity management module 1128 may also include management of descriptive information about each customer and about how and by whom that descriptive information can be accessed and modified.

Figure 12:
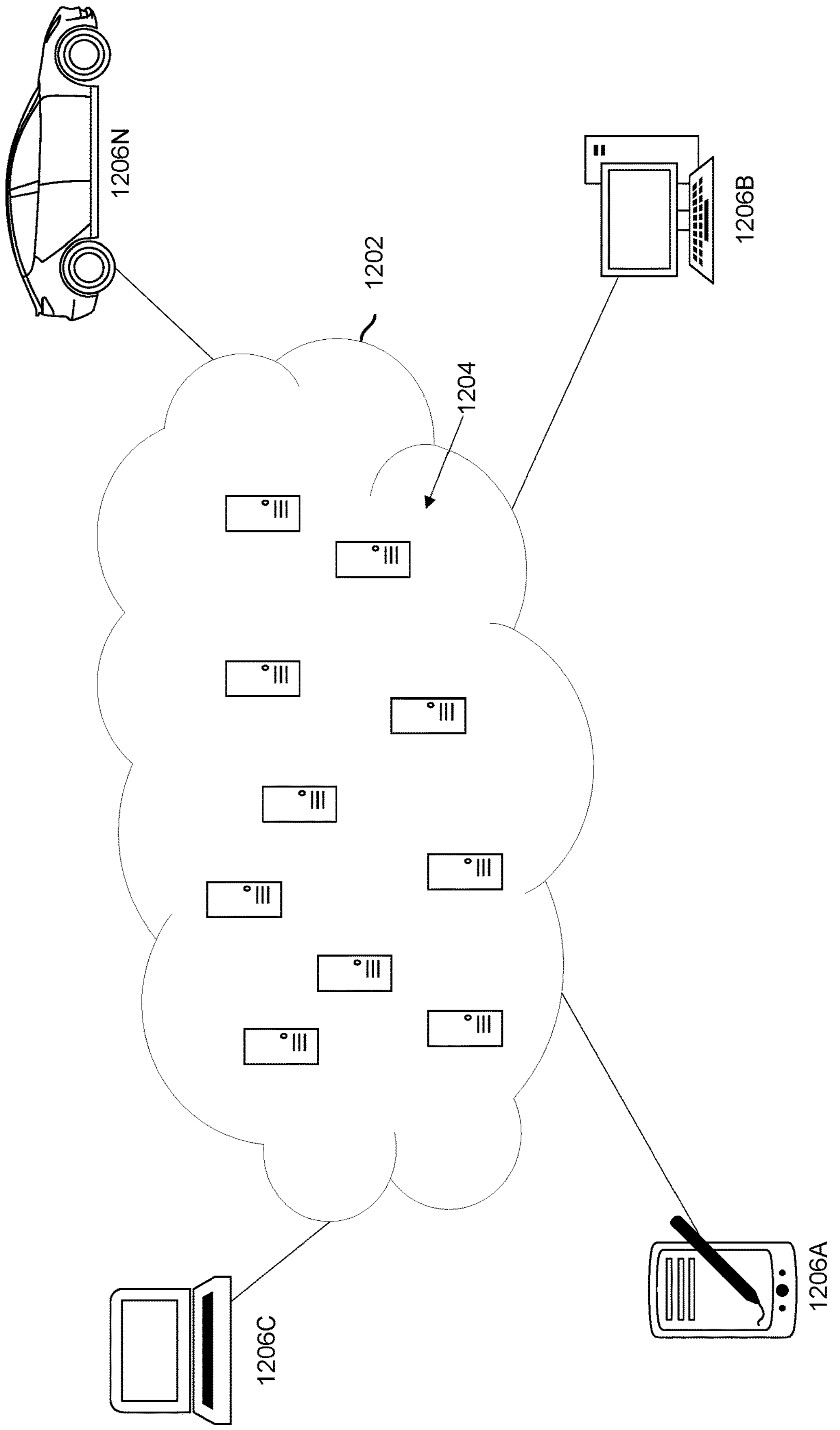
FIG. 12 illustrates a cloud computing environment, in accordance with at least one embodiment.

FIG. 12 illustrates a cloud computing environment 1202, in accordance with at least one embodiment. In at least one embodiment, cloud computing environment 1202 comprises one or more computer system/servers 1204 with which computing devices such as, personal digital assistant (PDA) or cellular telephone 1206A, desktop computer 1206B, laptop computer 1206C, and/or automobile computer system 1206N communicate. In at least one embodiment, this allows for infrastructure, platforms and/or software to be offered as services from cloud computing environment 1202, so as to not require each client to separately maintain such resources. It is understood that types of computing devices 1206A-N shown in FIG. 12 are intended to be illustrative only and that cloud computing environment 1202 can communicate with any type of computerized device over any type of network and/or network/addressable connection (e.g., using a web browser).

In at least one embodiment, a computer system/server 1204, which can be denoted as a cloud computing node, is operational with numerous other general purpose or special purpose computing system environments or configurations. In at least one embodiment, examples of computing systems, environments, and/or configurations that may be suitable for use with computer system/server 1204 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and/or variations thereof.

In at least one embodiment, computer system/server 1204 may be described in a general context of computer system-executable instructions, such as program modules, being executed by a computer system. In at least one embodiment, program modules include routines, programs, objects, components, logic, data structures, and so on, that perform particular tasks or implement particular abstract data types.

In at least one embodiment, exemplary computer system/server 1204 may be practiced in distributed loud computing environments where tasks are performed by remote processing devices that are linked through a communications network. In at least one embodiment, in a distributed cloud computing environment, program modules may be located in both local and remote computer system storage media including memory storage devices.

Figure 13:
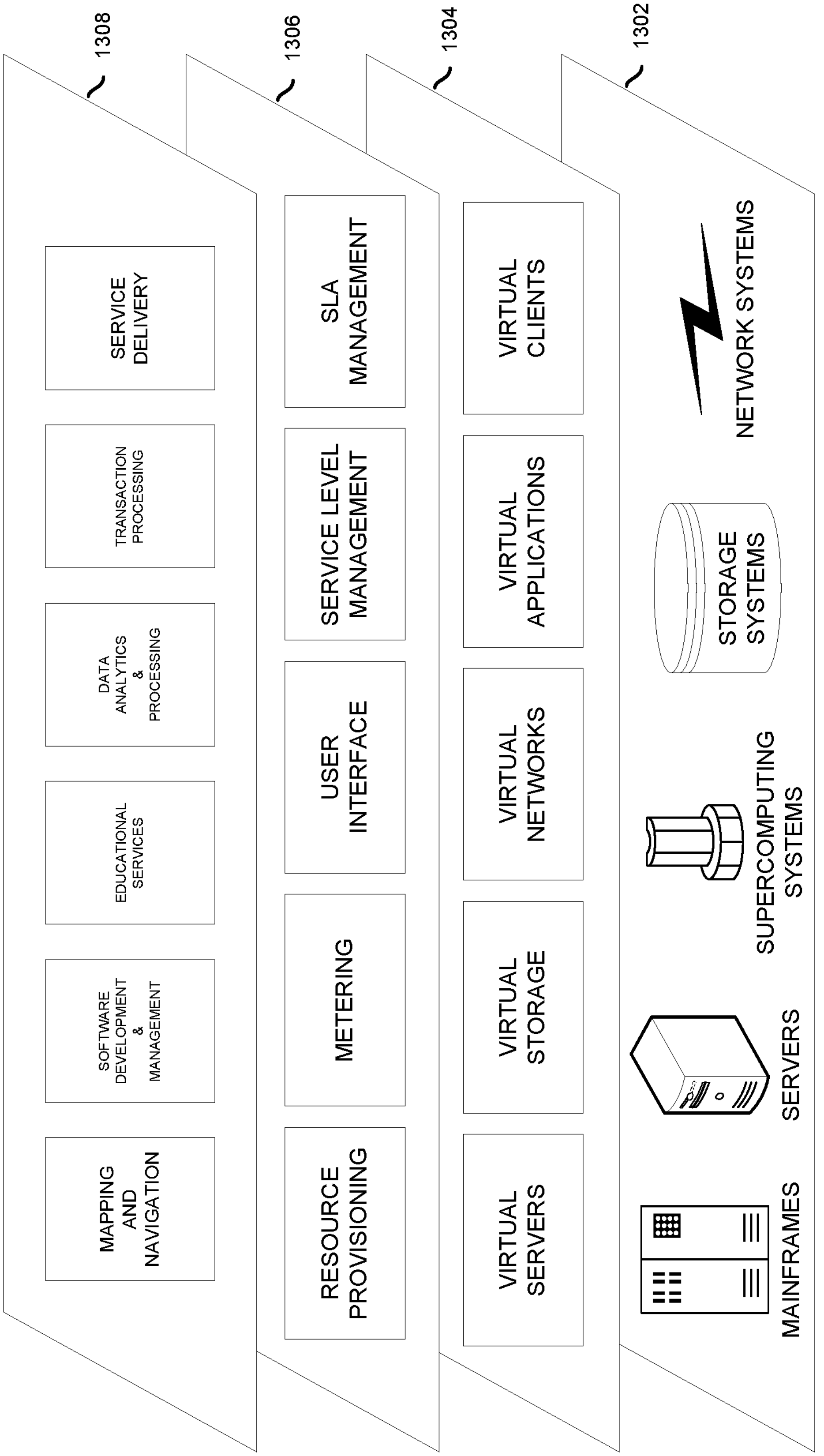
FIG. 13 illustrates a set of functional abstraction layers provided by a cloud computing environment, in accordance with at least one embodiment.

FIG. 13 illustrates a set of functional abstraction layers provided by cloud computing environment 1202 (FIG. 12), in accordance with at least one embodiment. It should be understood in advance that components, layers, and functions shown in FIG. 13 are intended to be illustrative only, and components, layers, and functions may vary.

In at least one embodiment, hardware and software layer 1302 includes hardware and software components. In at least one embodiment, examples of hardware components include mainframes, various RISC (Reduced Instruction Set Computer) architecture based servers, various computing systems, supercomputing systems, storage devices, networks, networking components, and/or variations thereof. In at least one embodiment, examples of software components include network application server software, various application server software, various database software, and/or variations thereof.

In at least one embodiment, virtualization layer 1304 provides an abstraction layer from which following exemplary virtual entities may be provided: virtual servers, virtual storage, virtual networks, including virtual private networks, virtual applications, virtual clients, and/or variations thereof.

In at least one embodiment, management layer 1306 provides various functions. In at least one embodiment, resource provisioning provides dynamic procurement of computing resources and other resources that are utilized to perform tasks within a cloud computing environment. In at least one embodiment, metering provides usage tracking as resources are utilized within a cloud computing environment, and billing or invoicing for consumption of these resources. In at least one embodiment, resources may comprise application software licenses. In at least one embodiment, security provides identity verification for users and tasks, as well as protection for data and other resources. In at least one embodiment, user interface provides access to a cloud computing environment for both users and system administrators. In at least one embodiment, service level management provides cloud computing resource allocation and management such that required service levels are met. In at least one embodiment, Service Level Agreement (SLA) management provides pre-arrangement for, and procurement of, cloud computing resources for which a future requirement is anticipated in accordance with an SLA.

In at least one embodiment, workloads layer 1308 provides functionality for which a cloud computing environment is utilized. In at least one embodiment, examples of workloads and functions which may be provided from this layer include: mapping and navigation, software development and management, educational services, data analytics and processing, transaction processing, and service delivery.

Supercomputing

The following figures set forth, without limitation, exemplary supercomputer-based systems that can be used to implement at least one embodiment.

In at least one embodiment, a supercomputer may refer to a hardware system exhibiting substantial parallelism and comprising at least one chip, where chips in a system are interconnected by a network and are placed in hierarchically organized enclosures. In at least one embodiment, a large hardware system filling a machine room, with several racks, each containing several boards/rack modules, each containing several chips, all interconnected by a scalable network, is one particular example of a supercomputer. In at least one embodiment, a single rack of such a large hardware system is another example of a supercomputer. In at least one embodiment, a single chip exhibiting substantial parallelism and containing several hardware components can equally be considered to be a supercomputer, since as feature sizes may decrease, an amount of hardware that can be incorporated in a single chip may also increase.

Figure 14:
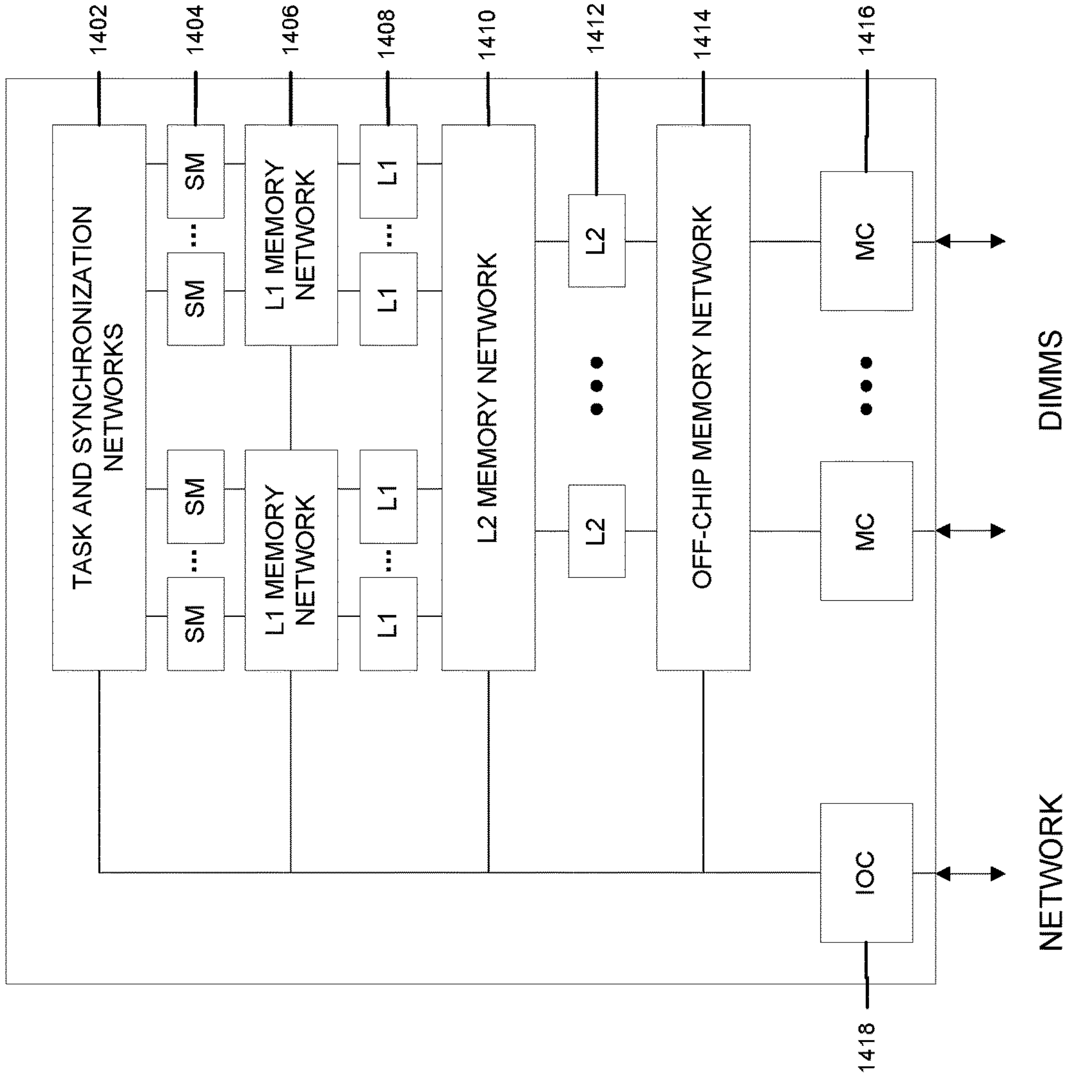
FIG. 14 illustrates a supercomputer at a chip level, in accordance with at least one embodiment.

FIG. 14 illustrates a supercomputer at a chip level, in accordance with at least one embodiment. In at least one embodiment, inside an FPGA or ASIC chip, main computation is performed within finite state machines (1404) called thread units. In at least one embodiment, task and synchronization networks (1402) connect finite state machines and are used to dispatch threads and execute operations in correct order. In at least one embodiment, a multi-level partitioned on-chip cache hierarchy (1408, 1412) is accessed using memory networks (1406, 1410). In at least one embodiment, off-chip memory is accessed using memory controllers (1416) and an off-chip memory network (1414). In at least one embodiment, I/O controller (1418) is used for cross-chip communication when a design does not fit in a single logic chip.

Figure 15:
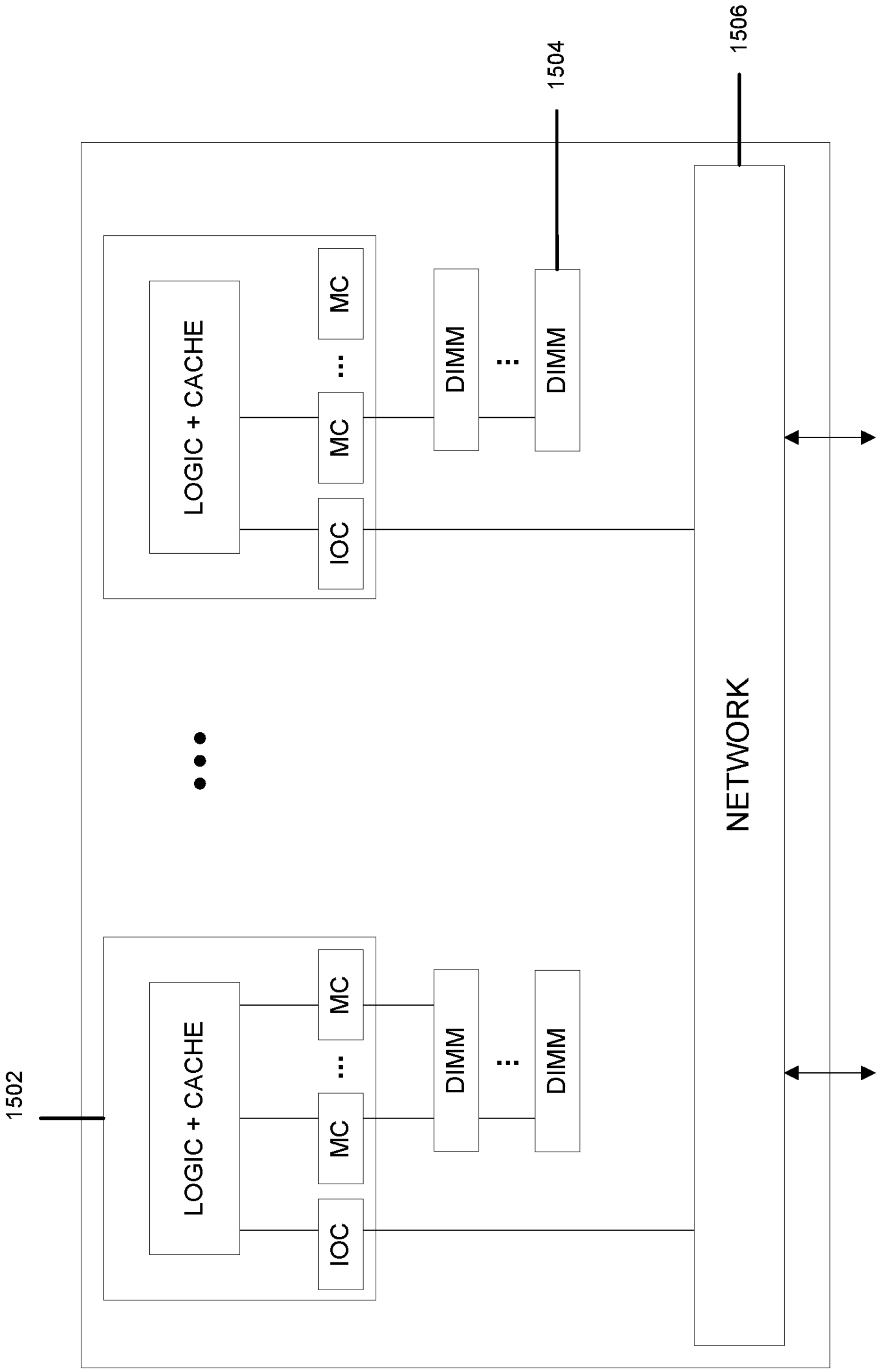
FIG. 15 illustrates a supercomputer at a rack module level, in accordance with at least one embodiment.

FIG. 15 illustrates a supercomputer at a rock module level, in accordance with at least one embodiment. In at least one embodiment, within a rack module, there are multiple FPGA or ASIC chips (1502) that are connected to one or more DRAM units (1504) which constitute main accelerator memory. In at least one embodiment, each FPGA/ASIC chip is connected to its neighbor FPGA/ASIC chip using wide busses on a board, with differential high speed signaling (1506). In at least one embodiment, each FPGA/ASIC chip is also connected to at least one high-speed serial communication cable.

Figure 16:
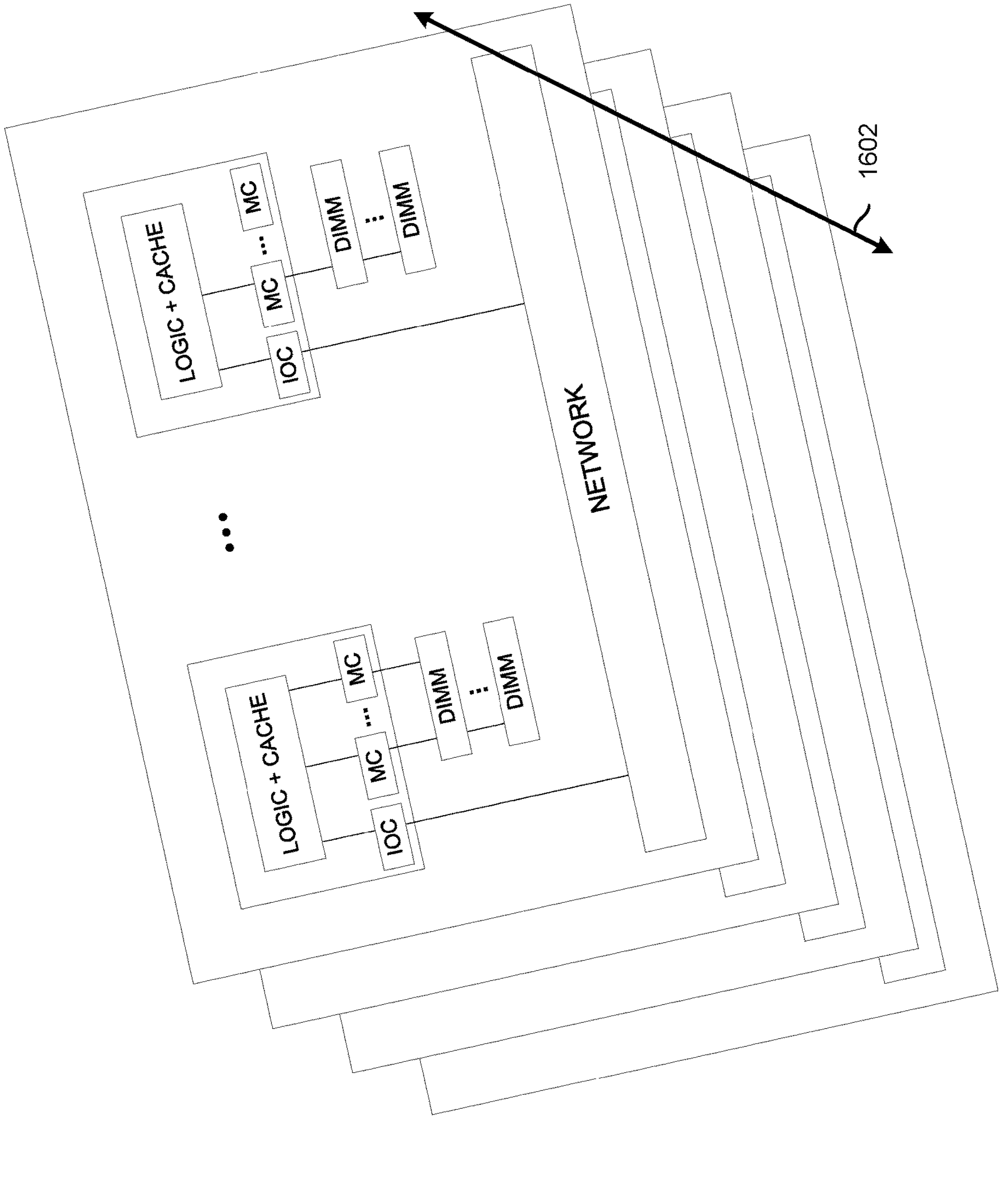
FIG. 16 illustrates a supercomputer at a rack level, in accordance with at least one embodiment.
Figure 17:
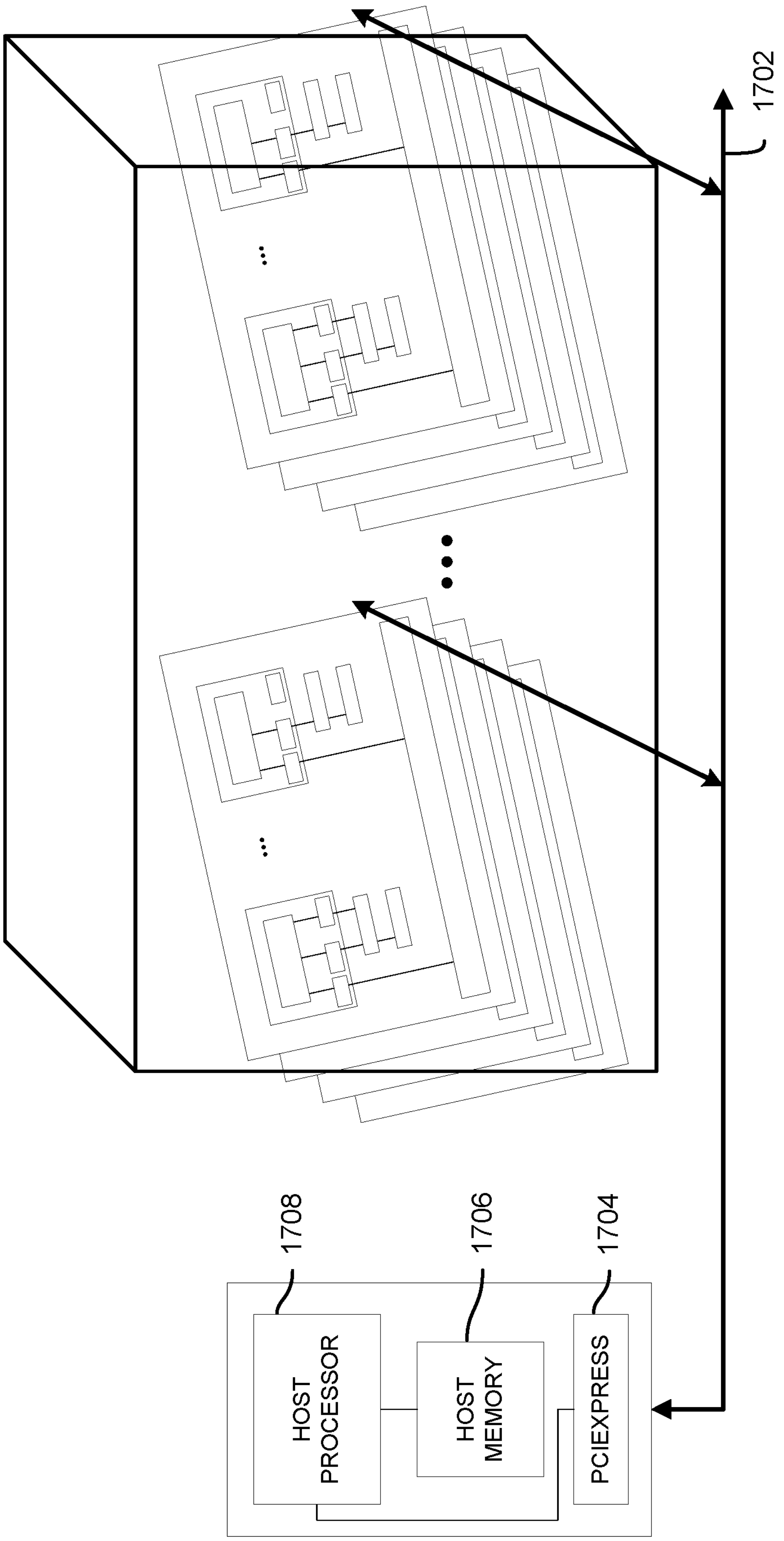
FIG. 17 illustrates a supercomputer at a whole system level, in accordance with at least one embodiment.

FIG. 16 illustrates a supercomputer at a rack level, in accordance with at least one embodiment. FIG. 17 illustrates a supercomputer at a whole system level, in accordance with at least one embodiment. In at least one embodiment, referring to FIG. 16 and FIG. 17, between rack modules in a rack and across racks throughout an entire system, high-speed serial optical or copper cables (1602, 1702) are used to realize a scalable, possibly incomplete hypercube network. In at least one embodiment, one of FPGA/ASIC chips of an accelerator is connected to a host system through a PCI-Express connection (1704). In at least one embodiment, host system comprises a host microprocessor (1708) that a software part of an application runs on and a memory consisting of one or more host memory DRAM units (1706) that is kept coherent with memory on an accelerator. In at least one embodiment, host system can be a separate module on one of racks, or can be integrated with one of a supercomputer's modules. In at least one embodiment, cube-connected cycles topology provide communication links to create a hypercube network for a large supercomputer. In at least one embodiment, a small group of FPGA/ASIC chips on a rack module can act as a single hypercube node, such that a total number of external links of each group is increased, compared to a single chip. In at least one embodiment, a group contains chips A, B, C and D on a rack module with internal wide differential busses connecting A, B, C and D in a torus organization. In at least one embodiment, there are 12 serial communication cables connecting a rack module to an outside world. In at least one embodiment, chip A on a rack module connects to serial communication cables 0, 1, 2. In at least one embodiment, chip B connects to cables 3, 4, 5. In at least one embodiment, chip C connects to 6, 7, 8. In at least one embodiment, chip D connects to 9, 10, 11. In at least one embodiment, an entire group {A, B, C, D} constituting a rack module can form a hypercube node within a supercomputer system, with up to 212=4096 rack modules (16384 FPGA/ASIC chips). In at least one embodiment, for chip A to send a message out on link 4 of group {A, B, C, D}, a message has to be routed first to chip B with an on-board differential wide bus connection. In at least one embodiment, a message arriving into a group {A, B, C, D} on link 4 (i.e., arriving at B) destined to chip A, also has to be routed first to a correct destination chip (A) internally within a group {A, B, C, D}. In at least one embodiment, parallel supercomputer systems of other sizes may also be implemented.

5G Networks

The following figures set forth, without limitation, exemplary 5G network-based systems that can be used to implement at least one embodiment.

Figure 18:
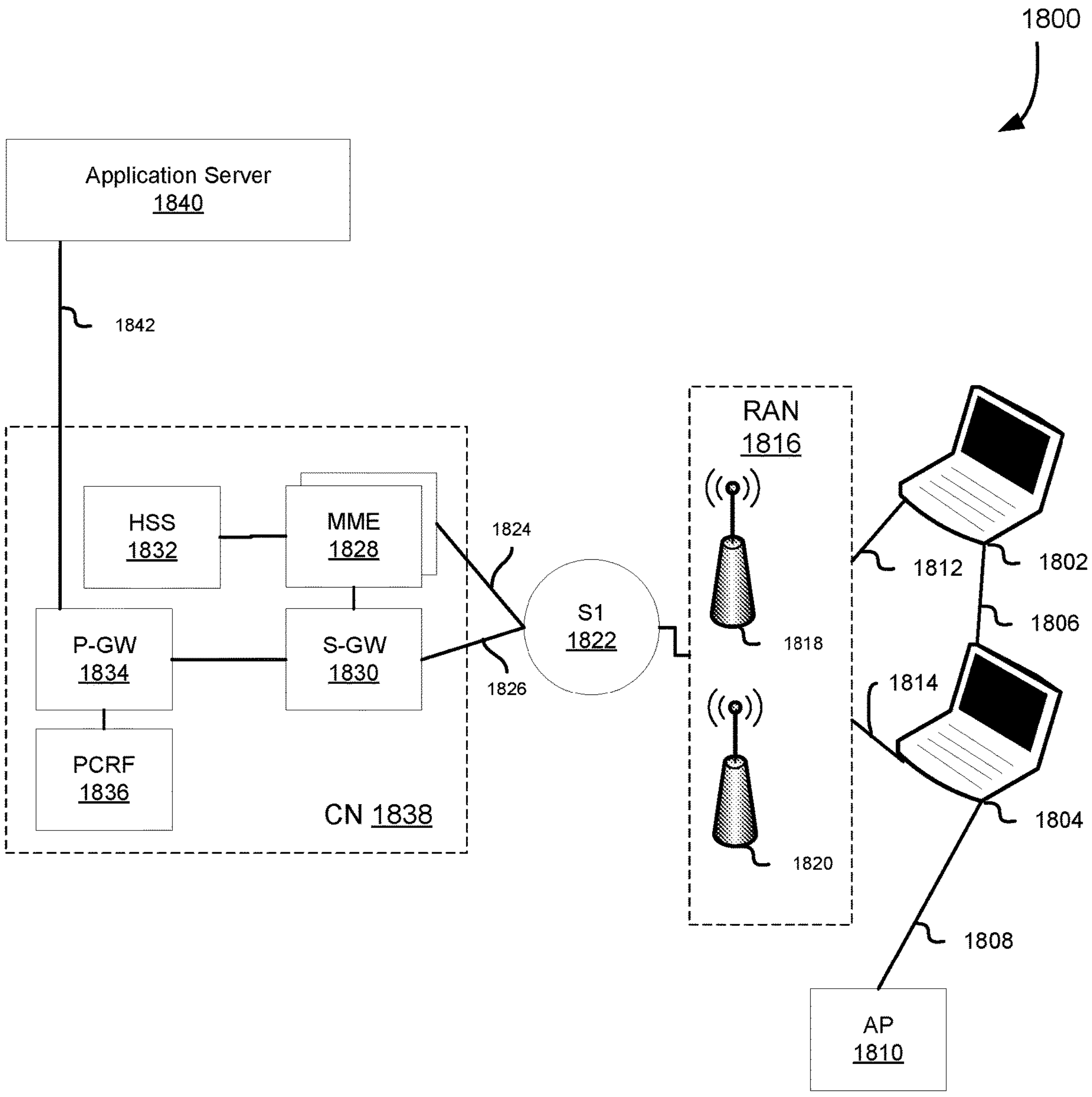
FIG. 18 illustrates an architecture of a system of a network, in accordance with at least one embodiment.

FIG. 18 illustrates an architecture of a system 1800 of a network, in accordance with at least one embodiment. In at least one embodiment, system 1800 is shown to include a user equipment (UE) 1802 and a UE 1804. In at least one embodiment, UEs 1802 and 1804 are illustrated as smartphones (e.g., handheld touchscreen mobile computing devices connectable to one or more cellular networks) but may also comprise any mobile or non-mobile computing device, such as Personal Data Assistants (PDAs), pagers, laptop computers, desktop computers, wireless handsets, or any computing device including a wireless communications interface.

In at least one embodiment, any of UEs 1802 and 1804 can comprise an Internet of Things (IoT) UE, which can comprise a network access layer designed for low-power IoT applications utilizing short-lived UE connections. In at least one embodiment, an IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. In at least one embodiment, a M2M or MTC exchange of data may be a machine-initiated exchange of data. In at least one embodiment, an IoT network describes interconnecting IoT UEs, which may include uniquely identifiable embedded computing devices (within Internet infrastructure), with short-lived connections. In at least one embodiment, an IoT UEs may execute background applications (e.g., keep alive messages, status updates, etc.) to facilitate connections of an IoT network.

In at least one embodiment, UEs 1802 and 1804 may be configured to connect, e.g., communicatively couple, with a radio access network (RAN) 1816. In at least one embodiment, RAN 1816 may be, for example, an Evolved Universal Mobile Telecommunications System (UMTS) Terrestrial Radio Access Network (E-UTRAN), a NextGen RAN (NG RAN), or some other type of RAN. In at least one embodiment, UEs 1802 and 1804 utilize connections 1812 and 1814, respectively, each of which comprises a physical communications interface or layer. In at least one embodiment, connections 1812 and 1814 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and variations thereof.

In at least one embodiment, UEs 1802 and 1804 may further directly exchange communication data via a ProSe interface 1806. In at least one embodiment, ProSe interface 1806 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

In at least one embodiment, UE 1804 is shown to be configured to access an access point (AP) 1810 via connection 1808. In at least one embodiment, connection 1808 can comprise a local wireless connection, such as a connection consistent with any IEEE 802.11 protocol, wherein AP 1810 would comprise a wireless fidelity (WiFi®) router. In at least one embodiment, AP 1810 is shown to be connected to an Internet without connecting to a core network of a wireless system.

In at least one embodiment, RAN 1816 can include one or more access nodes that enable connections 1812 and 1814. In at least one embodiment, these access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). In at least one embodiment, RAN 1816 may include one or more RAN nodes for providing macrocells, e.g., macro RAN node 1818, and one or more RAN nodes for providing femtocells or picocells (e.g., cells having smaller coverage areas, smaller user capacity, or higher bandwidth compared to macrocells), e.g., low power (LP) RAN node 1820.

In at least one embodiment, any of RAN nodes 1818 and 1820 can terminate an air interface protocol and can be a first point of contact for UEs 1802 and 1804. In at least one embodiment, any of RAN nodes 1818 and 1820 can fulfill various logical functions for RAN 1816 including, but not limited to, radio network controller (RNC) functions such as radio bearer management, uplink and downlink dynamic radio resource management and data packet scheduling, and mobility management.

In at least one embodiment, UEs 1802 and 1804 can be configured to communicate using Orthogonal Frequency-Division Multiplexing (OFDM) communication signals with each other or with any of RAN nodes 1818 and 1820 over a multi-carrier communication channel in accordance various communication techniques, such as, but not limited to, an Orthogonal Frequency Division Multiple Access (OFDMA) communication technique (e.g., for downlink communications) or a Single Carrier Frequency Division Multiple Access (SC-FDMA) communication technique (e.g., for uplink and ProSe or sidelink communications), and/or variations thereof. In at least one embodiment, OFDM signals can comprise a plurality of orthogonal subcarriers.

In at least one embodiment, a downlink resource grid can be used for downlink transmissions from any of RAN nodes 1818 and 1820 to UEs 1802 and 1804, while uplink transmissions can utilize similar techniques. In at least one embodiment, a grid can be a time frequency grid, called a resource grid or time-frequency resource grid, which is a physical resource in a downlink in each slot. In at least one embodiment, such a time frequency plane representation is a common practice for OFDM systems, which makes it intuitive for radio resource allocation. In at least one embodiment, each column and each row of a resource grid corresponds to one OFDM symbol and one OFDM subcarrier, respectively. In at least one embodiment, a duration of a resource grid in a time domain corresponds to one slot in a radio frame. In at least one embodiment, a smallest time-frequency unit in a resource grid is denoted as a resource element. In at least one embodiment, each resource grid comprises a number of resource blocks, which describe a mapping of certain physical channels to resource elements. In at least one embodiment, each resource block comprises a collection of resource elements. In at least one embodiment, in a frequency domain, this may represent a smallest quantity of resources that currently can be allocated. In at least one embodiment, there are several different physical downlink channels that are conveyed using such resource blocks.

In at least one embodiment, a physical downlink shared channel (PDSCH) may carry user data and higher-layer signaling to UEs 1802 and 1804. In at least one embodiment, a physical downlink control channel (PDCCH) may carry information about a transport format and resource allocations related to PDSCH channel, among other things. In at least one embodiment, it may also inform UEs 1802 and 1804 about a transport format, resource allocation, and HARQ (Hybrid Automatic Repeat Request) information related to an uplink shared channel. In at least one embodiment, typically, downlink scheduling (assigning control and shared channel resource blocks to UE 1802 within a cell) may be performed at any of RAN nodes 1818 and 1820 based on channel quality information fed back from any of UEs 1802 and 1804. In at least one embodiment, downlink resource assignment information may be sent on a PDCCH used for (e.g., assigned to) each of UEs 1802 and 1804.

In at least one embodiment, a PDCCH may use control channel elements (CCEs) to convey control information. In at least one embodiment, before being mapped to resource elements, PDCCH complex valued symbols may first be organized into quadruplets, which may then be permuted using a sub-block interleaver for rate matching. In at least one embodiment, each PDCCH may be transmitted using one or more of these CCEs, where each CCE may correspond to nine sets of four physical resource elements known as resource element groups (REGs). In at least one embodiment, four Quadrature Phase Shift Keying (QPSK) symbols may be mapped to each REG. In at least one embodiment, PDCCH can be transmitted using one or more CCEs, depending on a size of a downlink control information (DCI) and a channel condition. In at least one embodiment, there can be four or more different PDCCH formats defined in LTE with different numbers of CCEs (e.g., aggregation level, L=1, 2, 4, or 8).

In at least one embodiment, an enhanced physical downlink control channel (EPDCCH) that uses PDSCH resources may be utilized for control information transmission. In at least one embodiment, EPDCCH may be transmitted using one or more enhanced control channel elements (ECCEs). In at least one embodiment, each ECCE may correspond to nine sets of four physical resource elements known as an enhanced resource element groups (EREGs). In at least one embodiment, an ECCE may have other numbers of EREGs in some situations.

In at least one embodiment, RAN 1816 is shown to be communicatively coupled to a core network (CN) 1838 via an S1 interface 1822. In at least one embodiment, CN 1838 may be an evolved packet core (EPC) network, a NextGen Packet Core (NPC) network, or some other type of CN. In at least one embodiment, S1 interface 1822 is split into two parts: S1-U interface 1826, which carries traffic data between RAN nodes 1818 and 1820 and serving gateway (S-GW) 1830, and a S1-mobility management entity (MME) interface 1824, which is a signaling interface between RAN nodes 1818 and 1820 and MMEs 1828.

In at least one embodiment, CN 1838 comprises MMEs 1828, S-GW 1830, Packet Data Network (PDN) Gateway (P-GW) 1834, and a home subscriber server (HSS) 1832. In at least one embodiment, MMEs 1828 may be similar in function to a control plane of legacy Serving General Packet Radio Service (GPRS) Support Nodes (SGSN). In at least one embodiment, MMEs 1828 may manage mobility aspects in access such as gateway selection and tracking area list management. In at least one embodiment, HSS 1832 may comprise a database for network users, including subscription related information to support a network entities' handling of communication sessions. In at least one embodiment, CN 1838 may comprise one or several HSSs 1832, depending on a number of mobile subscribers, on a capacity of an equipment, on an organization of a network, etc. In at least one embodiment, HSS 1832 can provide support for routing/roaming, authentication, authorization, naming/addressing resolution, location dependencies, etc.

In at least one embodiment, S-GW 1830 may terminate a S1 interface 1822 towards RAN 1816, and routes data packets between RAN 1816 and CN 1838. In at least one embodiment, S-GW 1830 may be a local mobility anchor point for inter-RAN node handovers and also may provide an anchor for inter-3GPP mobility. In at least one embodiment, other responsibilities may include lawful intercept, charging, and some policy enforcement.

In at least one embodiment, P-GW 1834 may terminate an SGi interface toward a PDN. In at least one embodiment, P-GW 1834 may route data packets between an EPC network 1838 and external networks such as a network including application server 1840 (alternatively referred to as application function (AF)) via an Internet Protocol (IP) interface 1842. In at least one embodiment, application server 1840 may be an element offering applications that use IP bearer resources with a core network (e.g., UMTS Packet Services (PS) domain, LTE PS data services, etc.). In at least one embodiment, P-GW 1834 is shown to be communicatively coupled to an application server 1840 via an IP communications interface 1842. In at least one embodiment, application server 1840 can also be configured to support one or more communication services (e.g., Voice-over-Internet Protocol (VoIP) sessions, PTT sessions, group communication sessions, social networking services, etc.) for UEs 1802 and 1804 via CN 1838.

In at least one embodiment, P-GW 1834 may further be a node for policy enforcement and charging data collection. In at least one embodiment, policy and Charging Enforcement Function (PCRF) 1836 is a policy and charging control element of CN 1838. In at least one embodiment, in a non-roaming scenario, there may be a single PCRF in a Home Public Land Mobile Network (HPLMN) associated with a UE's Internet Protocol Connectivity Access Network (IP-CAN) session. In at least one embodiment, in a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). In at least one embodiment, PCRF 1836 may be communicatively coupled to application server 1840 via P-GW 1834. In at least one embodiment, application server 1840 may signal PCRF 1836 to indicate a new service flow and select an appropriate Quality of Service (QoS) and charging parameters. In at least one embodiment, PCRF 1836 may provision this rule into a Policy and Charging Enforcement Function (PCEF) (not shown) with an appropriate traffic flow template (TFT) and QoS class of identifier (QCI), which commences a QoS and charging as specified by application server 1840.

Figure 19:
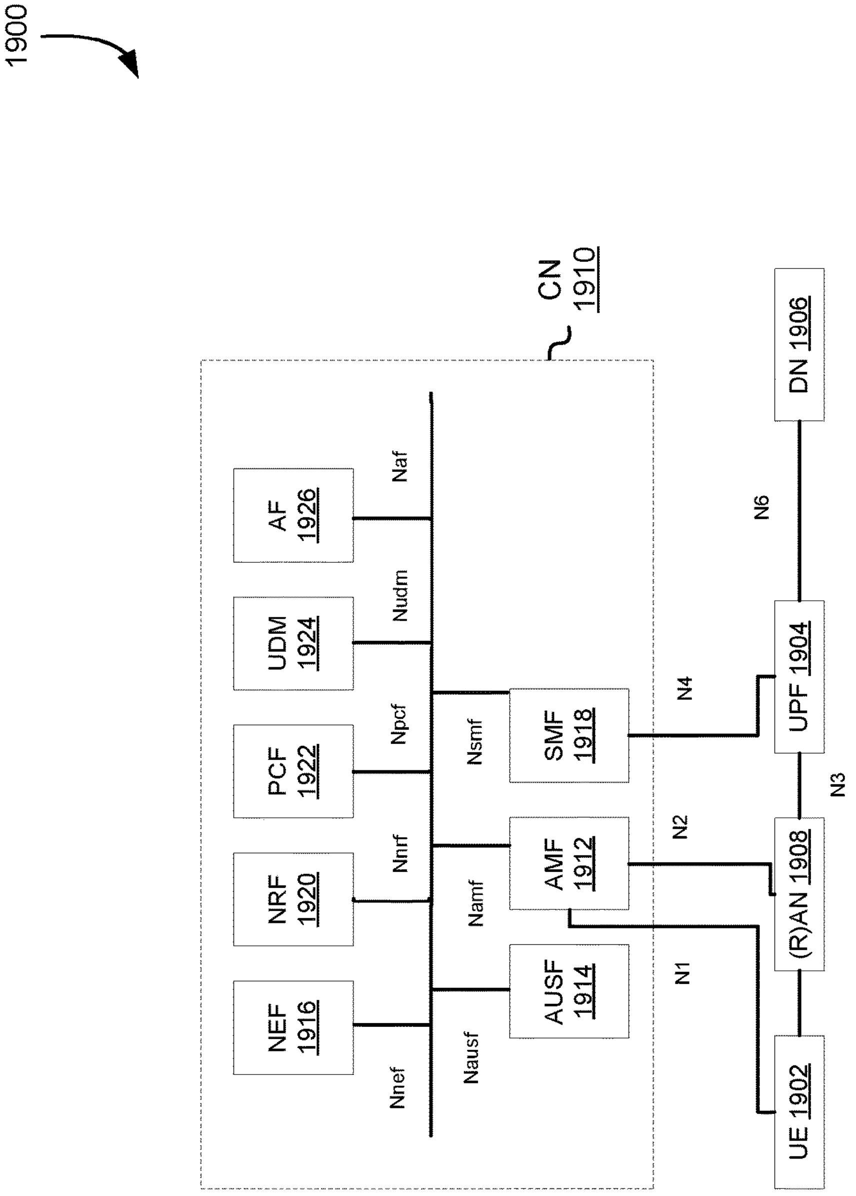
FIG. 19 illustrates an architecture of a system of a network, in accordance with at least one embodiment.

FIG. 19 illustrates an architecture of a system 1900 of a network in accordance with some embodiments. In at least one embodiment, system 1900 is shown to include a UE 1902, a 5G access node or RAN node (shown as (R)AN node 1908), a User Plane Function (shown as UPF 1904), a Data Network (DN 1906), which may be, for example, operator services, Internet access or 3rd party services, and a 5G Core Network (5GC) (shown as CN 1910).

In at least one embodiment, CN 1910 includes an Authentication Server Function (AUSF 1914); a Core Access and Mobility Management Function (AMF 1912); a Session Management Function (SMF 1918); a Network Exposure Function (NEF 1916); a Policy Control Function (PCF 1922); a Network Function (NF) Repository Function (NRF 1920); a Unified Data Management (UDM 1924); and an Application Function (AF 1926). In at least one embodiment, CN 1910 may also include other elements that are not shown, such as a Structured Data Storage network function (SDSF), an Unstructured Data Storage network function (UDSF), and variations thereof.

In at least one embodiment, UPF 1904 may act as an anchor point for intra-RAT and inter-RAT mobility, an external PDU session point of interconnect to DN 1906, and a branching point to support multi-homed PDU session. In at least one embodiment, UPF 1904 may also perform packet routing and forwarding, packet inspection, enforce user plane part of policy rules, lawfully intercept packets (UP collection); traffic usage reporting, perform QoS handling for user plane (e.g., packet filtering, gating, UL/DL rate enforcement), perform Uplink Traffic verification (e.g., SDF to QoS flow mapping), transport level packet marking in uplink and downlink, and downlink packet buffering and downlink data notification triggering. In at least one embodiment, UPF 1904 may include an uplink classifier to support routing traffic flows to a data network. In at least one embodiment, DN 1906 may represent various network operator services, Internet access, or third party services.

In at least one embodiment, AUSF 1914 may store data for authentication of UE 1902 and handle authentication related functionality. In at least one embodiment, AUSF 1914 may facilitate a common authentication framework for various access types.

In at least one embodiment, AMF 1912 may be responsible for registration management (e.g., for registering UE 1902, etc.), connection management, reachability management, mobility management, and lawful interception of AMF-related events, and access authentication and authorization. In at least one embodiment, AMF 1912 may provide transport for SM messages for SMF 1918, and act as a transparent proxy for routing SM messages. In at least one embodiment, AMF 1912 may also provide transport for short message service (SMS) messages between UE 1902 and an SMS function (SMSF) (not shown by FIG. 19). In at least one embodiment, AMF 1912 may act as Security Anchor Function (SEA), which may include interaction with AUSF 1914 and UE 1902 and receipt of an intermediate key that was established as a result of UE 1902 authentication process. In at least one embodiment, where USIM based authentication is used, AMF 1912 may retrieve security material from AUSF 1914. In at least one embodiment, AMF 1912 may also include a Security Context Management (SCM) function, which receives a key from SEA that it uses to derive access-network specific keys. In at least one embodiment, furthermore, AMF 1912 may be a termination point of RAN CP interface (N2 reference point), a termination point of NAS (NI) signaling, and perform NAS ciphering and integrity protection.

In at least one embodiment, AMF 1912 may also support NAS signaling with a UE 1902 over an N3 interworking-function (IWF) interface. In at least one embodiment, N3IWF may be used to provide access to untrusted entities. In at least one embodiment, N3IWF may be a termination point for N2 and N3 interfaces for control plane and user plane, respectively, and as such, may handle N2 signaling from SMF and AMF for PDU sessions and QoS, encapsulate/de-encapsulate packets for IPSec and N3 tunneling, mark N3 user-plane packets in uplink, and enforce QoS corresponding to N3 packet marking taking into account QoS requirements associated to such marking received over N2. In at least one embodiment, N3IWF may also relay uplink and downlink control-plane NAS (NI) signaling between UE 1902 and AMF 1912, and relay uplink and downlink user-plane packets between UE 1902 and UPF 1904. In at least one embodiment, N3IWF also provides mechanisms for IPsec tunnel establishment with UE 1902.

In at least one embodiment, SMF 1918 may be responsible for session management (e.g., session establishment, modify and release, including tunnel maintain between UPF and AN node); UE IP address allocation & management (including optional Authorization); Selection and control of UP function; Configures traffic steering at UPF to route traffic to proper destination; termination of interfaces towards Policy control functions; control part of policy enforcement and QoS; lawful intercept (for SM events and interface to LI System); termination of SM parts of NAS messages; downlink Data Notification; initiator of AN specific SM information, sent via AMF over N2 to AN; determine SSC mode of a session. In at least one embodiment, SMF 1918 may include following roaming functionality: handle local enforcement to apply QoS SLAB (VPLMN); charging data collection and charging interface (VPLMN); lawful intercept (in VPLMN for SM events and interface to LI System); support for interaction with external DN for transport of signaling for PDU session authorization/authentication by external DN.

In at least one embodiment, NEF 1916 may provide means for securely exposing services and capabilities provided by 3GPP network functions for third party, internal exposure/re-exposure, Application Functions (e.g., AF 1926), edge computing or fog computing systems, etc. In at least one embodiment, NEF 1916 may authenticate, authorize, and/or throttle AFs. In at least one embodiment, NEF 1916 may also translate information exchanged with AF 1926 and information exchanged with internal network functions. In at least one embodiment, NEF 1916 may translate between an AF-Service-Identifier and an internal 5GC information. In at least one embodiment, NEF 1916 may also receive information from other network functions (NFs) based on exposed capabilities of other network functions. In at least one embodiment, this information may be stored at NEF 1916 as structured data, or at a data storage NF using a standardized interfaces. In at least one embodiment, stored information can then be re-exposed by NEF 1916 to other NFs and AFs, and/or used for other purposes such as analytics.

In at least one embodiment, NRF 1920 may support service discovery functions, receive NF Discovery Requests from NF instances, and provide information of discovered NF instances to NF instances. In at least one embodiment, NRF 1920 also maintains information of available NF instances and their supported services.

In at least one embodiment, PCF 1922 may provide policy rules to control plane function(s) to enforce them, and may also support unified policy framework to govern network behavior. In at least one embodiment, PCF 1922 may also implement a front end (FE) to access subscription information relevant for policy decisions in a UDR of UDM 1924.

In at least one embodiment, UDM 1924 may handle subscription-related information to support a network entities' handling of communication sessions, and may store subscription data of UE 1902. In at least one embodiment, UDM 1924 may include two parts, an application FE and a User Data Repository (UDR). In at least one embodiment, UDM may include a UDM FE, which is in charge of processing of credentials, location management, subscription management and so on. In at least one embodiment, several different front ends may serve a same user in different transactions. In at least one embodiment, UDM-FE accesses subscription information stored in an UDR and performs authentication credential processing; user identification handling; access authorization; registration/mobility management; and subscription management. In at least one embodiment, UDR may interact with PCF 1922. In at least one embodiment, UDM 1924 may also support SMS management, wherein an SMS-FE implements a similar application logic as discussed previously.

In at least one embodiment, AF 1926 may provide application influence on traffic routing, access to a Network Capability Exposure (NCE), and interact with a policy framework for policy control. In at least one embodiment, NCE may be a mechanism that allows a 5GC and AF 1926 to provide information to each other via NEF 1916, which may be used for edge computing implementations. In at least one embodiment, network operator and third party services may be hosted close to UE 1902 access point of attachment to achieve an efficient service delivery through a reduced end-to-end latency and load on a transport network. In at least one embodiment, for edge computing implementations, 5GC may select a UPF 1904 close to UE 1902 and execute traffic steering from UPF 1904 to DN 1906 via N6 interface. In at least one embodiment, this may be based on UE subscription data, UE location, and information provided by AF 1926. In at least one embodiment, AF 1926 may influence UPF (re)selection and traffic routing. In at least one embodiment, based on operator deployment, when AF 1926 is considered to be a trusted entity, a network operator may permit AF 1926 to interact directly with relevant NFs.

In at least one embodiment, CN 1910 may include an SMSF, which may be responsible for SMS subscription checking and verification, and relaying SM messages to/from UE 1902 to/from other entities, such as an SMS-GMSC/IWMSC/SMS-router. In at least one embodiment, SMS may also interact with AMF 1912 and UDM 1924 for notification procedure that UE 1902 is available for SMS transfer (e.g., set a UE not reachable flag, and notifying UDM 1924 when UE 1902 is available for SMS).

In at least one embodiment, system 1900 may include following service-based interfaces: Namf: Service-based interface exhibited by AMF; Nsmf: Service-based interface exhibited by SMF; Nnef: Service-based interface exhibited by NEF; Npcf: Service-based interface exhibited by PCF; Nudm: Service-based interface exhibited by UDM; Naf: Service-based interface exhibited by AF; Nnrf: Service-based interface exhibited by NRF; and Nausf: Service-based interface exhibited by AUSF.

In at least one embodiment, system 1900 may include following reference points: N1: Reference point between UE and AMF; N2: Reference point between (R)AN and AMF; N3: Reference point between (R)AN and UPF; N4: Reference point between SMF and UPF; and N6: Reference point between UPF and a Data Network. In at least one embodiment, there may be many more reference points and/or service-based interfaces between a NF services in NFs, however, these interfaces and reference points have been omitted for clarity. In at least one embodiment, an NS reference point may be between a PCF and AF; an N7 reference point may be between PCF and SMF; an N11 reference point between AMF and SMF; etc. In at least one embodiment, CN 1910 may include an Nx interface, which is an inter-CN interface between MME and AMF 1912 in order to enable interworking between CN 1910 and CN 1916.

In at least one embodiment, system 1900 may include multiple RAN nodes (such as (R)AN node 1908) wherein an Xn interface is defined between two or more (R)AN node 1908 (e.g., gNBs) that connecting to 5GC 410, between a (R)AN node 1908 (e.g., gNB) connecting to CN 1910 and an eNB (e.g., a macro RAN node), and/or between two eNBs connecting to CN 1910.

In at least one embodiment, Xn interface may include an Xn user plane (Xn-U) interface and an Xn control plane (Xn-C) interface. In at least one embodiment, Xn-U may provide non-guaranteed delivery of user plane PDUs and support/provide data forwarding and flow control functionality. In at least one embodiment, Xn-C may provide management and error handling functionality, functionality to manage a Xn-C interface; mobility support for UE 1902 in a connected mode (e.g., CM-CONNECTED) including functionality to manage UE mobility for connected mode between one or more (R)AN node 1908. In at least one embodiment, mobility support may include context transfer from an old (source) serving (R)AN node 1908 to new (target) serving (R)AN node 1908; and control of user plane tunnels between old (source) serving (R)AN node 1908 to new (target) serving (R)AN node 1908.

In at least one embodiment, a protocol stack of a Xn-U may include a transport network layer built on Internet Protocol (IP) transport layer, and a GTP-U layer on top of a UDP and/or IP layer(s) to carry user plane PDUs. In at least one embodiment, Xn-C protocol stack may include an application layer signaling protocol (referred to as Xn Application Protocol (Xn-AP)) and a transport network layer that is built on an SCTP layer. In at least one embodiment, SCTP layer may be on top of an IP layer. In at least one embodiment, SCTP layer provides a guaranteed delivery of application layer messages. In at least one embodiment, in a transport IP layer point-to-point transmission is used to deliver signaling PDUs. In at least one embodiment, Xn-U protocol stack and/or a Xn-C protocol stack may be same or similar to an user plane and/or control plane protocol stack(s) shown and described herein.

Figure 20:
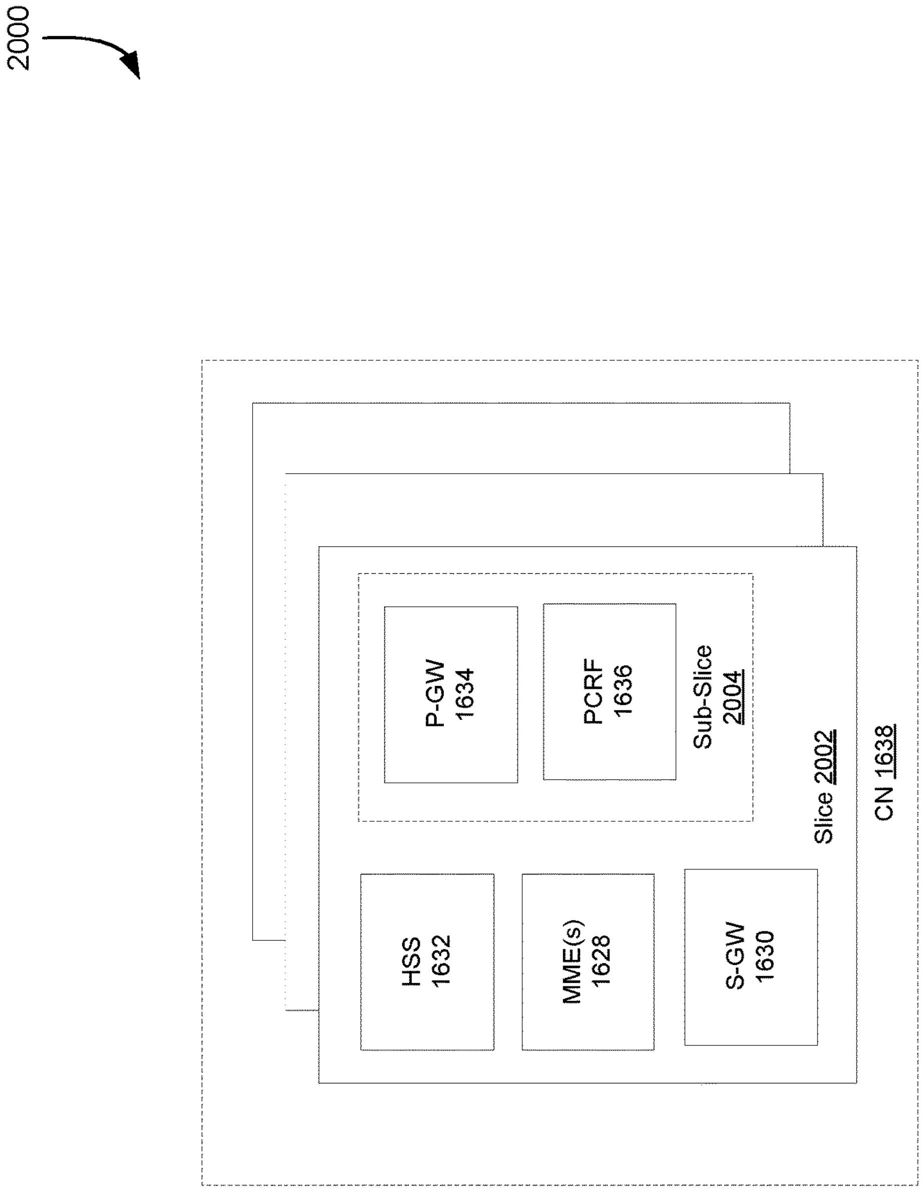
FIG. 20 illustrates components of a core network, in accordance with at least one embodiment.

FIG. 20 illustrates components 2000 of a core network in accordance with at least one embodiment. In at least one embodiment, components of CN 1538 may be implemented in one physical node or separate physical nodes including components to read and execute instructions from a machine-readable or computer-readable medium (e.g., a non-transitory machine-readable storage medium). In at least one embodiment, Network Functions Virtualization (NFV) is utilized to virtualize any or all of above described network node functions via executable instructions stored in one or more computer readable storage mediums (described in further detail below). In at least one embodiment, a logical instantiation of CN 1538 may be referred to as a network slice 2002 (e.g., network slice 2002 is shown to include HSS 1532, MME(s) 1528, and S-GW 1530). In at least one embodiment, a logical instantiation of a portion of CN 1538 may be referred to as a network sub-slice 2004 (e.g., network sub-slice 2004 is shown to include P-GW 1534 and PCRF 1536).

In at least one embodiment, NFV architectures and infrastructures may be used to virtualize one or more network functions, alternatively performed by proprietary hardware, onto physical resources comprising a combination of industry-standard server hardware, storage hardware, or switches. In at least one embodiment, NFV systems can be used to execute virtual or reconfigurable implementations of one or more EPC components/functions.

Figure 21:
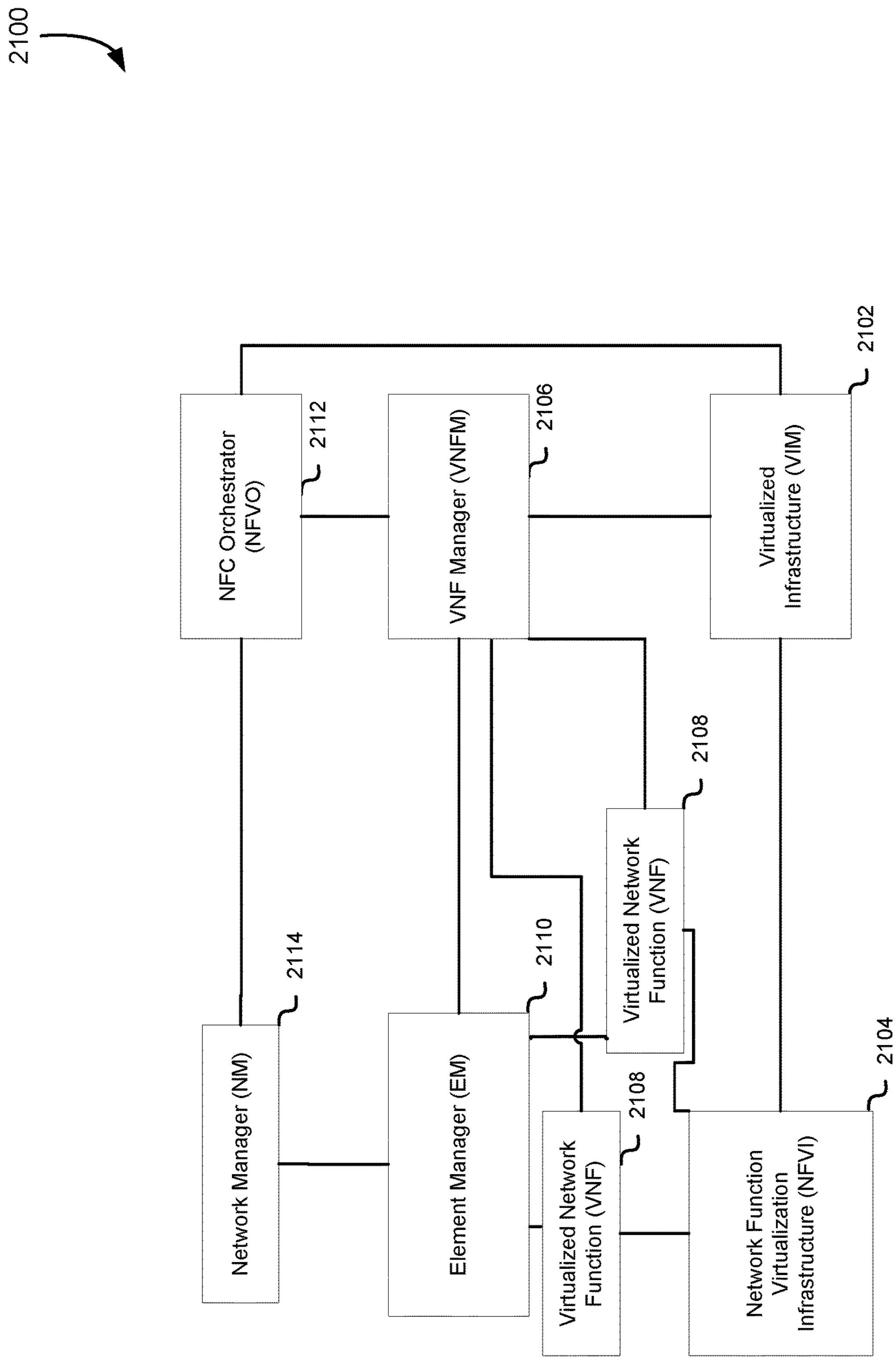
FIG. 21 illustrates components of a system to support network function virtualization (NFV), in accordance with at least one embodiment.

FIG. 21 is a block diagram illustrating components, according to at least one embodiment, of a system 2100 to support network function virtualization (NFV). In at least one embodiment, system 2100 is illustrated as including a virtualized infrastructure manager (shown as VIM 2102), a network function virtualization infrastructure (shown as NFVI 2104), a VNF manager (shown as VNFM 2106), virtualized network functions (shown as VNF 2108), an element manager (shown as EM 2110), an NFV Orchestrator (shown as NFVO 2112), and a network manager (shown as NM 2114).

In at least one embodiment, VIM 2102 manages resources of NFVI 2104. In at least one embodiment, NFVI 2104 can include physical or virtual resources and applications (including hypervisors) used to execute system 2100. In at least one embodiment, VIM 2102 may manage a life cycle of virtual resources with NFVI 2104 (e.g., creation, maintenance, and tear down of virtual machines (VMs) associated with one or more physical resources), track VM instances, track performance, fault and security of VM instances and associated physical resources, and expose VM instances and associated physical resources to other management systems.

In at least one embodiment, VNFM 2106 may manage VNF 2108. In at least one embodiment, VNF 2108 may be used to execute EPC components/functions. In at least one embodiment, VNFM 2106 may manage a life cycle of VNF 2108 and track performance, fault and security of virtual aspects of VNF 2108. In at least one embodiment, EM 2110 may track performance, fault and security of functional aspects of VNF 2108. In at least one embodiment, tracking data from VNFM 2106 and EM 2110 may comprise, for example, performance measurement (PM) data used by VIM 2102 or NFVI 2104. In at least one embodiment, both VNFM 2106 and EM 2110 can scale up/down a quantity of VNFs of system 2100.

In at least one embodiment, NFVO 2112 may coordinate, authorize, release and engage resources of NFVI 2104 in order to provide a requested service (e.g., to execute an EPC function, component, or slice). In at least one embodiment, NM 2114 may provide a package of end-user functions with responsibility for a management of a network, which may include network elements with VNFs, non-virtualized network functions, or both (management of VNFs may occur via an EM 2110).

Computer-Based Systems

The following figures set forth, without limitation, exemplary computer-based systems that can be used to implement at least one embodiment.

Figure 22:
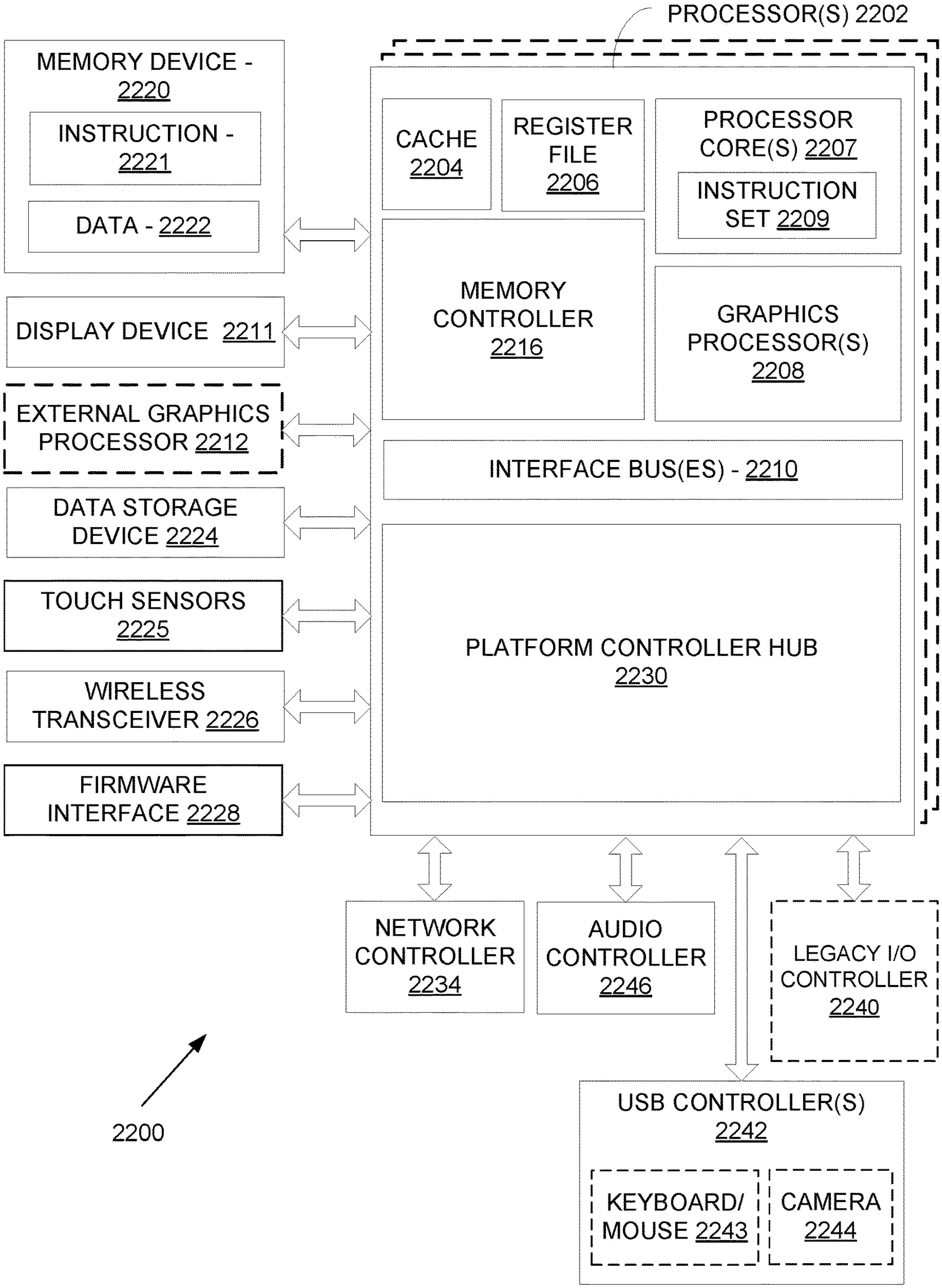
FIG. 22 illustrates a processing system, in accordance with at least one embodiment.

FIG. 22 illustrates a processing system 2200, in accordance with at least one embodiment. In at least one embodiment, processing system 2200 includes one or more processors 2202 and one or more graphics processors 2208, and may be a single processor desktop system, a multiprocessor workstation system, or a server system having a large number of processors 2202 or processor cores 2207. In at least one embodiment, processing system 2200 is a processing platform incorporated within a system-on-a-chip ("SoC") integrated circuit for use in mobile, handheld, or embedded devices.

In at least one embodiment, processing system 2200 can include, or be incorporated within a server-based gaming platform, a game console, a media console, a mobile gaming console, a handheld game console, or an online game console. In at least one embodiment, processing system 2200 is a mobile phone, smart phone, tablet computing device or mobile Internet device. In at least one embodiment, processing system 2200 can also include, couple with, or be integrated within a wearable device, such as a smart watch wearable device, smart eyewear device, augmented reality device, or virtual reality device. In at least one embodiment, processing system 2200 is a television or set top box device having one or more processors 2202 and a graphical interface generated by one or more graphics processors 2208.

In at least one embodiment, one or more processors 2202 each include one or more processor cores 2207 to process instructions which, when executed, perform operations for system and user software. In at least one embodiment, each of one or more processor cores 2207 is configured to process a specific instruction set 2209. In at least one embodiment, instruction set 2209 may facilitate Complex Instruction Set Computing ("CISC"), Reduced Instruction Set Computing ("RISC"), or computing via a Very Long Instruction Word ("VLIW"). In at least one embodiment, processor cores 2207 may each process a different instruction set 2209, which may include instructions to facilitate emulation of other instruction sets. In at least one embodiment, processor core 2207 may also include other processing devices, such as a digital signal processor ("DSP").

In at least one embodiment, processor 2202 includes cache memory ("cache") 2204. In at least one embodiment, processor 2202 can have a single internal cache or multiple levels of internal cache. In at least one embodiment, cache memory is shared among various components of processor 2202. In at least one embodiment, processor 2202 also uses an external cache (e.g., a Level 3 ("L3") cache or Last Level Cache ("LLC")) (not shown), which may be shared among processor cores 2207 using known cache coherency techniques. In at least one embodiment, register file 2206 is additionally included in processor 2202 which may include different types of registers for storing different types of data (e.g., integer registers, floating point registers, status registers, and an instruction pointer register). In at least one embodiment, register file 2206 may include general-purpose registers or other registers.

In at least one embodiment, one or more processor(s) 2202 are coupled with one or more interface bus(es) 2210 to transmit communication signals such as address, data, or control signals between processor 2202 and other components in processing system 2200. In at least one embodiment interface bus 2210, in one embodiment, can be a processor bus, such as a version of a Direct Media Interface ("DMI") bus. In at least one embodiment, interface bus 2210 is not limited to a DMI bus, and may include one or more Peripheral Component Interconnect buses (e.g., "PCI," PCI Express ("PCIe")), memory buses, or other types of interface buses. In at least one embodiment processor(s) 2202 include an integrated memory controller 2216 and a platform controller hub 2230. In at least one embodiment, memory controller 2216 facilitates communication between a memory device and other components of processing system 2200, while platform controller hub ("PCH") 2230 provides connections to Input/Output ("I/O") devices via a local I/O bus.

In at least one embodiment, memory device 2220 can be a dynamic random access memory ("DRAM") device, a static random access memory ("SRAM") device, flash memory device, phase-change memory device, or some other memory device having suitable performance to serve as processor memory. In at least one embodiment memory device 2220 can operate as system memory for processing system 2200, to store data 2222 and instructions 2221 for use when one or more processors 2202 executes an application or process. In at least one embodiment, memory controller 2216 also couples with an optional external graphics processor 2212, which may communicate with one or more graphics processors 2208 in processors 2202 to perform graphics and media operations. In at least one embodiment, a display device 2211 can connect to processor(s) 2202. In at least one embodiment display device 2211 can include one or more of an internal display device, as in a mobile electronic device or a laptop device or an external display device attached via a display interface (e.g., DisplayPort, etc.). In at least one embodiment, display device 2211 can include a head mounted display ("HMD") such as a stereoscopic display device for use in virtual reality ("VR") applications or augmented reality ("AR") applications.

In at least one embodiment, platform controller hub 2230 enables peripherals to connect to memory device 2220 and processor 2202 via a high-speed I/O bus. In at least one embodiment, I/O peripherals include, but are not limited to, an audio controller 2246, a network controller 2234, a firmware interface 2228, a wireless transceiver 2226, touch sensors 2225, a data storage device 2224 (e.g., hard disk drive, flash memory, etc.). In at least one embodiment, data storage device 2224 can connect via a storage interface (e.g., SATA) or via a peripheral bus, such as PCI, or PCIe. In at least one embodiment, touch sensors 2225 can include touch screen sensors, pressure sensors, or fingerprint sensors. In at least one embodiment, wireless transceiver 2226 can be a Wi-Fi transceiver, a Bluetooth transceiver, or a mobile network transceiver such as a 3G, 4G, or Long Term Evolution ("LTE") transceiver. In at least one embodiment, firmware interface 2228 enables communication with system firmware, and can be, for example, a unified extensible firmware interface ("UEFI"). In at least one embodiment, network controller 2234 can enable a network connection to a wired network. In at least one embodiment, a high-performance network controller (not shown) couples with interface bus 2210. In at least one embodiment, audio controller 2246 is a multi-channel high definition audio controller. In at least one embodiment, processing system 2200 includes an optional legacy I/O controller 2240 for coupling legacy (e.g., Personal System 2 ("PS/2")) devices to processing system 2200. In at least one embodiment, platform controller hub 2230 can also connect to one or more Universal Serial Bus ("USB") controllers 2242 connect input devices, such as keyboard and mouse 2243 combinations, a camera 2244, or other USB input devices.

In at least one embodiment, an instance of memory controller 2216 and platform controller hub 2230 may be integrated into a discreet external graphics processor, such as external graphics processor 2212. In at least one embodiment, platform controller hub 2230 and/or memory controller 2216 may be external to one or more processor(s) 2202. For example, in at least one embodiment, processing system 2200 can include an external memory controller 2216 and platform controller hub 2230, which may be configured as a memory controller hub and peripheral controller hub within a system chipset that is in communication with processor(s) 2202.

Figure 23:
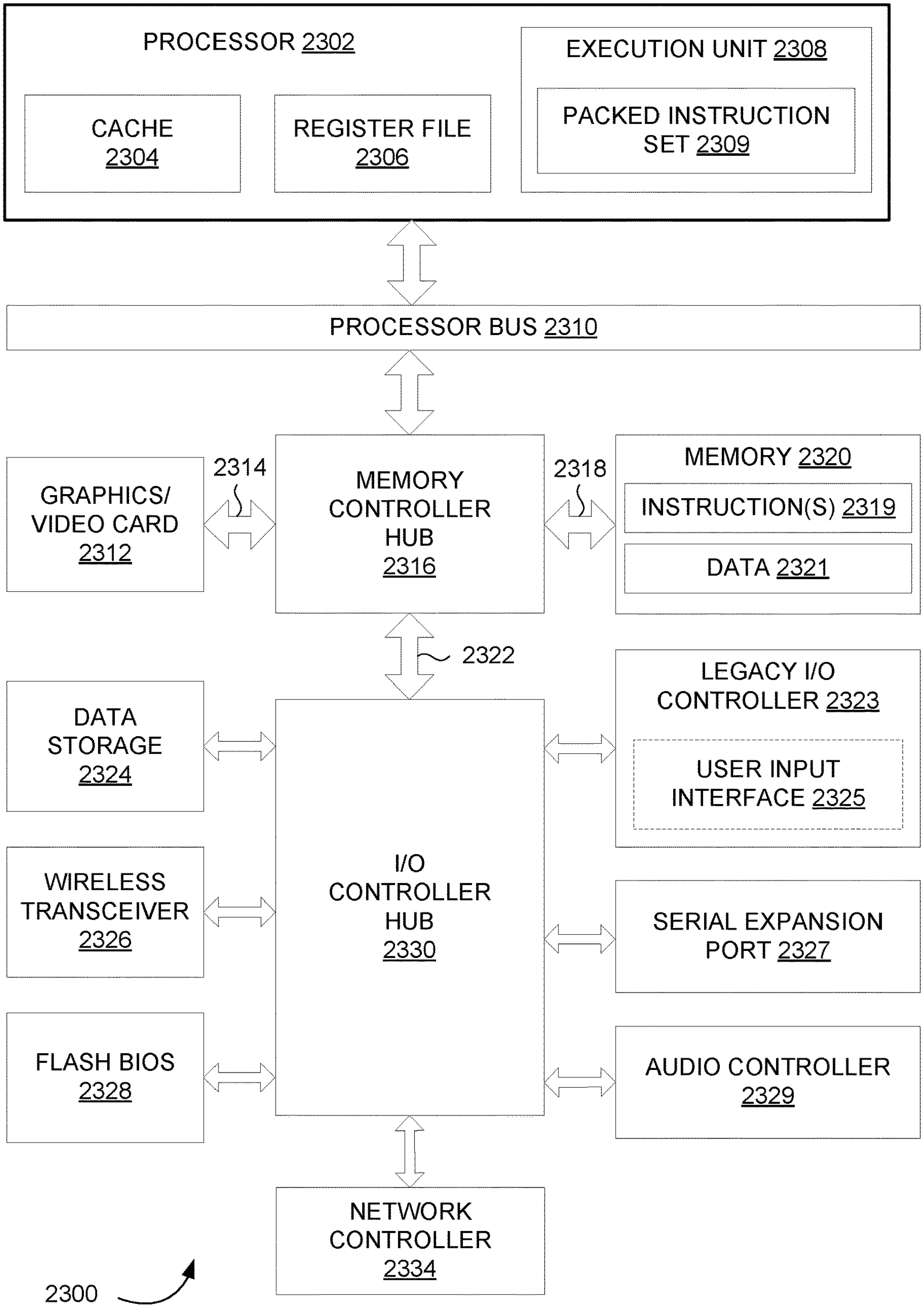
FIG. 23 illustrates a computer system, in accordance with at least one embodiment.

FIG. 23 illustrates a computer system 2300, in accordance with at least one embodiment. In at least one embodiment, computer system 2300 may be a system with interconnected devices and components, an SOC, or some combination. In at least on embodiment, computer system 2300 is formed with a processor 2302 that may include execution units to execute an instruction. In at least one embodiment, computer system 2300 may include, without limitation, a component, such as processor 2302 to employ execution units including logic to perform algorithms for processing data. In at least one embodiment, computer system 2300 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 2300 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 2300 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions.

In at least one embodiment, computer system 2300 may include, without limitation, processor 2302 that may include, without limitation, one or more execution units 2308 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 2300 is a single processor desktop or server system. In at least one embodiment, computer system 2300 may be a multiprocessor system. In at least one embodiment, processor 2302 may include, without limitation, a CISC microprocessor, a RISC microprocessor, a VLIW microprocessor, a processor implementing a combination of instruction sets, or any other processor device, such as a digital signal processor, for example. In at least one embodiment, processor 2302 may be coupled to a processor bus 2310 that may transmit data signals between processor 2302 and other components in computer system 2300.

In at least one embodiment, processor 2302 may include, without limitation, a Level 1 ("L1") internal cache memory ("cache") 2304. In at least one embodiment, processor 2302 may have a single internal cache or multiple levels of internal cache. In at least one embodiment, cache memory may reside external to processor 2302. In at least one embodiment, processor 2302 may also include a combination of both internal and external caches. In at least one embodiment, a register file 2306 may store different types of data in various registers including, without limitation, integer registers, floating point registers, status registers, and instruction pointer register.

In at least one embodiment, execution unit 2308, including, without limitation, logic to perform integer and floating point operations, also resides in processor 2302. Processor 2302 may also include a microcode ("ucode") read only memory ("ROM") that stores microcode for certain macro instructions. In at least one embodiment, execution unit 2308 may include logic to handle a packed instruction set 2309. In at least one embodiment, by including packed instruction set 2309 in an instruction set of a general-purpose processor 2302, along with associated circuitry to execute instructions, operations used by many multimedia applications may be performed using packed data in a general-purpose processor 2302. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 2308 may also be used in microcontrollers, embedded processors, graphics devices, DSPs, and other types of logic circuits. In at least one embodiment, computer system 2300 may include, without limitation, a memory 2320. In at least one embodiment, memory 2320 may be implemented as a DRAM device, an SRAM device, flash memory device, or other memory device. Memory 2320 may store instruction(s) 2319 and/or data 2321 represented by data signals that may be executed by processor 2302.

In at least one embodiment, a system logic chip may be coupled to processor bus 2310 and memory 2320. In at least one embodiment, a system logic chip may include, without limitation, a memory controller hub ("MCH") 2316, and processor 2302 may communicate with MCH 2316 via processor bus 2310. In at least one embodiment, MCH 2316 may provide a high bandwidth memory path 2318 to memory 2320 for instruction and data storage and for storage of graphics commands, data and textures. In at least one embodiment, MCH 2316 may direct data signals between processor 2302, memory 2320, and other components in computer system 2300 and to bridge data signals between processor bus 2310, memory 2320, and a system I/O 2322. In at least one embodiment, system logic chip may provide a graphics port for coupling to a graphics controller. In at least one embodiment, MCH 2316 may be coupled to memory 2320 through high bandwidth memory path 2318 and graphics/video card 2312 may be coupled to MCH 2316 through an Accelerated Graphics Port ("AGP") interconnect 2314.

In at least one embodiment, computer system 2300 may use system I/O 2322 that is a proprietary hub interface bus to couple MCH 2316 to I/O controller hub ("ICH") 2330. In at least one embodiment, ICH 2330 may provide direct connections to some I/O devices via a local I/O bus. In at least one embodiment, local I/O bus may include, without limitation, a high-speed I/O bus for connecting peripherals to memory 2320, a chipset, and processor 2302. Examples may include, without limitation, an audio controller 2329, a firmware hub ("flash BIOS") 2328, a wireless transceiver 2326, a data storage 2324, a legacy I/O controller 2323 containing a user input interface 2325 and a keyboard interface, a serial expansion port 2327, such as a USB, and a network controller 2334. Data storage 2324 may comprise a hard disk drive, a floppy disk drive, a CD-ROM device, a flash memory device, or other mass storage device.

In at least one embodiment, FIG. 23 illustrates a system, which includes interconnected hardware devices or "chips." In at least one embodiment, FIG. 23 may illustrate an exemplary SoC. In at least one embodiment, devices illustrated in FIG. 23 may be interconnected with proprietary interconnects, standardized interconnects (e.g., PCIe), or some combination thereof. In at least one embodiment, one or more components of system 2300 are interconnected using compute express link ("CXL") interconnects.

Figure 24:
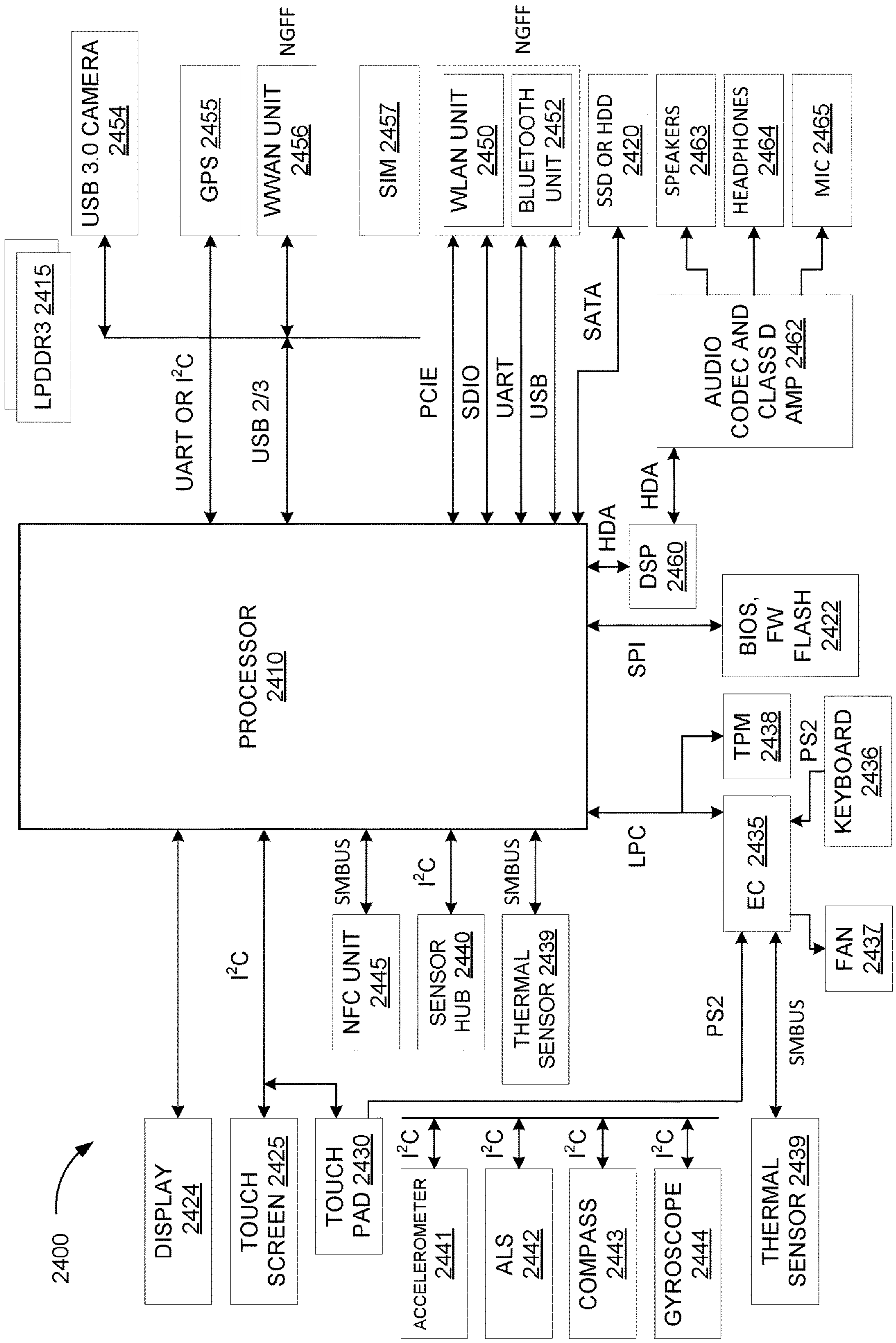
FIG. 24 illustrates a system, in accordance with at least one embodiment.

FIG. 24 illustrates a system 2400, in accordance with at least one embodiment. In at least one embodiment, system 2400 is an electronic device that utilizes a processor 2410. In at least one embodiment, system 2400 may be, for example and without limitation, a notebook, a tower server, a rack server, a blade server, a laptop, a desktop, a tablet, a mobile device, a phone, an embedded computer, or any other suitable electronic device.

In at least one embodiment, system 2400 may include, without limitation, processor 2410 communicatively coupled to any suitable number or kind of components, peripherals, modules, or devices. In at least one embodiment, processor 2410 is coupled using a bus or interface, such as an $I^2C$ bus, a System Management Bus ("SMBus"), a Low Pin Count ("LPC") bus, a Serial Peripheral Interface ("SPI"), a High Definition Audio ("HDA") bus, a Serial Advance Technology Attachment ("SATA") bus, a USB (versions 1, 2, 3), or a Universal Asynchronous Receiver/Transmitter ("UART") bus. In at least one embodiment, FIG. 24 illustrates a system which includes interconnected hardware devices or "chips." In at least one embodiment, FIG. 24 may illustrate an exemplary SoC. In at least one embodiment, devices illustrated in FIG. 24 may be interconnected with proprietary interconnects, standardized interconnects (e.g., PCIe) or some combination thereof. In at least one embodiment, one or more components of FIG. 24 are interconnected using CXL interconnects.

In at least one embodiment, FIG. 24 may include a display 2424, a touch screen 2425, a touch pad 2430, a Near Field Communications unit ("NFC") 2445, a sensor hub 2440, a thermal sensor 2446, an Express Chipset ("EC") 2435, a Trusted Platform Module ("TPM") 2438, BIOS/firmware/flash memory ("BIOS, FW Flash") 2422, a DSP 2460, a Solid State Disk ("SSD") or Hard Disk Drive ("HDD") 2420, a wireless local area network unit ("WLAN") 2450, a Bluetooth unit 2452, a Wireless Wide Area Network unit ("WWAN") 2456, a Global Positioning System ("GPS") 2455, a camera ("USB 3.0 camera") 2454 such as a USB 3.0 camera, or a Low Power Double Data Rate ("LPDDR") memory unit ("LPDDR3") 2415 implemented in, for example, LPDDR3 standard. These components may each be implemented in any suitable manner.

In at least one embodiment, other components may be communicatively coupled to processor 2410 through components discussed above. In at least one embodiment, an accelerometer 2441, an Ambient Light Sensor ("ALS")

2442, a compass 2443, and a gyroscope 2444 may be communicatively coupled to sensor hub 2440. In at least one embodiment, a thermal sensor 2439, a fan 2437, a keyboard 2446, and a touch pad 2430 may be communicatively coupled to EC 2435. In at least one embodiment, a speaker 2463, a headphones 2464, and a microphone ("mic") 2465 may be communicatively coupled to an audio unit ("audio codec and class d amp") 2464, which may in turn be communicatively coupled to DSP 2460. In at least one embodiment, audio unit 2464 may include, for example and without limitation, an audio coder/decoder ("codec") and a class D amplifier. In at least one embodiment, a SIM card ("SIM") 2457 may be communicatively coupled to WWAN unit 2456. In at least one embodiment, components such as WLAN unit 2450 and Bluetooth unit 2452, as well as WWAN unit 2456 may be implemented in a Next Generation Form Factor ("NGFF").

Figure 25:
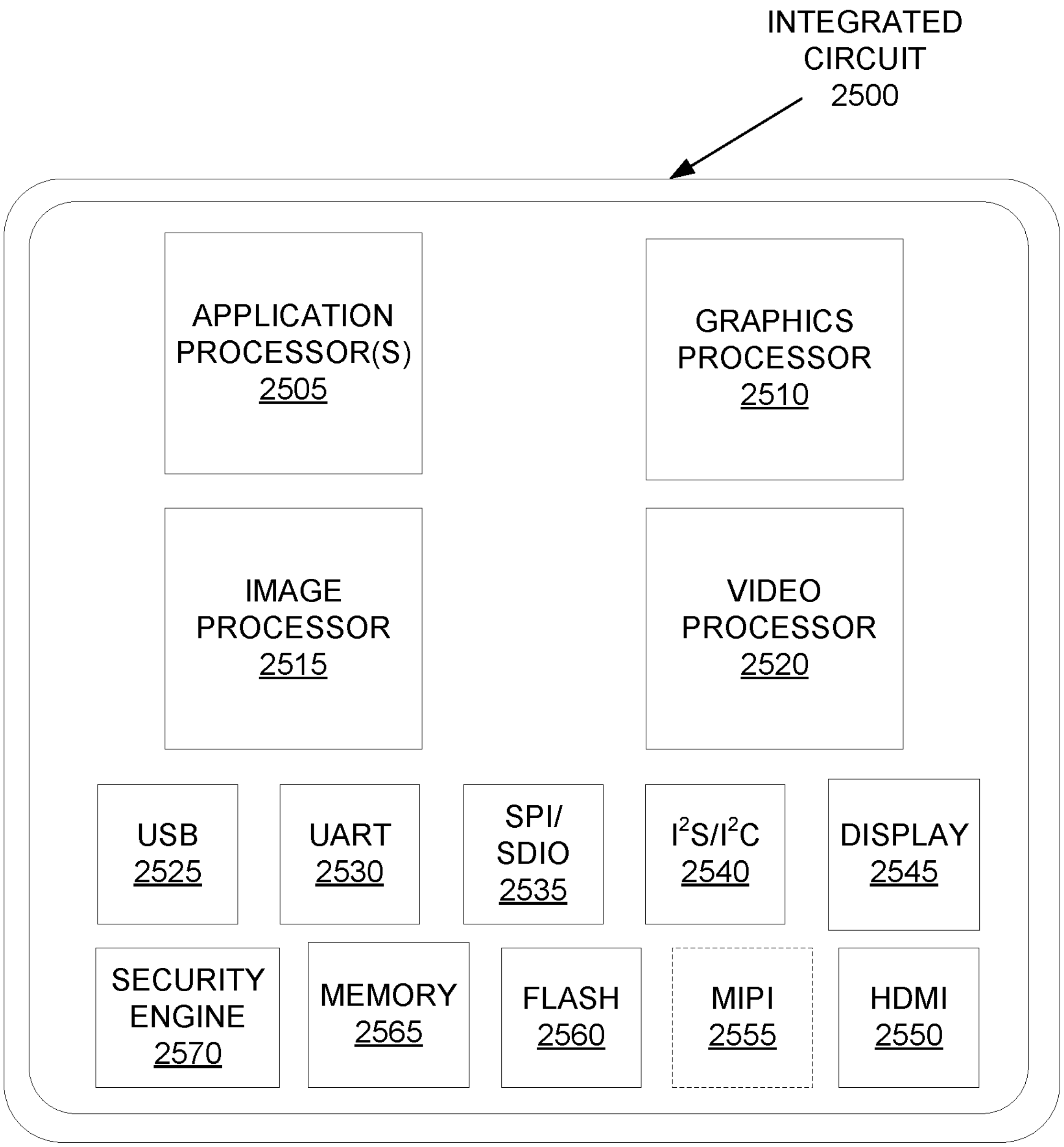
FIG. 25 illustrates an exemplary integrated circuit, in accordance with at least one embodiment.

FIG. 25 illustrates an exemplary integrated circuit 2500, in accordance with at least one embodiment. In at least one embodiment, exemplary integrated circuit 2500 is an SoC that may be fabricated using one or more IP cores. In at least one embodiment, integrated circuit 2500 includes one or more application processor(s) 2505 (e.g., CPUs), at least one graphics processor 2510, and may additionally include an image processor 2515 and/or a video processor 2520, any of which may be a modular IP core. In at least one embodiment, integrated circuit 2500 includes peripheral or bus logic including a USB controller 2525, a UART controller 2530, an SPI/SDIO controller 2535, and an $I^2S/I^2C$ controller 2540. In at least one embodiment, integrated circuit 2500 can include a display device 2545 coupled to one or more of a high-definition multimedia interface ("HDMI") controller 2550 and a mobile industry processor interface ("MIPI") display interface 2555. In at least one embodiment, storage may be provided by a flash memory subsystem 2560 including flash memory and a flash memory controller. In at least one embodiment, a memory interface may be provided via a memory controller 2565 for access to SDRAM or SRAM memory devices. In at least one embodiment, some integrated circuits additionally include an embedded security engine 2570.

Figure 26:
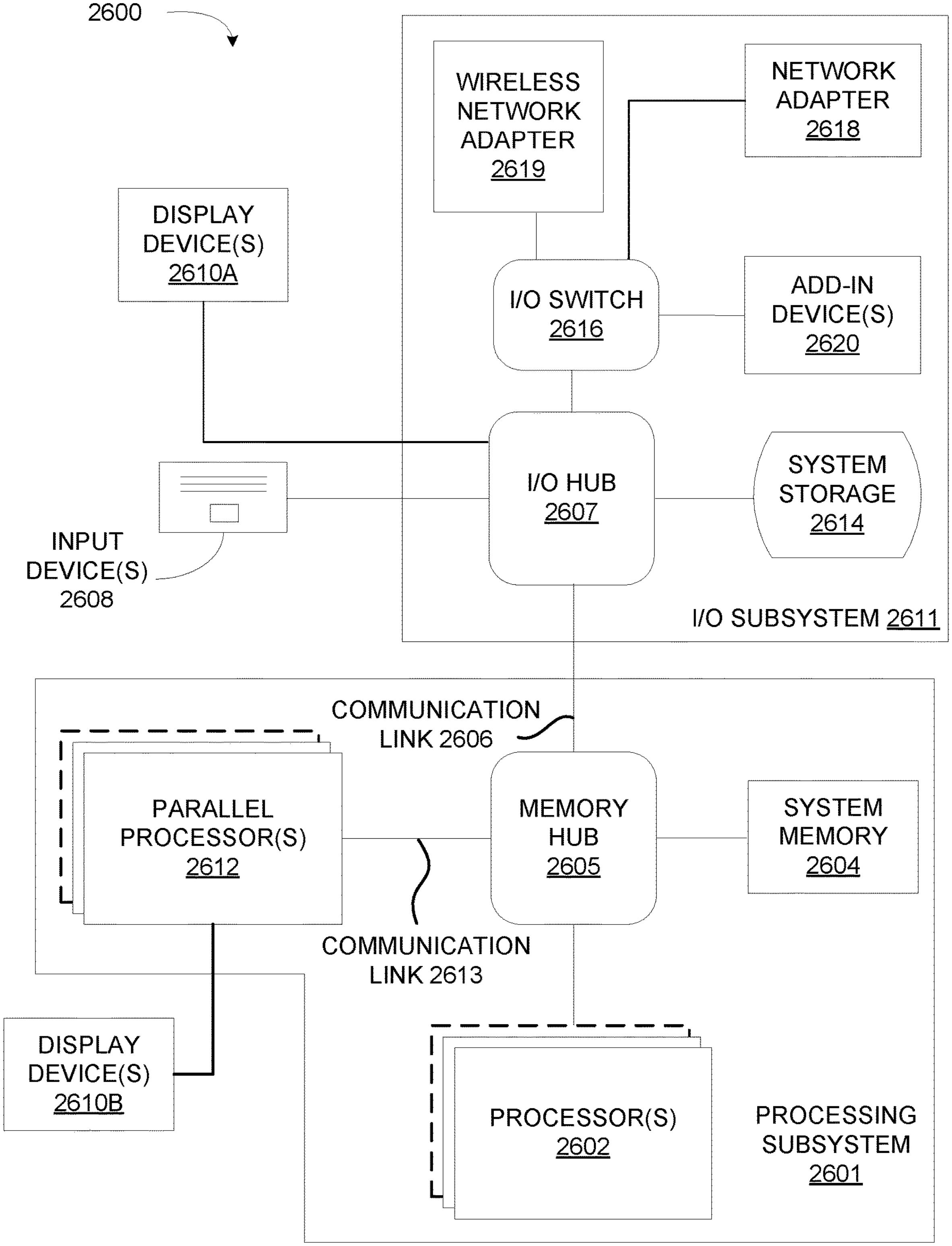
FIG. 26 illustrates a computing system, according to at least one embodiment.

FIG. 26 illustrates a computing system 2600, according to at least one embodiment; In at least one embodiment, computing system 2600 includes a processing subsystem 2601 having one or more processor(s) 2602 and a system memory 2604 communicating via an interconnection path that may include a memory hub 2605. In at least one embodiment, memory hub 2605 may be a separate component within a chipset component or may be integrated within one or more processor(s) 2602. In at least one embodiment, memory hub 2605 couples with an I/O subsystem 2611 via a communication link 2606. In at least one embodiment, I/O subsystem 2611 includes an I/O hub 2607 that can enable computing system 2600 to receive input from one or more input device(s) 2608. In at least one embodiment, I/O hub 2607 can enable a display controller, which may be included in one or more processor(s) 2602, to provide outputs to one or more display device(s) 2610A. In at least one embodiment, one or more display device(s) 2610A coupled with I/O hub 2607 can include a local, internal, or embedded display device.

In at least one embodiment, processing subsystem 2601 includes one or more parallel processor(s) 2612 coupled to memory hub 2605 via a bus or other communication link 2613. In at least one embodiment, communication link 2613 may be one of any number of standards based communication link technologies or protocols, such as, but not limited to PCIe, or may be a vendor specific communications interface or communications fabric. In at least one embodiment, one or more parallel processor(s) 2612 form a computationally focused parallel or vector processing system that can include a large number of processing cores and/or processing clusters, such as a many integrated core processor. In at least one embodiment, one or more parallel processor(s) 2612 form a graphics processing subsystem that can output pixels to one of one or more display device(s) 2610A coupled via I/O Hub 2607. In at least one embodiment, one or more parallel processor(s) 2612 can also include a display controller and display interface (not shown) to enable a direct connection to one or more display device(s) 2610B.

In at least one embodiment, a system storage unit 2614 can connect to I/O hub 2607 to provide a storage mechanism for computing system 2600. In at least one embodiment, an I/O switch 2616 can be used to provide an interface mechanism to enable connections between I/O hub 2607 and other components, such as a network adapter 2618 and/or wireless network adapter 2619 that may be integrated into a platform, and various other devices that can be added via one or more add-in device(s) 2620. In at least one embodiment, network adapter 2618 can be an Ethernet adapter or another wired network adapter. In at least one embodiment, wireless network adapter 2619 can include one or more of a Wi-Fi, Bluetooth, NFC, or other network device that includes one or more wireless radios.

In at least one embodiment, computing system 2600 can include other components not explicitly shown, including USB or other port connections, optical storage drives, video capture devices, and/or variations thereof, that may also be connected to I/O hub 2607. In at least one embodiment, communication paths interconnecting various components in FIG. 26 may be implemented using any suitable protocols, such as PCI based protocols (e.g., PCIe), or other bus or point-to-point communication interfaces and/or protocol(s), such as NVLink high-speed interconnect, or interconnect protocols.

In at least one embodiment, one or more parallel processor(s) 2612 incorporate circuitry optimized for graphics and video processing, including, for example, video output circuitry, and constitutes a graphics processing unit ("GPU"). In at least one embodiment, one or more parallel processor(s) 2612 incorporate circuitry optimized for general purpose processing. In at least embodiment, components of computing system 2600 may be integrated with one or more other system elements on a single integrated circuit. For example, in at least one embodiment, one or more parallel processor(s) 2612, memory hub 2605, processor(s) 2602, and I/O hub 2607 can be integrated into a SoC integrated circuit. In at least one embodiment, components of computing system 2600 can be integrated into a single package to form a system in package ("SIP") configuration. In at least one embodiment, at least a portion of components of computing system 2600 can be integrated into a multi-chip module ("MCM"), which can be interconnected with other multi-chip modules into a modular computing system. In at least one embodiment, I/O subsystem 2611 and display devices 2610B are omitted from computing system 2600.

Processing Systems

The following figures set forth, without limitation, exemplary processing systems that can be used to implement at least one embodiment.

Figure 27:
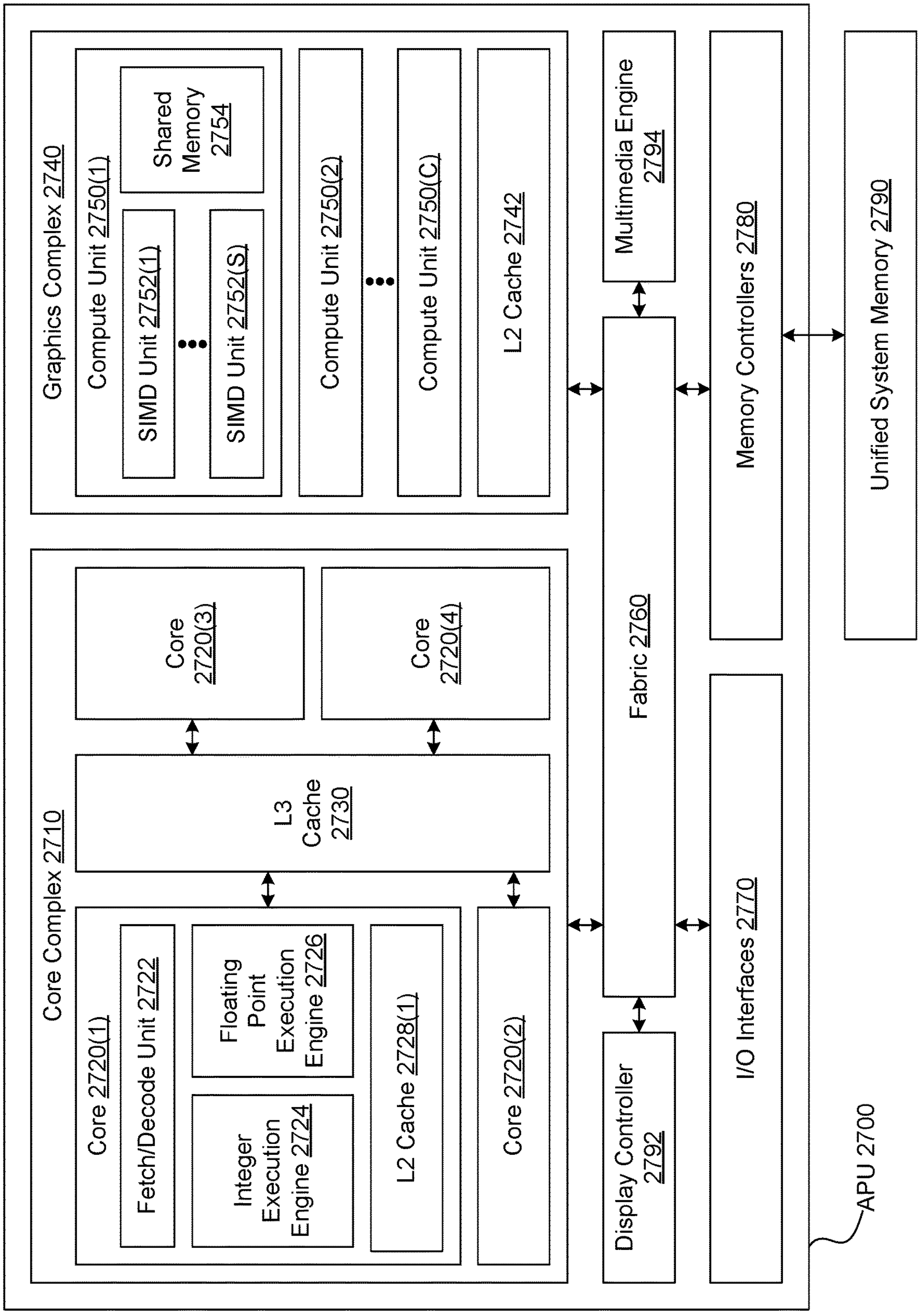
FIG. 27 illustrates an APU, in accordance with at least one embodiment.

FIG. 27 illustrates an accelerated processing unit ("APU") 2700, in accordance with at least one embodiment. In at least one embodiment, APU 2700 is developed by AMD Corporation of Santa Clara, CA. In at least one embodiment, APU 2700 can be configured to execute an application program, such as a CUDA program. In at least one embodiment, APU 2700 includes, without limitation, a core complex 2710, a graphics complex 2740, fabric 2760, I/O interfaces 2770, memory controllers 2780, a display controller 2792, and a multimedia engine 2794. In at least one embodiment, APU 2700 may include, without limitation, any number of core complexes 2710, any number of graphics complexes 2750, any number of display controllers 2792, and any number of multimedia engines 2794 in any combination. For explanatory purposes, multiple instances of like objects are denoted herein with reference numbers identifying an object and parenthetical numbers identifying an instance where needed.

In at least one embodiment, core complex 2710 is a CPU, graphics complex 2740 is a GPU, and APU 2700 is a processing unit that integrates, without limitation, 2710 and 2740 onto a single chip. In at least one embodiment, some tasks may be assigned to core complex 2710 and other tasks may be assigned to graphics complex 2740. In at least one embodiment, core complex 2710 is configured to execute main control software associated with APU 2700, such as an operating system. In at least one embodiment, core complex 2710 is a master processor of APU 2700, controlling and coordinating operations of other processors. In at least one embodiment, core complex 2710 issues commands that control an operation of graphics complex 2740. In at least one embodiment, core complex 2710 can be configured to execute host executable code derived from CUDA source code, and graphics complex 2740 can be configured to execute device executable code derived from CUDA source code.

In at least one embodiment, core complex 2710 includes, without limitation, cores 2720(1)-2720(4) and an L3 cache 2730. In at least one embodiment, core complex 2710 may include, without limitation, any number of cores 2720 and any number and type of caches in any combination. In at least one embodiment, cores 2720 are configured to execute instructions of a particular instruction set architecture ("ISA"). In at least one embodiment, each core 2720 is a CPU core.

In at least one embodiment, each core 2720 includes, without limitation, a fetch/decode unit 2722, an integer execution engine 2724, a floating point execution engine 2726, and an L2 cache 2728. In at least one embodiment, fetch/decode unit 2722 fetches instructions, decodes such instructions, generates micro-operations, and dispatches separate micro-instructions to integer execution engine 2724 and floating point execution engine 2726. In at least one embodiment, fetch/decode unit 2722 can concurrently dispatch one micro-instruction to integer execution engine 2724 and another micro-instruction to floating point execution engine 2726. In at least one embodiment, integer execution engine 2724 executes, without limitation, integer and memory operations. In at least one embodiment, floating point engine 2726 executes, without limitation, floating point and vector operations. In at least one embodiment, fetch-decode unit 2722 dispatches micro-instructions to a single execution engine that replaces both integer execution engine 2724 and floating point execution engine 2726.

In at least one embodiment, each core 2720(*i*), where i is an integer representing a particular instance of core 2720, may access L2 cache 2728(*i*) included in core 2720(*i*). In at least one embodiment, each core 2720 included in core complex 2710(*j*), where j is an integer representing a particular instance of core complex 2710, is connected to other cores 2720 included in core complex 2710(*j*) via L3 cache 2730(*j*) included in core complex 2710(*j*). In at least one embodiment, cores 2720 included in core complex 2710(*j*), where j is an integer representing a particular instance of core complex 2710, can access all of L3 cache 2730(*j*) included in core complex 2710(*j*). In at least one embodiment, L3 cache 2730 may include, without limitation, any number of slices.

In at least one embodiment, graphics complex 2740 can be configured to perform compute operations in a highly-parallel fashion. In at least one embodiment, graphics complex 2740 is configured to execute graphics pipeline operations such as draw commands, pixel operations, geometric computations, and other operations associated with rendering an image to a display. In at least one embodiment, graphics complex 2740 is configured to execute operations unrelated to graphics. In at least one embodiment, graphics complex 2740 is configured to execute both operations related to graphics and operations unrelated to graphics.

In at least one embodiment, graphics complex 2740 includes, without limitation, any number of compute units 2750 and an L2 cache 2742. In at least one embodiment, compute units 2750 share L2 cache 2742. In at least one embodiment, L2 cache 2742 is partitioned. In at least one embodiment, graphics complex 2740 includes, without limitation, any number of compute units 2750 and any number (including zero) and type of caches. In at least one embodiment, graphics complex 2740 includes, without limitation, any amount of dedicated graphics hardware.

In at least one embodiment, each compute unit 2750 includes, without limitation, any number of SIMD units 2752 and a shared memory 2754. In at least one embodiment, each SIMD unit 2752 implements a SIMD architecture and is configured to perform operations in parallel. In at least one embodiment, each compute unit 2750 may execute any number of thread blocks, but each thread block executes on a single compute unit 2750. In at least one embodiment, a thread block includes, without limitation, any number of threads of execution. In at least one embodiment, a workgroup is a thread block. In at least one embodiment, each SIMD unit 2752 executes a different warp. In at least one embodiment, a warp is a group of threads (e.g., 16 threads), where each thread in a warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 2754.

In at least one embodiment, fabric 2760 is a system interconnect that facilitates data and control transmissions across core complex 2710, graphics complex 2740, I/O interfaces 2770, memory controllers 2780, display controller 2792, and multimedia engine 2794. In at least one embodiment, APU 2700 may include, without limitation, any amount and type of system interconnect in addition to or instead of fabric 2760 that facilitates data and control transmissions across any number and type of directly or indirectly linked components that may be internal or external to APU 2700. In at least one embodiment, I/O interfaces 2770 are representative of any number and type of I/O interfaces (e.g., PCI, PCI-Extended ("PCI-X"), PCIe, gigabit Ethernet ("GBE"), USB, etc.). In at least one embodiment, various types of peripheral devices are coupled to I/O interfaces 2770 In at least one embodiment, peripheral devices that are coupled to I/O interfaces 2770 may include, without limitation, keyboards, mice, printers, scanners, joysticks or other types of game controllers, media recording devices, external storage devices, network interface cards, and so forth.

In at least one embodiment, display controller AMD92 displays images on one or more display device(s), such as a liquid crystal display ("LCD") device. In at least one embodiment, multimedia engine 240 includes, without limitation, any amount and type of circuitry that is related to multimedia, such as a video decoder, a video encoder, an image signal processor, etc. In at least one embodiment, memory controllers 2780 facilitate data transfers between APU 2700 and a unified system memory 2790. In at least one embodiment, core complex 2710 and graphics complex 2740 share unified system memory 2790.

In at least one embodiment, APU 2700 implements a memory subsystem that includes, without limitation, any amount and type of memory controllers 2780 and memory devices (e.g., shared memory 2754) that may be dedicated to one component or shared among multiple components. In at least one embodiment, APU 2700 implements a cache subsystem that includes, without limitation, one or more cache memories (e.g., L2 caches 2728, L3 cache 2730, and L2 cache 2742) that may each be private to or shared between any number of components (e.g., cores 2720, core complex 2710, SIMD units 2752, compute units 2750, and graphics complex 2740).

Figure 28:
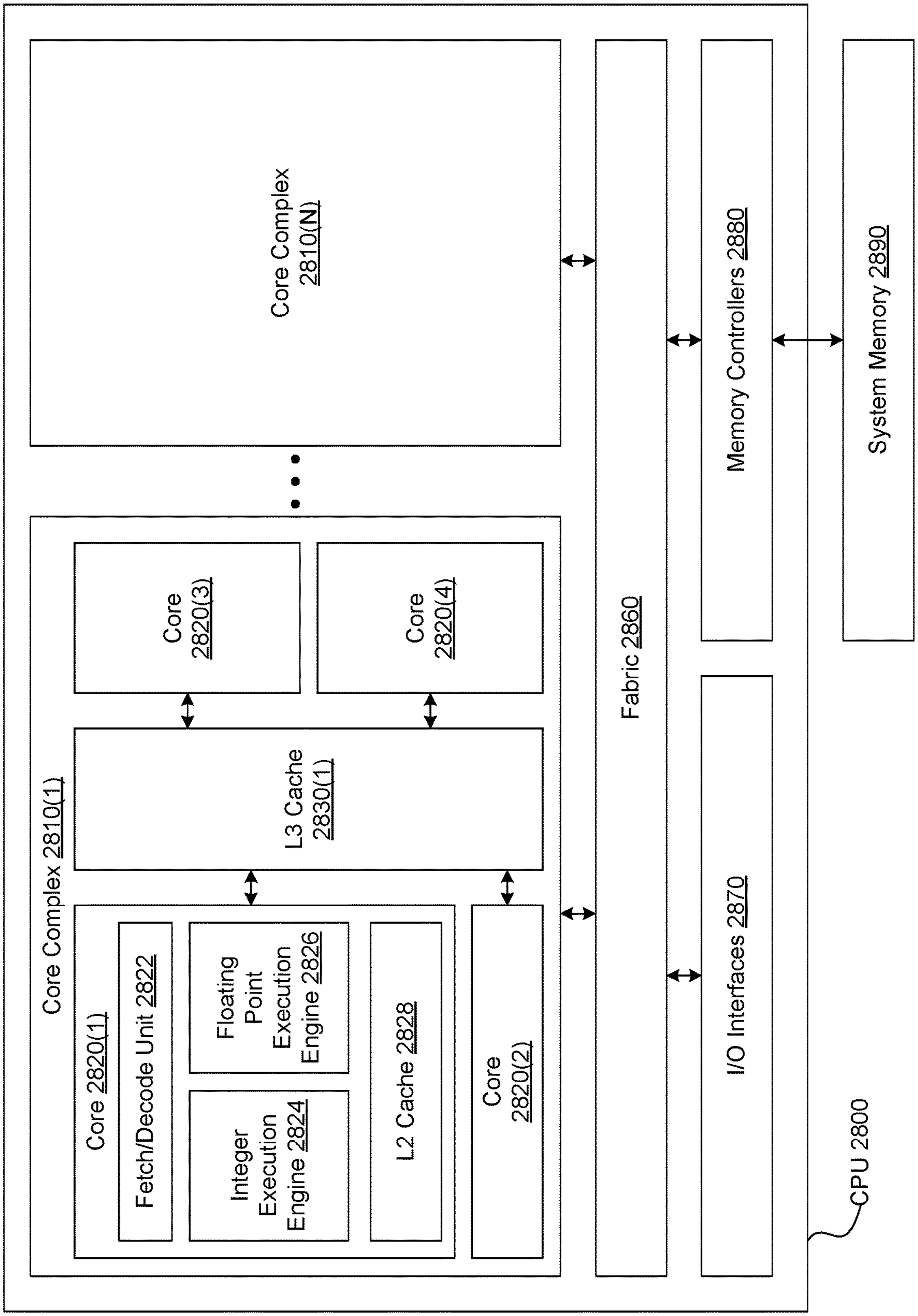
FIG. 28 illustrates a CPU, in accordance with at least one embodiment.

FIG. 28 illustrates a CPU 2800, in accordance with at least one embodiment. In at least one embodiment, CPU 2800 is developed by AMD Corporation of Santa Clara, CA. In at least one embodiment, CPU 2800 can be configured to execute an application program. In at least one embodiment, CPU 2800 is configured to execute main control software, such as an operating system. In at least one embodiment, CPU 2800 issues commands that control an operation of an external GPU (not shown). In at least one embodiment, CPU 2800 can be configured to execute host executable code derived from CUDA source code, and an external GPU can be configured to execute device executable code derived from such CUDA source code. In at least one embodiment, CPU 2800 includes, without limitation, any number of core complexes 2810, fabric 2860, I/O interfaces 2870, and memory controllers 2880.

In at least one embodiment, core complex 2810 includes, without limitation, cores 2820(1)-2820(4) and an L3 cache 2830. In at least one embodiment, core complex 2810 may include, without limitation, any number of cores 2820 and any number and type of caches in any combination. In at least one embodiment, cores 2820 are configured to execute instructions of a particular ISA. In at least one embodiment, each core 2820 is a CPU core.

In at least one embodiment, each core 2820 includes, without limitation, a fetch/decode unit 2822, an integer execution engine 2824, a floating point execution engine 2826, and an L2 cache 2828. In at least one embodiment, fetch/decode unit 2822 fetches instructions, decodes such instructions, generates micro-operations, and dispatches separate micro-instructions to integer execution engine 2824 and floating point execution engine 2826. In at least one embodiment, fetch/decode unit 2822 can concurrently dispatch one micro-instruction to integer execution engine 2824 and another micro-instruction to floating point execution engine 2826. In at least one embodiment, integer execution engine 2824 executes, without limitation, integer and memory operations. In at least one embodiment, floating point engine 2826 executes, without limitation, floating point and vector operations. In at least one embodiment, fetch-decode unit 2822 dispatches micro-instructions to a single execution engine that replaces both integer execution engine 2824 and floating point execution engine 2826.

In at least one embodiment, each core 2820(*i*), where i is an integer representing a particular instance of core 2820, may access L2 cache 2828(*i*) included in core 2820(*i*). In at least one embodiment, each core 2820 included in core complex 2810(*j*), where j is an integer representing a particular instance of core complex 2810, is connected to other cores 2820 in core complex 2810(*j*) via L3 cache 2830(*j*) included in core complex 2810(*j*). In at least one embodiment, cores 2820 included in core complex 2810(*j*), where j is an integer representing a particular instance of core complex 2810, can access all of L3 cache 2830(*j*) included in core complex 2810(*j*). In at least one embodiment, L3 cache 2830 may include, without limitation, any number of slices.

In at least one embodiment, fabric 2860 is a system interconnect that facilitates data and control transmissions across core complexes 2810(1)-2810(N) (where N is an integer greater than zero), I/O interfaces 2870, and memory controllers 2880. In at least one embodiment, CPU 2800 may include, without limitation, any amount and type of system interconnect in addition to or instead of fabric 2860 that facilitates data and control transmissions across any number and type of directly or indirectly linked components that may be internal or external to CPU 2800. In at least one embodiment, I/O interfaces 2870 are representative of any number and type of I/O interfaces (e.g., PCI, PCI-X, PCIe, GBE, USB, etc.). In at least one embodiment, various types of peripheral devices are coupled to I/O interfaces 2870 In at least one embodiment, peripheral devices that are coupled to I/O interfaces 2870 may include, without limitation, displays, keyboards, mice, printers, scanners, joysticks or other types of game controllers, media recording devices, external storage devices, network interface cards, and so forth.

In at least one embodiment, memory controllers 2880 facilitate data transfers between CPU 2800 and a system memory 2890. In at least one embodiment, core complex 2810 and graphics complex 2840 share system memory 2890. In at least one embodiment, CPU 2800 implements a memory subsystem that includes, without limitation, any amount and type of memory controllers 2880 and memory devices that may be dedicated to one component or shared among multiple components. In at least one embodiment, CPU 2800 implements a cache subsystem that includes, without limitation, one or more cache memories (e.g., L2 caches 2828 and L3 caches 2830) that may each be private to or shared between any number of components (e.g., cores 2820 and core complexes 2810).

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, a number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium. In at least one embodiment, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors in at least one embodiment, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, in at least one embodiment, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:

a first cooling loop to cool one or more first components of a server of a datacenter containing a plurality of servers, wherein the one or more first components have a first power density, wherein the first cooling loop comprises a first heat exchanger disposed outside of the datacenter and at least two manifolds to distribute a coolant to a subset of the plurality of servers supported in a datacenter rack, wherein the at least two manifolds are disposed on a same side of the datacenter rack; and a second cooling loop to cool one or more second components of the server, wherein the one or more second components have a second power density that is lower than the first power density, wherein the first cooling loop flows first coolant from a first manifold of the at least two manifolds and into the server in a first direction at a first side wall of the server at a first horizontal plane and out of the server in the first direction at a second side wall of the server opposite the first side wall at the first horizontal plane to a second manifold of the at least two manifolds, and wherein the second cooling loop flows second coolant into the server in the first direction at the first side wall at a second horizontal plane different from the first horizontal plane and out of the server in the first direction at the second side wall at the second horizontal plane, wherein the one or more first components are cooled by a series of cold plates associated with the first cooling loop.

2. The system of claim 1, wherein the first heat exchanger comprises a cooler to exchange heat from the first cooling loop with an ambient environment.

3. The system of claim 1, wherein the first manifold is disposed between the second manifold and the datacenter rack.

4. The system of claim 3, wherein the first cooling loop further comprises a pump to flow the coolant from the server to the first heat exchanger along a first flow path.

5. The system of claim 3, wherein the coolant is a liquid coolant other than water.

6. The system of claim 1, further comprising:

one or more cold plates attached to the one or more first components, wherein the first cooling loop comprises the one or more cold plates, and wherein the one or more cold plates are to receive the coolant to cool the one or more first components.

7. The system of claim 1, wherein the second cooling loop is to exchange heat with an ambient environment via the first heat exchanger or a second heat exchanger.

8. The system of claim 7, wherein the one or more second components are to be cooled by immersion cooling within a chassis of the server.

9. The system of claim 1, wherein the first heat exchanger exchanges the heat with one or more of an air environment or a liquid environment.

10. The system of claim 1, wherein the plurality of servers are supported by one or more datacenter racks.

11. A datacenter comprising:

a room containing one or more servers supported in a datacenter rack; and a cooling system to cool the one or more servers, the cooling system comprising:

one or more first cooling loops to cool one or more first components of the one or more servers, wherein the one or more first components have a first power density, at least one first cooling loop of the one or more first cooling loops including a first heat exchanger disposed outside the datacenter and at least two manifolds to distribute a coolant to at least one of the one or more servers, wherein the at least two manifolds are disposed on a same side of the datacenter rack; and a second cooling loop to cool one or more second components of the one or more servers, wherein the one or more second components have a second power density that is lower than the first power density, wherein the at least one first cooling loop flows first coolant from a first manifold of the at least two manifolds and into a first server of the one or more servers in a first direction at a first side wall of the first server at a first horizontal plane and out of the first server in the first direction at a second side wall of the first server opposite the first side wall at the first horizontal plane to a second manifold of the at least two manifolds, and wherein the second cooling loop flows second coolant into the first server in the first direction at the first side wall at a second horizontal plane different from the first horizontal plane and out of the first server in the first direction at the second side wall at the second horizontal plane, wherein the one or more first components are cooled by a series of cold plates associated with the at least one first cooling loop.

12. The datacenter of claim 11, wherein the first heat exchanger comprises a dry cooler to exchange heat from the one or more first cooling loops with an ambient environment.

13. The datacenter of claim 11, wherein the first manifold is disposed between the second manifold and the datacenter rack.

14. The datacenter of claim 11, wherein the second cooling loop is to exchange heat with an ambient environment via the first heat exchanger or a second heat exchanger.

15. The datacenter of claim 14, further comprising:

one or more cold plates attached to the one or more first components, wherein the one or more first cooling loops comprise the one or more cold plates, and wherein the one or more cold plates are to receive the coolant to cool the one or more first components.

16. The datacenter of claim 14, wherein the one or more second components are to be cooled by immersion cooling within one or more chassis of the one or more servers.

17. A method comprising:

cooling, via a first cooling loop, one or more first components of a server of a datacenter, wherein the datacenter comprises at least one room containing a plurality of servers supported in a datacenter rack, wherein the one or more first components have a first power density, and wherein the one or more first components are cooled by a series of cold plates associated with the first cooling loop;

cooling, via a second cooling loop, one or more second components of the server, wherein the one or more second components have a second power density that is lower than the first power density;

distributing, via at least two manifolds of the first cooling loop, first coolant to the server, wherein the at least two manifolds are disposed on a same side of the datacenter rack, wherein the first cooling loop flows first coolant from a first manifold of the at least two manifolds and into the server in a first direction at a first side wall of the server at a first horizontal plane and out of the server in the first direction at a second side wall of the server opposite the first side wall at the first horizontal plane to a second manifold of the at least two manifolds, and wherein the second cooling loop flows second coolant into the server in the first direction at the first side wall at a second horizontal plane different from the first horizontal plane and out of the server in the first direction at the second side wall at the second horizontal plane; and exchanging, via a first heat exchanger of the first cooling loop and disposed outside the datacenter, heat from the first cooling loop with an ambient environment.

18. The method of claim 17, wherein the first coolant is a liquid coolant other than water.

19. The method of claim 17, further comprising:

flowing, via a pump, the coolant from the server to the first heat exchanger along a first flow path.

20. The method of claim 17, further comprising:

exchanging, via a second heat exchanger of the second cooling loop, heat from the second cooling loop with the ambient environment.

* * * * *